(12) United States Patent
Kimura

(10) Patent No.: US 8,994,029 B2
(45) Date of Patent: Mar. 31, 2015

(54) SEMICONDUCTOR DEVICE AND DRIVING METHOD THEREOF

(71) Applicant: Semiconductor Energy Laboratory Co., Ltd., Atsugi (JP)

(72) Inventor: Hajime Kimura, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/184,757

(22) Filed: Feb. 20, 2014

(65) Prior Publication Data
US 2014/0167056 A1 Jun. 19, 2014

Related U.S. Application Data

(63) Continuation of application No. 13/767,038, filed on Feb. 14, 2013, now Pat. No. 8,659,027, which is a continuation of application No. 13/267,261, filed on Oct. 6, 2011, now Pat. No. 8,378,356, which is a
(Continued)

(30) Foreign Application Priority Data

Oct. 24, 2001 (JP) .................. 2001-326397

(51) Int. Cl.
*H01L 27/14* (2006.01)
*H01L 27/12* (2006.01)
(Continued)

(52) U.S. Cl.
CPC .... *H01L 27/1255* (2013.01); *G09G 2300/0842* (2013.01); *G09G 2300/0819* (2013.01);
(Continued)

(58) Field of Classification Search
USPC .............. 257/72, 59, E27.121; 313/500; 438/149; 345/36, 39
See application file for complete search history.

(56) References Cited

U.S. PATENT DOCUMENTS 3,564,135 A 2/1971 Weimer
5,095,248 A 3/1992 Sato
(Continued)

FOREIGN PATENT DOCUMENTS

EP 1 003 150 A1 5/2000
EP 1006587 A 6/2000
(Continued)

OTHER PUBLICATIONS

Baldo et al.; "Highly Efficient Phosphorescent Emission From Organic Electroluminescent Devices"; Nature, vol. 395; pp. 151-154; Sep. 10, 1998.
(Continued)

*Primary Examiner* — Jami M Valentine
(74) *Attorney, Agent, or Firm* — Fish & Richardson P.C.

(57) ABSTRACT

A voltage equal to the threshold value of a TFT (106) is held in capacitor unit (109). When a video signal is inputted from a source signal line, the voltage held in the capacitor unit is added thereto and a resultant signal is applied to a gate electrode of the TFT (106). Even when a threshold value is varied for each pixel, each threshold value is held in the capacitor unit (109) for each pixel. Thus, the influence of a variation in threshold value can be eliminated. Further, holding of the threshold value is conducted by only the capacitor unit (109) and a charge does not move at writing of a video signal so that a voltage between both electrodes is not changed. Thus, it is not influenced by a variation in capacitance value.

22 Claims, 30 Drawing Sheets

Related U.S. Application Data continuation of application No. 12/110,379, filed on Apr. 28, 2008, now Pat. No. 8,035,109, which is a continuation of application No. 10/279,000, filed on Oct. 24, 2002, now Pat. No. 7,365,713.

(51) Int. Cl.
  *G09G 3/32* (2006.01)
  *H01L 27/32* (2006.01)
  *H01L 51/52* (2006.01)

(52) U.S. Cl.
  CPC ........ G09G3/3233 (2013.01); *G09G 2320/043* (2013.01); *G09G 2300/0814* (2013.01); *G09G 2310/027* (2013.01); *H01L 27/3244* (2013.01); *G09G 3/3275* (2013.01); H01L 27/124 (2013.01); *G09G 2310/0251* (2013.01); *G09G 2300/0852* (2013.01); *G09G 3/3266* (2013.01); *H01L 51/5237* (2013.01); *H01L 27/3295* (2013.01); *G09G 2300/0861* (2013.01)
  USPC ........ 257/72; 257/59; 257/E27.121; 313/500; 438/149; 365/36; 365/39

(56) References Cited

U.S. PATENT DOCUMENTS

| | | | |
|---|---|---|---|
| 5,359,341 A | 10/1994 | Hutchings | |
| 5,581,160 A | 12/1996 | Fujita | |
| 5,673,058 A | 9/1997 | Uragami | |
| 5,689,205 A | 11/1997 | Hughes | |
| 5,783,952 A | 7/1998 | Kazazian | |
| 6,037,719 A | 3/2000 | Yap | |
| 6,091,203 A | 7/2000 | Kawashima | |
| 6,229,506 B1 * | 5/2001 | Dawson et al. | 345/82 |
| 6,229,508 B1 | 5/2001 | Kane | |
| 6,246,179 B1 | 6/2001 | Yamada | |
| 6,246,180 B1 | 6/2001 | Nishigaki | |
| 6,278,131 B1 | 8/2001 | Yamazaki | |
| 6,348,906 B1 | 2/2002 | Dawson | |
| 6,362,798 B1 | 3/2002 | Kimura | |
| 6,380,687 B1 | 4/2002 | Yamazaki | |
| 6,429,584 B2 | 8/2002 | Kubota | |
| 6,445,005 B1 | 9/2002 | Yamazaki et al. | |
| 6,445,371 B1 | 9/2002 | Miyazawa | |
| 6,501,466 B1 | 12/2002 | Yamagishi | |
| 6,525,704 B1 | 2/2003 | Kondo | |
| 6,570,338 B2 | 5/2003 | Bae | |
| 6,580,094 B1 | 6/2003 | Yamazaki et al. | |
| 6,580,408 B1 | 6/2003 | Bae | |
| 6,753,854 B1 | 6/2004 | Koyama et al. | |
| 6,809,343 B2 | 10/2004 | Yamazaki et al. | |
| 6,809,706 B2 | 10/2004 | Shimoda | |
| 6,859,193 B1 | 2/2005 | Yumoto | |
| 6,876,345 B2 | 4/2005 | Akimoto et al. | |
| 6,894,312 B2 | 5/2005 | Yamazaki et al. | |
| 6,909,242 B2 | 6/2005 | Kimura | |
| 6,950,081 B2 | 9/2005 | Akimoto et al. | |
| 7,142,180 B2 | 11/2006 | Akimoto et al. | |
| 7,154,454 B2 | 12/2006 | Okabe | |
| 7,173,612 B2 | 2/2007 | Nanno et al. | |
| 7,193,591 B2 | 3/2007 | Yumoto | |
| 7,277,072 B2 | 10/2007 | Akimoto et al. | |
| 7,279,752 B2 | 10/2007 | Yamazaki et al. | |
| 7,365,713 B2 | 4/2008 | Kimura | |
| 7,436,376 B2 | 10/2008 | Akimoto et al. | |
| 7,468,715 B2 | 12/2008 | Akimoto et al. | |
| 7,518,146 B2 | 4/2009 | Yamazaki et al. | |
| 7,952,103 B2 | 5/2011 | Yamazaki et al. | |
| 8,017,945 B2 | 9/2011 | Yamazaki et al. | |
| 8,031,144 B2 | 10/2011 | Akimoto et al. | |
| 8,102,387 B2 | 1/2012 | Akimoto et al. | |
| 8,159,427 B2 | 4/2012 | Akimoto et al. | |
| 8,183,571 B2 | 5/2012 | Yamazaki et al. | |
| 8,450,745 B2 | 5/2013 | Yamazaki et al. | |
| 8,508,562 B2 | 8/2013 | Akimoto et al. | |
| 8,633,878 B2 | 1/2014 | Akimoto et al. | |
| 8,648,345 B2 | 2/2014 | Yamazaki et al. | |
| 8,730,281 B2 | 5/2014 | Akimoto et al. | |
| 8,735,900 B2 | 5/2014 | Yamazaki et al. | |
| 2001/0029070 A1 | 10/2001 | Yamazaki | |
| 2002/0005825 A1 | 1/2002 | Lee | |
| 2002/0070913 A1 | 6/2002 | Kimura | |
| 2003/0020413 A1 | 1/2003 | Oomura | |
| 2003/0069658 A1 | 4/2003 | Yamazaki | |
| 2003/0091871 A1 | 5/2003 | Yamazaki | |
| 2003/0103022 A1 * | 6/2003 | Noguchi et al. | 345/77 |
| 2003/0169218 A1 | 9/2003 | Quinn | |
| 2003/0174009 A1 | 9/2003 | Kimura | |
| 2004/0080474 A1 | 4/2004 | Kimura | |
| 2004/0207615 A1 | 10/2004 | Yumoto | |
| 2005/0190177 A1 | 9/2005 | Yumoto | |
| 2006/0164359 A1 * | 7/2006 | Kimura | 345/92 |
| 2008/0284312 A1 | 11/2008 | Kimura | |
| 2014/0139564 A1 | 5/2014 | Akimoto et al. | |

FOREIGN PATENT DOCUMENTS

| | | |
|---|---|---|
| EP | 1 020 920 A2 | 7/2000 |
| EP | 1 063 630 A2 | 12/2000 |
| EP | 1085576 A | 3/2001 |
| EP | 1 103 946 A2 | 5/2001 |
| EP | 1096571 A | 5/2001 |
| EP | 1 372 132 A1 | 12/2003 |
| EP | 2259322 A | 12/2010 |
| JP | 62-188280 A | 8/1987 |
| JP | 2000-086968 A | 3/2000 |
| JP | 2000-347159 A | 12/2000 |
| JP | 2000-347621 A | 12/2000 |
| JP | 2001-005426 A | 1/2001 |
| JP | 2001-013908 A | 1/2001 |
| JP | 2001-056667 A | 2/2001 |
| JP | 2001-068264 A | 3/2001 |
| JP | 2001-083924 A | 3/2001 |
| JP | 2001-175200 A | 6/2001 |
| JP | 2001-195016 A | 7/2001 |
| JP | 2001-217072 A | 8/2001 |
| JP | 2001-284041 A | 10/2001 |
| JP | 2001-324958 A | 11/2001 |
| JP | 2001-343933 A | 12/2001 |
| JP | 2002-514320 T | 5/2002 |
| JP | 2002-341829 A | 11/2002 |
| JP | 2002-351401 A | 12/2002 |
| JP | 2003-005709 A | 1/2003 |
| JP | 2003-029708 A | 1/2003 |
| JP | 2003-058106 A | 2/2003 |
| JP | 2003-099000 A | 4/2003 |
| JP | 2003-108067 A | 4/2003 |
| JP | 2003-114644 A | 4/2003 |
| JP | 2003-122301 A | 4/2003 |
| JP | 2003-122306 A | 4/2003 |
| JP | 2003-173165 A | 6/2003 |
| JP | 2003-202834 A | 7/2003 |
| JP | 2007-122072 A | 5/2007 |
| WO | WO 98/48403 A1 | 10/1998 |
| WO | WO 99/65011 A1 | 12/1999 |
| WO | WO 01/06484 A1 | 1/2001 |

OTHER PUBLICATIONS

Baldo et al.; "Very High-Efficiency Green Organic Light-Emitting Devices Based on Electrophosphorescence"; Applied Physics Letters, vol. 75, No. 1; pp. 4-6; Jul. 5, 1999.

Dawson et al.; "Design of an Improved Pixel for a Polysilicon Active-Matrix Organic LED Display"; SID 98 Digest; vol. 29, pp. 11-14; 1998.

Dawson, R et al., "31.3:A Poly-Si Active-Matrix Oled Display With Integrated Drivers," SID Digest '99 : SID International Symposium Digest of Technical Papers, 1999, vol. 30, pp. 438-441.

Dawson, R et al., "The Impact of the Transient Response of Organic Light Emitting Diodes on the Design of Active Matrix Oled Displays," IEDM 98: Technical Digest of International Electron Devices Meeting, 1998, pp. 875-878.

(56) References Cited

OTHER PUBLICATIONS

Joon-Chul Goh et al.; "A New Poly-Si TFT Pixel Circuit Scheme for an Active-Matrix Organic Light Emitting Diode Displays"; Asia Display / IDW '01; pp. 319-322; 2001.

Y. Kida et al.; "LN-4: A 3.8 inch Half-VGA Transflective Color TFT-LCD with Completely Integrated 6-bit RGB Parallel Interface Drivers"; Eurodisplay 2002; pp. 831-834; 2002.

Pribat, et al., "Matrix Addressing for Organic Electroluminescent Displays," Thin Solid Films, vol. 383, No. 1-2, pp. 25-30, Jan. 1, 2001.

H. Sekine et al.; "Amplifier Compensation Method for a Poly-Si TFT LCLV with an Integrated Data-Driver"; Conference Record of the 1997 IDRC (International Display Research Conference); pp. 45-48; 1997.

Tsutsui et al.; "Electroluminescence in Organic Thin Films"; Photochemical Processes in Organized Molecular Systems; pp. 437-450; 1991.

Tsutsui et al.; High Quantum Efficiency in Organic Light-Emitting Devices with Iridium-Complex as a Triplet Emissive Center; Japanese Journal of Applied Physics; vol. 38, Part 2, No. 12B; pp. L1502-L1504; Dec. 15, 1999.

Yumoto, A. et al., "Pixel-Driving Methods for Large-Sized Poly-Si AM-OLED Displays", ASIA Display / IDW '01, Oct. 16, 2001, pp. 1395-1398.

\* cited by examiner

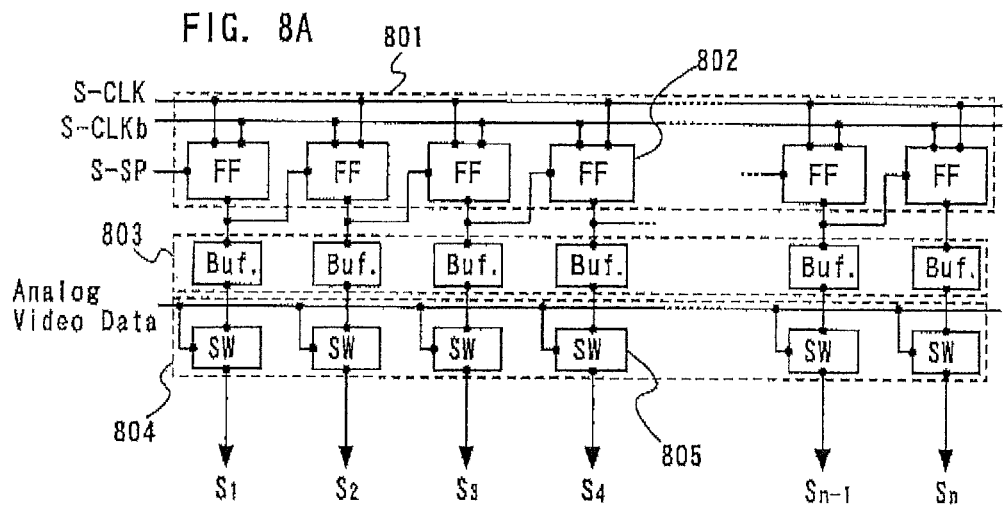
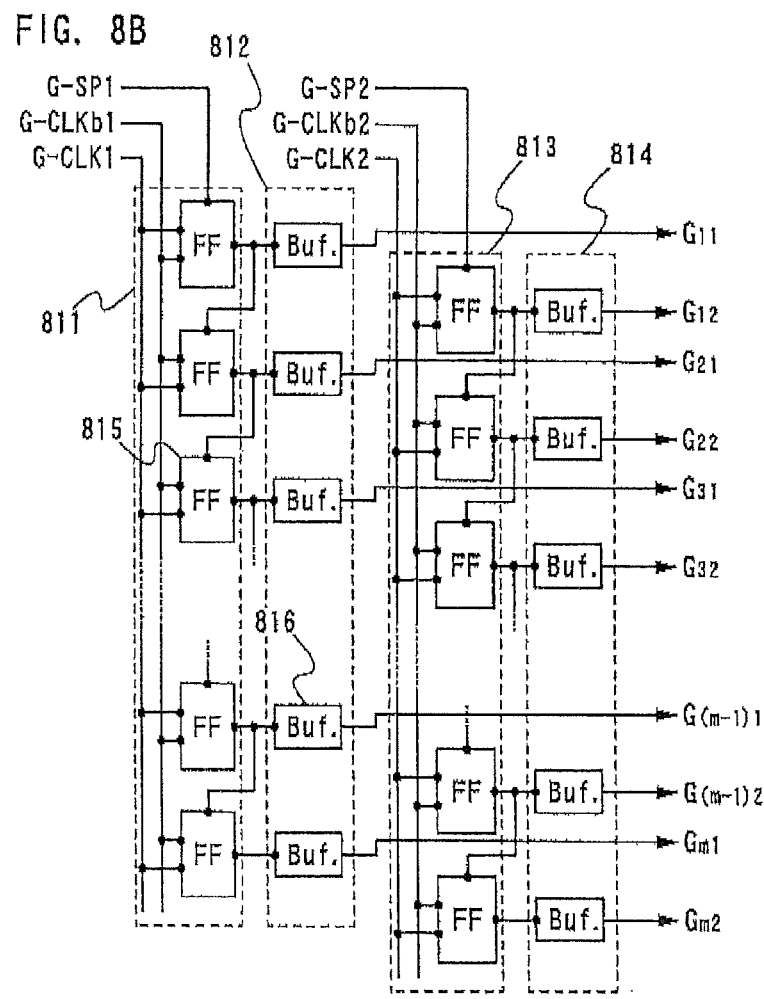

FIG. 23A
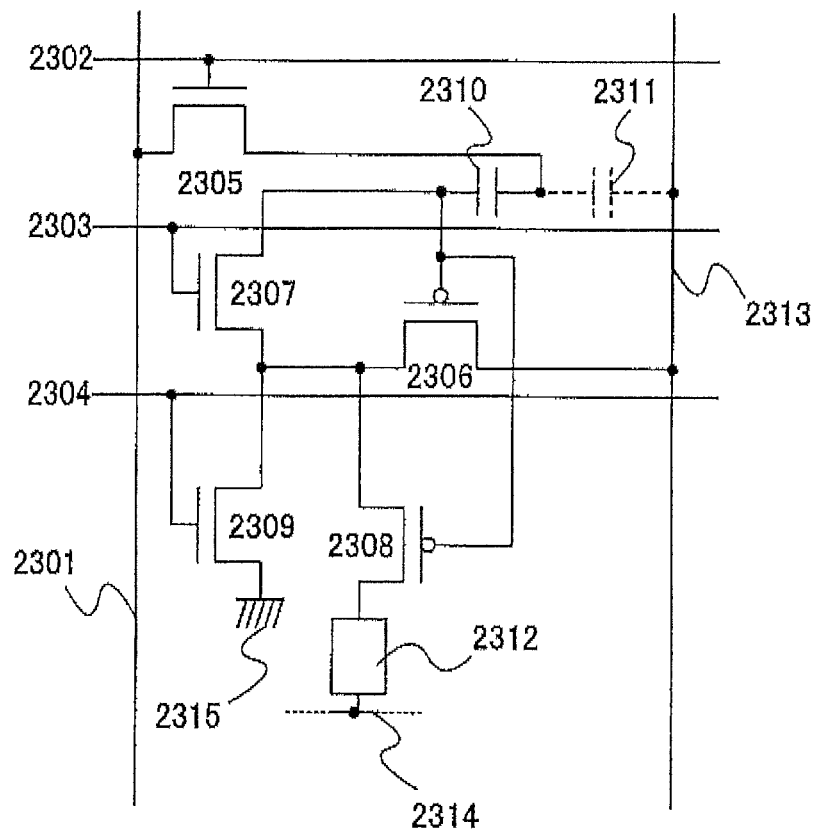
FIG. 23B
FIG. 23C
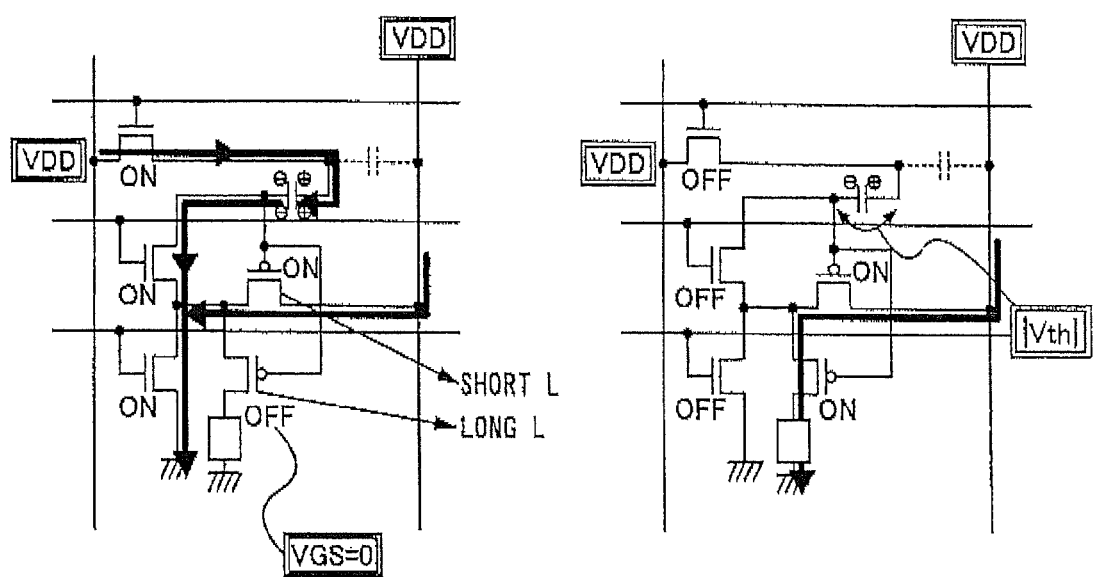

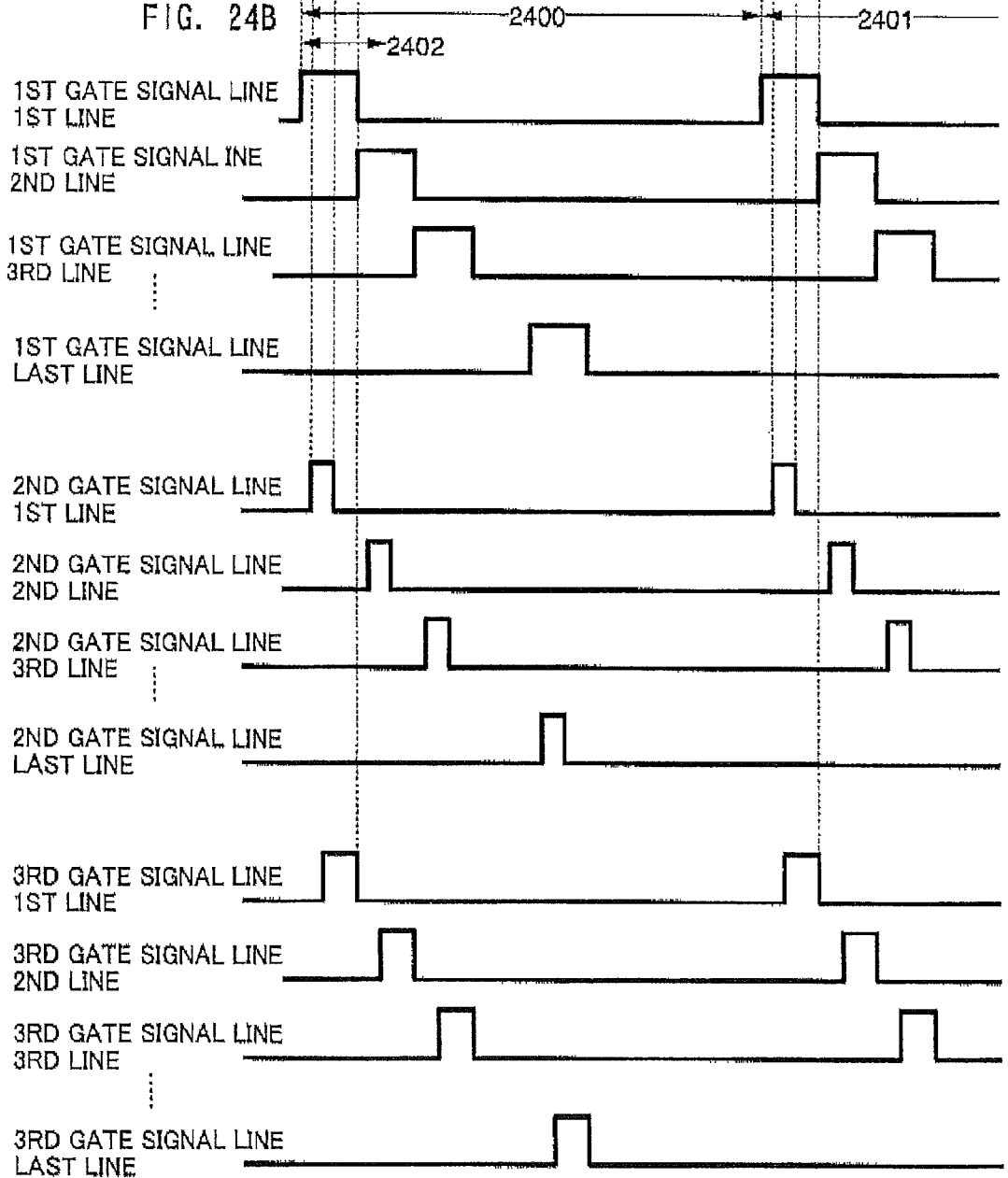

SEMICONDUCTOR DEVICE AND DRIVING METHOD THEREOF

CROSS-REFERENCE TO RELATED APPLICATIONS

This application is a continuation of U.S. application Ser. No. 13/767,038, filed Feb. 14, 2013, now allowed, which is a continuation of U.S. application Ser. No. 13/267,261, filed Oct. 6, 2011, now U.S. Pat. No. 8,378,356, which is a continuation of U.S. application Ser. No. 12/110,379, filed Apr. 28, 2008, now U.S. Pat. No. 8,035,109, which is a continuation of U.S. application Ser. No. 10/279,000, filed Oct. 24, 2002, now U.S. Pat. No. 7,365,713, which claims the benefit of a foreign priority application filed in Japan as Serial No. 2001-326397 on Oct. 24, 2001, all of which are incorporated by reference.

BACKGROUND OF THE INVENTION

1. Field of the Invention

The present invention relates to the structure of a semiconductor device having a transistor. In particular, the present invention relates to the structure of an active matrix type semiconductor device having a thin film transistor (hereinafter referred to as TFTs) manufactured on an insulator such as glass and plastic. Further, the present invention relates to electronic equipment using this type of semiconductor device as a display portion.

2. Description of the Related Art

In recent years, the development of display devices using a light emitting element such as an electroluminescence (EL) element has become active. A light emitting element emits light by itself, and thus, has high visibility. The light emitting element does not need a backlight necessary for a liquid crystal display device (LCD), which is suitable for a reduction of a light emitting device in thickness. Also, the light emitting element has no limitation on a viewing angle.

The term EL element indicates an element having a light emitting layer in which luminescence generated by the application of an electric field can be obtained. There are a light emission when returning to a base state from a singlet excitation state (fluorescence), and a light emission when returning to a base state from a triplet excitation state (phosphorescence) in the light emitting layer, and a semiconductor device of the present invention may use either of the aforementioned types of light emission.

EL elements normally have a laminate structure in which a light emitting layer is sandwiched between a pair of electrodes (anode and cathode). A laminate structure having "an anode, a hole transporting layer, a light emitting layer, an electron transporting layer, and a cathode", proposed by Tang et al. of Eastman Kodak Company, can be given as a typical structure. This structure has extremely high efficiency light emission, and most of the EL elements currently being researched employ this structure.

Further, structures having the following layers laminated in order between an anode and a cathode also exist: a hole injecting layer, a hole transporting layer, a light emitting layer, and an electron transporting layer; and a hole injecting layer, a hole transporting layer, a light emitting layer, an electron transporting layer, and an electron injecting layer. Any of the above-stated structures may be employed as the EL element structure used in the semiconductor device of the present invention. Furthermore, fluorescent pigments and the like may also be doped into the light emitting layer.

All layers formed in EL elements between the anode and the cathode are referred to generically as "EL layers" in this specification. The aforementioned hole injecting layer, hole transporting layer, light emitting layer, electron transporting layer, and electron injecting layer are all included in the category of EL layers, and light emitting elements structured by an anode, an EL layer, and a cathode are referred to as EL elements.

FIG. 3 shows a configuration of a pixel in a general semiconductor device. Note that, for example, an EL display device is used as a typical semiconductor device. The pixel shown in FIG. 3 has a source signal line 301, a gate signal line 302, a switching TFT 303, a driving TFT 304, capacitor means 305, an EL element 306, a current supply line 307, and a power source line 308.

A connection relationship among the respective elements will be described. Here, a TFT has three terminals of a gate, a source and a drain. However, with respect to the source and the drain, both cannot be clearly distinguished because of a structure of the TFT. Thus, when the connection among elements is described, one of the source and the drain represents a first electrode and the other represents a second electrode. When the description of potentials of the respective terminals (voltage between the gate and the source of a TFT, or the like) or the like is required with respect to ON and OFF of a TFT, for example, the source and the drain are indicated.

Also, in this specification, turning ON of a TFT indicates a state in which a voltage between the gate and source of the TFT exceeds a threshold value thereof and a current flows between the source and the drain. In addition, turning OFF of a TFT indicates a state in which a voltage between the gate and source of the TFT becomes lower than a threshold value thereof and a current does not flow between the source and the drain.

The gate electrode of the switching TFT 303 is connected with the gate signal line 302, the first electrode thereof is connected with the source signal line 301, and the second electrode thereof is connected with the gate electrode of the driving TFT 304. The first electrode of the driving TFT 304 is connected with the current supply line 307 and the second electrode thereof is connected with the first electrode of the EL element 306. The second electrode of the EL element 306 is connected with the power source line 308. The capacitor means 305 is connected between the gate electrode of the driving TFT 304 and the first electrode thereof and holds a voltage between the gate and the source of the driving TFT 304.

When a potential on the gate signal line 302 is changed to turn ON the switching TFT 303, a video signal inputted to the source signal line 301 is inputted to the gate electrode of the driving TFT 304. A voltage between the gate and the source of the driving TFT 304 is determined according to a potential of the inputted video signal so that a current flowing between the source and the drain of the driving TFT 304 (hereinafter referred to as a drain current) is determined. The current is supplied to the EL element 306 to emit light.

Now, a TFT made of polycrystalline silicon (polysilicon, hereinafter referred to as P-Si) has higher field effect mobility than a TFT made of amorphous silicon (hereinafter referred to as A-Si) and a larger ON current than that. Thus, it is more suitable as a transistor used for a semiconductor device.

On the other hand, with respect to the TFT made of polysilicon, there is a problem in that variations in electrical characteristics are easy to cause by a defect in a grain boundary.

In the pixel shown in FIG. 3, when characteristics such as a threshold value and an ON current of a TFT composing the pixel are varied for each pixel, even in the case where the same video signal is inputted, an amount of a drain current of the TFT is changed according thereto so that the intensity of the EL element 306 is varied. Thus, in the case of analog gradation, it becomes a problem.

Therefore, a digital gradation method of driving an EL element with only two states in which the intensity is 100% and 0% using a region in which a threshold value of a TFT or the like is hard to influence an ON current is proposed. According to this method, only two gray levels of white and black can be expressed. Thus, it is combined with a time gradation method or the like so that multi-gradation is realized.

When a method in which the digital gradation method is combined with the time gradation method is used, as configurations of a pixel in a semiconductor device, there are configurations shown in FIGS. 4A and 4B. When a canceling TFT 406 is used in addition to the switching TFT 404 and the driving TFT 405, it is possible to sensitively control a length of a light emitting time.

On the other hand, an example of a configuration capable of correcting a variation in threshold value of a TFT using another method is proposed in SID 98 DIGEST P11 "Design of an Improved Pixel for a Polysilicon Active-Matrix Organic LED Display". As shown in FIGS. 5A and 5B, it has a source signal line 501, first to third gate signal lines 502 to 504, TFTs 505 to 508, capacitor means 509 ($C_2$) and 510 ($C_1$), an EL element 511, and a current supply line 512.

The gate electrode of the TFT 505 is connected with the first gate signal line 502, the first electrode thereof is connected with the source signal line 501, and the second electrode thereof is connected with the first electrode of the capacitor means 509. The second electrode of the capacitor means 509 is connected with the first electrode of the capacitor means 510. The second electrode of the capacitor means 510 is connected with the current supply line 512. The gate electrode of the TFT 506 is connected with the second electrode of the capacitor means 509 and the first electrode of the capacitor means 510, the first electrode thereof is connected with the current supply line 512, and the second electrode thereof is connected with the first electrode of the TFT 507 and the first electrode of the TFT 508. The gate electrode of the TFT 507 is connected with the second gate signal line 503 and the second electrode thereof is connected with the second electrode of the capacitor means 509 and the first electrode of the capacitor means 510. The gate electrode of the TFT 508 is connected with the third gate signal line 504 and the second electrode thereof is connected with the first electrode of the EL element 511. The second electrode of the EL element 511 is supplied with a predetermined potential through a power source line 513 so that there is a potential difference between the second electrode and the current supply line 512.

The operation will be described using FIG. 5B and FIGS. 6A to 6F. FIG. 5B shows timing of a video signal and pulses which are inputted to the source signal line 501 and the first to third gate signal lines 502 to 504, and timing is divided into sections of I to VIII according to the respective operations shown in FIGS. 6A to 6F. In addition, according to the example of the pixel shown in FIG. 5A, it is composed of four TFTs and their polarities each are a P-channel type. Thus, when an L level is inputted to the gate electrode, it is turned ON. When an H level is input, it is turned OFF.

First, the first gate signal line 502 becomes an L level so that the TFT 505 is turned ON. At this time, the third gate signal line is an L level so that the TFT 508 is in an ON state (section I). Subsequently, the second gate signal line becomes an L level so that the TFT 507 is turned ON. Here, as shown in FIG. 6A, the capacitor means 509 and 510 are charged.

Then, when a voltage held by the capacitor means 510 exceeds a threshold value ($V_{th}$) of the TFT 506, the TFT 506 is turned ON (section II).

Subsequently, the third gate signal line becomes an H level so that the TFT 508 is turned OFF. Then, charges stored in the capacitor means 509 and 510 move again, and soon a voltage held by the capacitor means 510 becomes equal to $V_{th}$. At this time, as shown in FIG. 6B, respective potentials on the current supply line 512 and the source signal line 501 are $V_{DD}$. Thus, even in the capacitor means 509, a held voltage becomes equal to $V_{th}$. Accordingly, the TFT 506 is turned OFF soon.

As described above, when voltages held by the capacitor means 509 and 510 become equal to $V_{th}$, the second gate signal line 503 becomes an H level so that the TFT 507 is turned OFF (section IV). By such operations, as shown in FIG. 6C, $V_{th}$ is held in the capacitor means.

At this time, with respect to a charge $Q_1$ stored in the capacitor means 510 ($C_1$), a relation indicated by Equation 1 is held. Simultaneously, with respect to a charge $Q_2$ stored in the capacitor means 509 ($C_2$), a relation indicated by Equation 2 is held.

$$Q_1 = C_1 \times |V_{th}| \qquad \text{(Equation 1)}$$

$$Q_2 = C_2 \times |V_{th}| \qquad \text{(Equation 2)}$$

Subsequently, as shown in FIG. 6D, a video signal is inputted (section V). The video signal is outputted to the source signal line 501 and its potential is changed from $V_{DD}$ to a potential of the video signal $V_{Data}$ (here, assume that $V_{DD} > V_{Data}$ because the TFT 506 is a P-channel type). At this time, when a potential of the gate electrode of the TFT 506 is given by $V_p$ and a charge in the node is given by Q, relations indicated by Equations 3 and 4 are held from charge conservation law, including the capacitor means 509 and 510.

$$Q + Q_1 = C_1 \times (V_{DD} - V_P) \qquad \text{(Equation 3)}$$

$$Q - Q_2 = C_2 \times (V_P - V_{DATA}) \qquad \text{(Equation 4)}$$

Based on Equations 1 to 4, the potential $V_p$ of the gate electrode of the TFT 506 is indicated by Equation 5.

$$V_P = \frac{C_1}{C_1 + C_2} V_{DD} + \frac{C_2}{C_1 + C_2} V_{DATA} - |V_{th}| \qquad \text{(Equation 5)}$$

Thus, a voltage $V_{GS}$ between the gate and the source of the TFT 506 is indicated by Equation 6.

$$\begin{aligned} V_{GS} &= V_P - V_{DD} \qquad \text{(Equation 6)} \\ &= \frac{C_2}{C_1 + C_2}(V_{DATA} - V_{DD}) - |V_{th}| \\ &= \frac{C_2}{C_1 + C_2}(V_{DATA} - V_{DD}) + V_{th} \end{aligned}$$

The term of $V_{th}$ is included in the right side of Equation 6. In other words, the threshold value of the TFT 506 in the pixel is added to the video signal inputted from the source signal line and the resultant signal is held by the capacitor means 510.

When the input of the video signal is completed, the first gate signal line 502 becomes an H level so that the TFT 505 is turned OFF (section VI). After that, the source signal line is returned to a predetermined potential (section VII). By the above operation, write operation of the video signal into the pixel is completed (FIG. 6E).

Subsequently, the third gate signal line becomes an L level so that the TFT 508 is turned ON. Thus, as shown in FIG. 6F, a current flows into the EL element so that the EL element emits light. At this time, a value of the current flowing into the EL element depends on a voltage between the gate and the source of the TFT 506 and a drain current $I_{DS}$ flowing into the TFT 506 is indicated by Equation 7.

$$I_{DS} = \frac{\beta}{2}(V_{GS} - V_{th})^2 \quad \text{(Equation 7)}$$
$$= \frac{\beta}{2}\left\{\frac{C_2}{C_1 + C_2}(V_{DATA} - V_{DD})\right\}^2$$

From Equation 7, it is apparent that the drain current $I_{DS}$ of the TFT 506 does not depend on the threshold value $V_{th}$. Thus, even in the case where the threshold value of the TFT 506 is varied, the value is corrected for each pixel and added to the video signal. Accordingly, it is apparent that a current depending on the potential $V_{DATA}$ of the video signal flows into the EL element.

However, in the case of the above configuration, when capacitance values of the capacitor means 509 and 510 are varied, the drain current $I_{DS}$ of the TFT 506 is varied.

SUMMARY OF THE INVENTION

Therefore, an object of the present invention is to provide a semiconductor device using a pixel having a configuration capable of correcting a variation in threshold value of a TFT by using a configuration that is hard to be influenced by a variation in capacitance value.

According to the above method, the drain current $I_{DS}$ of the TFT 506 depends on the capacitance values of two capacitor means 509 and 510. In other words, when a state in which the threshold value is held (FIG. 6C) is shifted to writing of a video signal (FIG. 6D), charges move between capacitor means $C_1$ and $C_2$. That is, a voltage between both electrodes of $C_1$ and a voltage between both electrodes of $C_2$ are changed at shifting from a state of FIG. 6C to that of FIG. 6D. At this time, when there are variations in capacitance values of $C_1$ and $C_2$, the voltage between both electrodes of $C_1$ and the voltage between both electrodes of $C_2$ are also varied. According to the present invention, the threshold value is added to the video signal without being processed so that it can be corrected. Thus, in a process in which the video signal is inputted after the threshold value is stored in the capacitor means, charges do not move between the capacitor means and voltages between both electrodes of the capacitor means are not changed. Accordingly, it can be prevented that the drain current is influenced by variations in capacitance values.

The constitutions of the present invention are indicated below.

A semiconductor device according to the present invention includes a pixel provided with a light emitting element, in which:

the pixel comprises: a current supply line; first to third transistors each having a gate electrode and first and second electrodes; and capacitor means having first and second electrodes;

the first electrode of the capacitor means is electrically connected with the gate electrode of the first transistor and the first electrode of the second transistor;

the second electrode of the second transistor is electrically connected with the first electrode of the first transistor and the first electrode of the third transistor;

during a first period, the second and third transistors are turned on so that a charge is stored in the capacitor means through the first and second transistors;

during a second period, the third transistors is turned off and the second transistor is turned on so that a voltage held by the capacitor means is made equal to a threshold voltage of the first transistor;

during a third period, the second and third transistors are turned off so that a video signal is inputted through the second electrode of the capacitor means; and during a fourth period, the second transistors is turned off and the third transistor is turned on so that a current flows between a source and a drain of each of the first and third transistors.

A semiconductor device according to the present invention includes a pixel provided with a light emitting element, in which:

the pixel comprises: a source signal line; first to third gate signal lines; a current supply line; first to fourth transistors each having a gate electrode and first and second electrodes; capacitor means having first and second electrodes; and a light emitting element having a first electrode;

the gate electrode of the first transistor is electrically connected with the first gate signal line, the first electrode thereof is electrically connected with the source signal line, and the second electrode thereof is electrically connected with the first electrode of the capacitor means;

the second electrode of the capacitor means is electrically connected with the gate electrode of the second transistor and the first electrode of the third transistor;

the first electrode of the second transistor is electrically connected with the current supply line and the second electrode thereof is electrically connected with the second electrode of the third transistor and the first electrode of the fourth transistor;

the gate electrode of the third transistor is electrically connected with the second gate signal line; and the gate electrode of the fourth transistor is electrically connected with the third gate signal line and the second electrode thereof is electrically connected with the first electrode of the light emitting element.

A semiconductor device according to the present invention includes a pixel provided with a light emitting element, in which:

the pixel comprises: a source signal line; first to fourth gate signal lines; a current supply line; first to fifth transistors each having a gate electrode and first and second electrodes; capacitor means having first and second electrodes; and a light emitting element having a first electrode;

the gate electrode of the first transistor is electrically connected with the first gate signal line, the first electrode thereof is electrically connected with the source signal line, and the second electrode thereof is electrically connected with the first electrode of the capacitor means;

the second electrode of the capacitor means is electrically connected with the gate electrode of the second transistor and the first electrode of the third transistor;

the first electrode of the second transistor is electrically connected with the current supply line and the second electrode thereof is electrically connected with the second electrode of the third transistor and the first electrode of the fourth transistor;

the gate electrode of the third transistor is electrically connected with the second gate signal line;

the gate electrode of the fourth transistor is electrically connected with the third gate signal line and the second electrode thereof is electrically connected with the first electrode of the light emitting element; and the gate-electrode of the fifth transistor is electrically connected with the fourth gate signal line and the first electrode thereof is electrically connected with one of the second electrode of the capacitor means and the second electrode of the second transistor.

A semiconductor device according to the present invention includes a pixel provided with a light emitting element, in which:

the pixel comprises: a source signal line; first to third gate signal lines; a current supply line; first to fifth transistors each having a gate electrode and first and second electrodes; capacitor means having first and second electrodes; and a light emitting element having a first electrode;

the gate electrode of the first transistor is electrically connected with the first gate signal line, the first electrode thereof is electrically connected with the source signal line, and the second electrode thereof is electrically connected with the first electrode of the capacitor means;

the second electrode of the capacitor means is electrically connected with the gate electrode of the second transistor and the first electrode of the third transistor;

the first electrode of the second transistor is electrically connected with the current supply line and the second electrode thereof is electrically connected with the second electrode of the third transistor and the first electrode of the fourth transistor;

the gate electrode of the third transistor is electrically connected with the second gate signal line;

the gate electrode of the fourth transistor is electrically connected with the first gate signal line and the second electrode thereof is electrically connected with the first electrode of the light emitting element; and the gate electrode of the fifth transistor is electrically connected with the third gate signal line and the first electrode thereof is electrically connected with one of the second electrode of the capacitor means and the second electrode of the second transistor.

A semiconductor device according to the present invention as described above is characterized in that the first transistor and the fourth transistor have polarities opposite to each other.

A semiconductor device according to the present invention includes a pixel provided with a light emitting element, in which:

the pixel comprises: a source signal line; first to third gate signal lines; a current supply line; first to fifth transistors each having a gate electrode and first and second electrodes; capacitor means having first and second electrodes; and a light emitting element having a first electrode;

the gate electrode of the first transistor is electrically connected with the first gate signal line, the first electrode thereof is electrically connected with the source signal line, and the second electrode thereof is electrically connected with the first electrode of the capacitor means;

the second electrode of the capacitor means is electrically connected with the gate electrode of the second transistor, the gate electrode of the fourth transistor, and the first electrode of the third transistor;

the first electrode of the second transistor is electrically connected with the current supply line and the second electrode thereof is electrically connected with the second electrode of the third transistor and the first electrode of the fifth transistor;

the gate electrode of the third transistor is electrically connected with the second gate signal line;

the second electrode of the fourth transistor is electrically connected with the first electrode of the light emitting element; and the gate electrode of the fifth transistor is electrically connected with the third gate signal line and the first electrode thereof is electrically connected with one of the second electrode of the second transistor and the second electrode of the third transistor.

A semiconductor device according the present invention as described above is characterized in that the second transistor and the fourth transistor have the same polarity.

A semiconductor device according to the present invention includes a pixel provided with a light emitting element, in which:

the pixel comprises: a source signal line; first to third gate signal lines; a current supply line; first to fifth transistors each having a gate electrode and first and second electrodes; capacitor means having first and second electrodes; and a light emitting element having a first electrode;

the gate electrode of the first transistor is electrically connected with the first gate signal line, the first electrode thereof is electrically connected with the source signal line, and the second electrode thereof is electrically connected with the first electrode of the capacitor means;

the second electrode of the capacitor means is electrically connected with the gate electrode of the second transistor, the gate electrode of the fourth transistor, and the first electrode of the third transistor;

the first electrode of the second transistor is electrically connected with the current supply line and the second electrode thereof is electrically connected with the second electrode of the third transistor;

the gate electrode of the third transistor is electrically connected with the second gate signal line;

the first electrode of the fourth transistor is electrically connected with the current supply line and the second electrode thereof is electrically connected with the first electrode of the light emitting element; and the gate electrode of the fifth transistor is electrically connected with the third gate signal line and the first electrode thereof is electrically connected with one of the second electrode of the second transistor and the second electrode of the third transistor.

A semiconductor device according to the present invention as described above is characterized in that the second transistor and the fourth transistor have the same polarity.

A semiconductor device according to the present invention includes a pixel provided with a light emitting element, in which:

the pixel comprises: a source signal line; first to fourth gate signal lines; a current supply line; first to sixth transistors each having a gate electrode and first and second electrodes; capacitor means having first and second electrodes; and a light emitting element having a first electrode;

the gate electrode of the first transistor is electrically connected with the first gate signal line, the first electrode thereof is electrically connected with the source signal line, and the second electrode thereof is electrically connected with the first electrode of the capacitor means;

the second electrode of the capacitor means is electrically connected with the gate electrode of the second transistor, the gate electrode of the fourth transistor, and the first electrode of the third transistor;

the first electrode of the second transistor is electrically connected with the current supply line and the second electrode thereof is electrically connected with the second electrode of the third transistor;

the gate electrode of the third transistor is electrically connected with the second gate signal line;

the first electrode of the fourth transistor is electrically connected with the current supply line and the second electrode thereof is electrically connected with the first electrode of the light emitting element;

the gate electrode of the fifth transistor is electrically connected with the third gate signal line and the first electrode thereof is electrically connected with one of the second electrode of the second transistor and the second electrode of the third transistor; and the gate electrode of the sixth transistor is electrically connected with the fourth gate signal line, the first electrode thereof is electrically connected with the current supply line, and the second electrode thereof is electrically connected with the gate electrode of the fourth transistor.

A semiconductor device according to the present invention includes a pixel provided with a light emitting element, in which:

the pixel comprises: a source signal line; first to fourth gate signal lines; a current supply line; first to sixth transistors each having a gate electrode and first and second electrodes; capacitor means having first and second electrodes; and a light emitting element having a first electrode;

the gate electrode of the first transistor is electrically connected with the first gate signal line, the first electrode thereof is electrically connected with the source signal line, and the second electrode thereof is electrically connected with the first electrode of the capacitor means;

the second electrode of the capacitor means is electrically connected with the gate electrode of the second transistor, the gate electrode of the fourth transistor, and the first electrode of the third transistor;

the first electrode of the second transistor is electrically connected with the current supply line and the second electrode thereof is electrically connected with the second electrode of the third transistor;

the gate electrode of the third transistor is electrically connected with the second gate signal line;

the first electrode of the fourth transistor is electrically connected with the current supply line and the second electrode thereof is electrically connected with the first electrode of the light emitting element;

the gate electrode of the fifth transistor is electrically connected with the third gate signal line and the first electrode thereof is electrically connected with one of the second electrode of the second transistor and the second electrode of the third transistor; and the gate electrode of the sixth transistor is electrically connected with the fourth gate signal line, the first electrode thereof is electrically connected with the current supply line, and the second electrode thereof is electrically connected with the first electrode of the capacitor means.

A semiconductor device according to the present invention includes a pixel provided with a light emitting element, in which:

the pixel comprises: a source signal line; first to fourth gate signal lines; a current supply-line; first to sixth transistors each having a gate electrode and first and second electrodes; capacitor means having first and second electrodes; and a light emitting element having a first electrode;

the gate electrode of the first transistor is electrically connected with the first gate signal line, the first electrode thereof is electrically connected with the source signal line, and the second electrode thereof is electrically connected with the first electrode of the capacitor means;

the second electrode of the capacitor means is electrically connected with the gate electrode of the second transistor, the gate electrode of the fourth transistor, and the first electrode of the third transistor;

the first electrode of the second transistor is electrically connected with the current supply line and the second electrode thereof is electrically connected with the second electrode of the third transistor;

the gate electrode of the third transistor is electrically connected with the second gate signal line;

the first electrode of the fourth transistor is electrically connected with the current supply line and the second electrode thereof is electrically connected with the first electrode of the light emitting element;

the gate electrode of the fifth transistor is electrically connected with the third gate signal line and the first electrode thereof is electrically connected with one of the second electrode of the second transistor and the second electrode of the third transistor; and the gate electrode of the sixth transistor is electrically connected with the fourth gate signal line and provided between the current supply line and the first electrode of the fourth transistor or between the second electrode of the fourth transistor and the first electrode of the light emitting element.

A semiconductor device according to the present invention as described above is characterized in that the semiconductor device has a function for inputting a pulse to the fourth gate signal line to turn on the sixth transistor so that a voltage between a gate and a source of the fourth transistor is set to zero.

A semiconductor device according to the present invention as described above is characterized by including a function for inputting a pulse to the fourth gate signal line to turn on the sixth transistor so that a charge held in the capacitor means is released.

A semiconductor device according to the present invention as described above is characterized by including a function for inputting a pulse to the fourth gate signal line to turn off the sixth transistor so that a current supplied from the current supply line to the light emitting element is cut off.

A semiconductor device according to the present invention as described above is characterized in that the second transistor and the fourth transistor have the same polarity.

A semiconductor device according to the present invention includes a pixel provided with a light emitting element, in which:

the pixel comprises: a source signal line; first to fourth gate signal lines; a current supply line; first to sixth transistors each having a gate electrode and first and second electrodes; capacitor means having first and second electrodes; and a light emitting element having a first electrode;

the gate electrode of the first transistor is electrically connected with the first gate signal line, the first electrode thereof is electrically connected with the source signal line, and the second electrode thereof is electrically connected with the first electrode of the capacitor means and the first electrode of the fifth transistor;

the second electrode of the capacitor means is electrically connected with the gate electrode of the second transistor, the gate electrode and the first electrode of the fifth transistor, and the first electrode of the third transistor;

the first electrode of the second transistor is electrically connected with the current supply line and the second electrode thereof is electrically connected with the second electrode of the third transistor and the first electrode of the fourth transistor; the gate electrode of the third transistor is electrically connected with the second gate signal line;

the gate electrode of the fourth transistor is electrically connected with the third gate signal line and the second electrode thereof is electrically connected with the first electrode of the light emitting element; and the gate electrode of the sixth transistor is electrically connected with the fourth gate signal line and provided between the first electrode of the capacitor means and the first electrode of the fifth transistor, between the first electrode of the third transistor and the second electrode of the fifth transistor, or between the first electrode of the third transistor and the gate electrode of the fifth transistor A semiconductor device according to the present invention includes a pixel provided with a light emitting element, in which:

the pixel includes: a source signal line; first to third gate signal lines; a current supply line; first to sixth transistors each having a gate electrode and first and second electrodes; capacitor means having first and second electrodes; and a light emitting element having a first electrode;

the gate electrode of the first transistor is electrically connected with the first gate signal line, the first electrode thereof is electrically connected with the source signal line, and the second electrode thereof is electrically connected with the first electrode of the capacitor means and the first electrode of the fifth transistor;

the second electrode of the capacitor means is electrically connected with the gate electrode of the second transistor, the gate electrode and the first electrode of the fifth transistor, and the first electrode of the third transistor;

the first electrode of the second transistor is electrically connected with the current supply line and the second electrode thereof is electrically connected with the second electrode of the third transistor and the first electrode of the fourth transistor;

the gate electrode of the third transistor is electrically connected with the second gate signal line;

the gate electrode of the fourth transistor is electrically connected with the third gate signal line and the second electrode thereof is electrically connected with the first electrode of the light emitting element; and the gate electrode of the sixth transistor is electrically connected with the second gate signal line and provided between the first electrode of the capacitor means and the first electrode of the fifth transistor, between the first electrode of the third transistor and the second electrode of the fifth transistor, or between the first electrode of the third transistor and the gate electrode of the fifth transistor.

A semiconductor device according to the present invention is characterized in that the third transistor and the sixth transistor have the same polarity.

A semiconductor device according to the present invention is characterized in that a second electrode of the light emitting element is electrically connected with a power source line having a potential with a potential difference relative to the current supply line.

A semiconductor device according to the present invention is characterized in that the second electrode of the fifth transistor is electrically connected with a power source line having a potential with a potential difference relative to the current supply line.

A semiconductor device according to the present invention is characterized in that the second electrode of the fifth transistor is electrically connected with one of the gate signal lines except the gate signal line for controlling the pixel.

A semiconductor device according to the present invention is characterized in that the pixel further includes storage capacitor means for holding a video signal inputted inputted from the source signal line, which is provided between the second electrode of the first transistor and a predetermined potential. According to the present invention, there is provided a method of driving a semiconductor device having a pixel provided with a light emitting element, in which the pixel includes at least a source signal line, a current supply line, a transistor for supplying a predetermined current to the light emitting element, a light emitting element, and capacitor means, the method including:

a first step of storing a charge in the capacitor means;

a second step of converging a voltage between both electrodes of the capacitor means to a voltage equal to a threshold voltage of the transistor;

a third step of inputting a video signal from the source signal line; and a fourth step of adding the threshold voltage to a potential of the video signal and applying an added voltage to a gate electrode of the transistor so that a current is supplied to the light emitting element through the transistor to emit light, wherein at least in the third step, the voltage between both electrodes of the capacitor means is constant.

BRIEF DESCRIPTION OF THE DRAWINGS

In the accompanying drawings:

FIGS. 8A and 8B show configuration examples of a source signal line driver circuit and a gate signal line driver circuit in the semiconductor device shown in FIGS. 7A to 7C;

FIGS. 23A to 23C show a pixel configuration of a semiconductor device in accordance with an embodiment of the present invention;

FIGS. 24A and 24B show an example of operational timing in the case where the semiconductor device of the present invention is driven;

DETAILED DESCRIPTION OF THE PREFERRED EMBODIMENTS

Figure 1A:
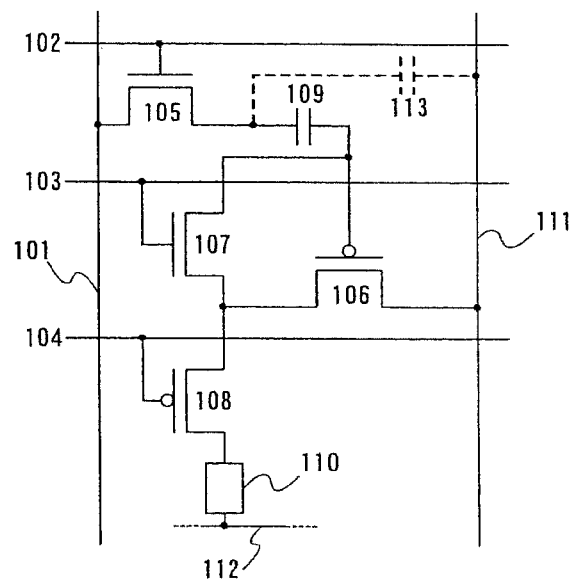
FIGS. 1A and 1B are a diagram showing a pixel configuration of a semiconductor device and a timing chart thereof in accordance with an embodiment mode of the present invention.

FIG. 1A shows an embodiment mode of the present invention. A pixel includes a source signal line 101, first to third gate signal lines 102 to 104, first to fourth TFTs 105 to 108, capacitor means 109, an EL element 110, a current supply line 111, and a power source line 112.

The gate electrode of the first TFT 105 is connected with the first gate signal line 102, the first electrode thereof is connected with the source signal line 101, and the second electrode thereof is connected with the first electrode of the capacitor means 109. The second electrode of the capacitor means 109 is connected with the gate electrode of the second TFT 106 and the first electrode of the third TFT 107. The first electrode of the second TFT 106 is connected with the current supply line 111 and the second electrode thereof is connected with the second electrode of the third TFT 107 and the first electrode of the fourth TFT 108. The gate electrode of the third TFT 107 is connected with the second gate signal line 103. The gate electrode of the fourth TFT 108 is connected with the third gate signal line 104 and the second electrode thereof is connected with the first electrode of the EL element 110. The second electrode of the EL element 110 is provided with a predetermined potential through the power source line 112 so that there is a potential difference between the second electrode and the current supply line 111. In addition, as shown by a dotted line in FIG. 1A, capacitor means 113 may be provided between the second electrode of the first TFT 105 and the current supply line 111 to use it as a capacitor for holding a video signal.

Figure 1B:
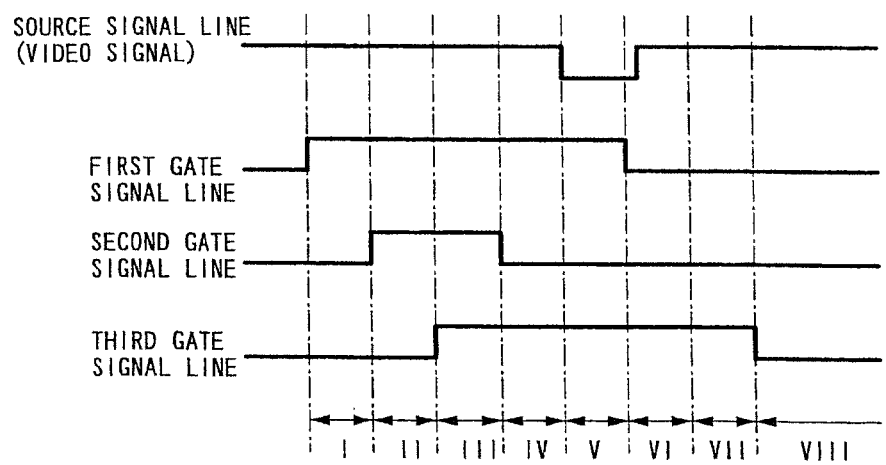
Figure 5A:
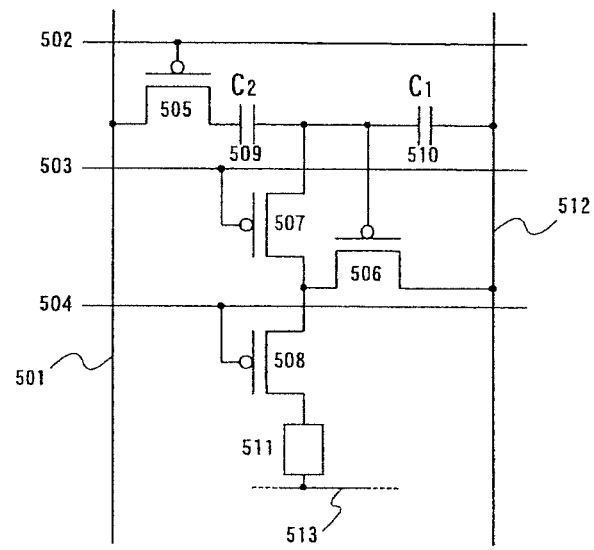
FIGS. 5A and 5B are a diagram showing a configuration of a pixel capable of correcting a variation in threshold value and a timing chart thereof.
Figure 5B:
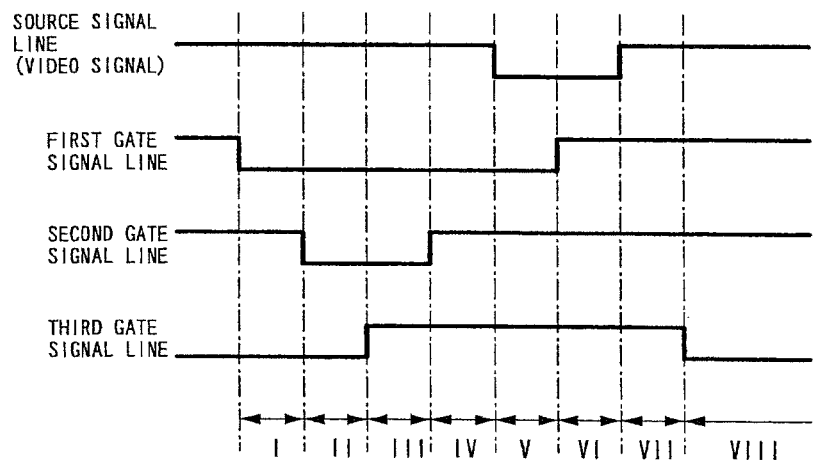
Figure 6A:
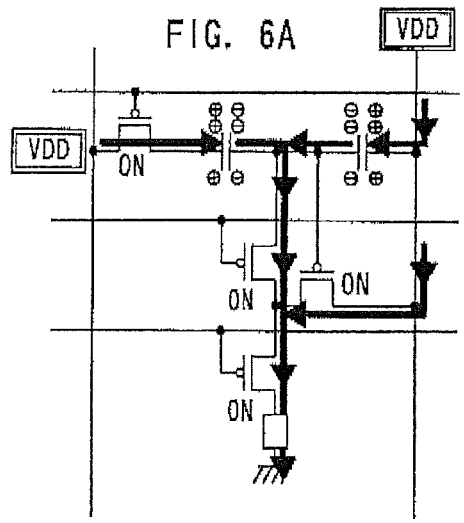
FIGS. 6A to 6F are explanatory diagrams for driving of the pixel shown in FIG. 5A.
Figure 6B:
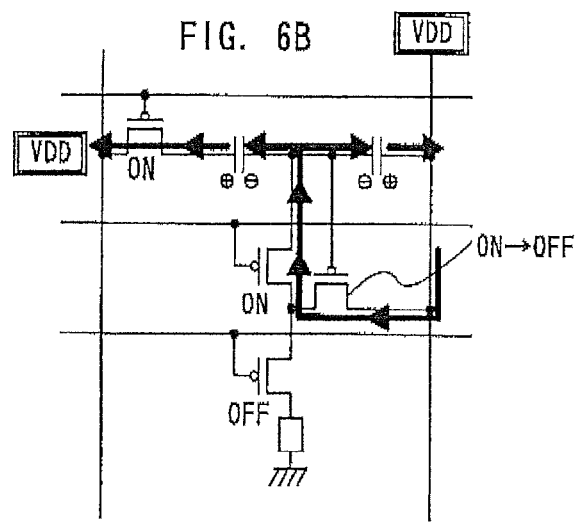
Figure 6C:
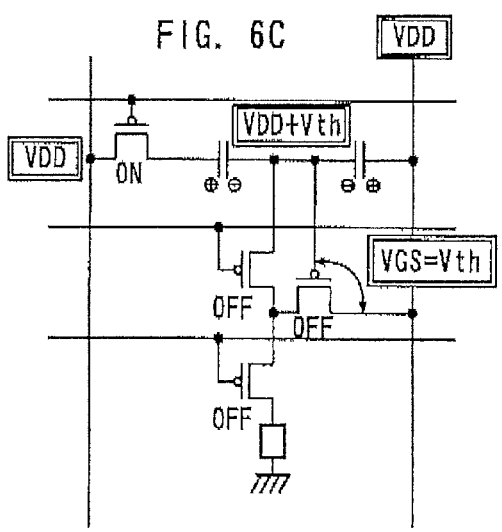
Figure 6D:
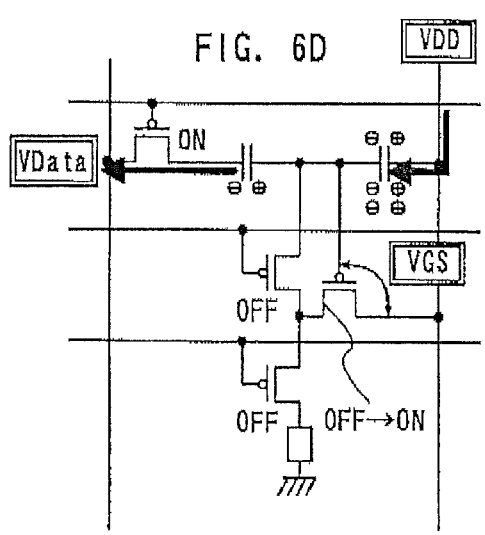
Figure 6E:
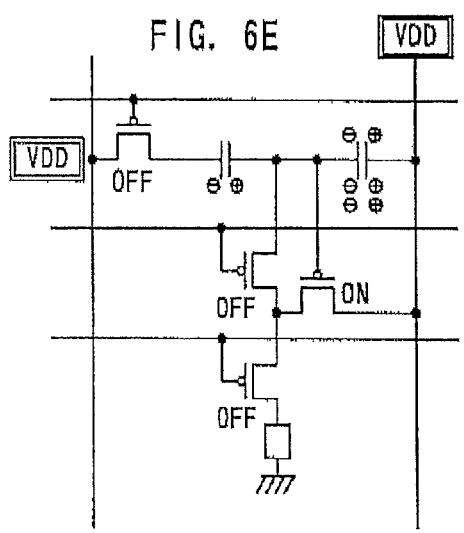
Figure 6F:
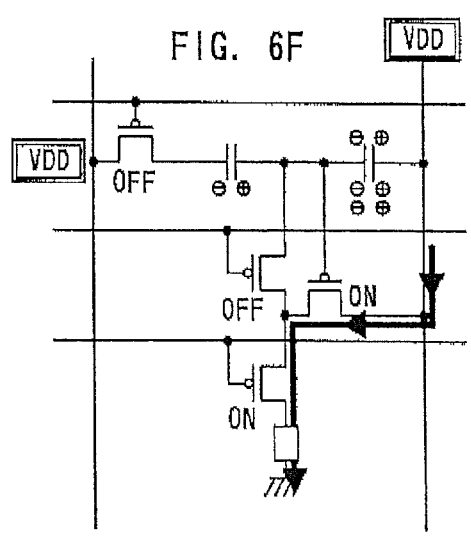

The operation will be described using FIG. 1B and FIGS. 2A to 2F. FIG. 1B shows timing of a video signal and pulses which are inputted to the source signal line 101 and the first to third gate signal lines 102 to 104, and the timing is divided into sections of I to VIII according to the respective operations shown in FIGS. 2A to 2F. In addition, according to the configuration shown in FIG. 1A, the first TFT 105 and the third TFT 107 each are an N-channel type and the second TFT 106 and the fourth TFT 108 each are a P-channel type. As shown in FIG. 5A, it can be composed of only the P-channel TFTs. However, since the first TFT 105 and the third TFT 107 are used as merely switching elements, one of both polarities may be used. Here, an N-channel type is used. In the N-channel TFT, when an H level is inputted to the gate electrode, it is turned ON. When an L level is input, it is turned OFF. In the P-channel TFT, when an L level is inputted to the gate electrode, it is turned ON. When an H level is input, it is turned OFF.

Figure 2A:
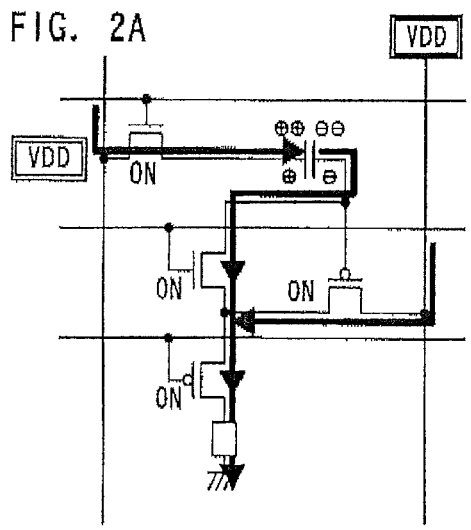
FIGS. 2A to 2F are explanatory diagrams for driving of a pixel shown in FIG. 1A.

First, the first gate signal line 102 becomes an H level so that the first TFT 105 is turned ON (section I). Subsequently, the second gate signal line 103 becomes an H level and the third gate signal line 104 becomes an L level so that the third TFT 107 and the fourth TFT 108 are turned ON (section II). Here, as shown in FIG. 2A, the capacitor means 109 is charged, and when a voltage held by the capacitor means 109 exceeds a threshold value ($V_{th}$) of the second TFT 106, the second TFT 106 is turned ON.

Figure 2B:
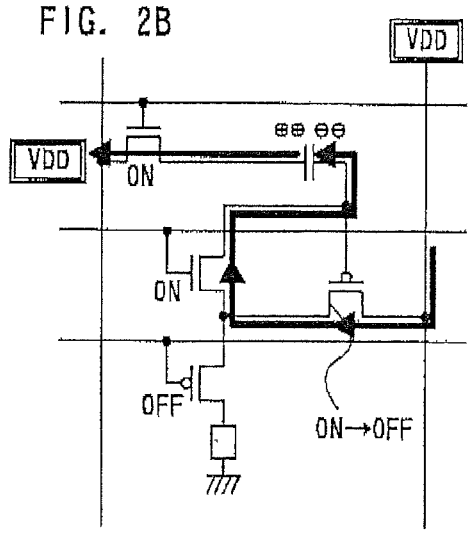

Subsequently, as shown in FIG. 2B, the third gate signal line 104 becomes an H level so that the fourth TFT 108 is turned OFF. Then, charges stored in the capacitor means 109 move again, and soon a voltage held by the capacitor means 109 becomes equal to $V_{th}$. In other words, a voltage between the gate and the source of the second TFT 106 becomes equal to $V_{th}$ so that the second TFT 106 is turned OFF (section III).

Figure 2C:
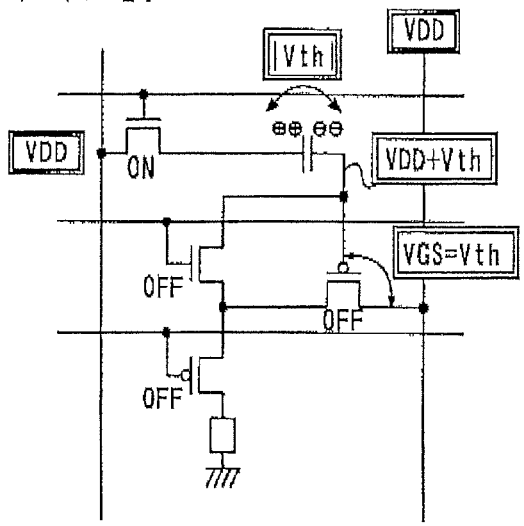

After that, the second gate signal line 103 becomes an L level so that the third TFT 107 is turned OFF (section IV). By such operation, as shown in FIG. 2C, $V_{th}$ is held in the capacitor means 109.

Figure 2D:
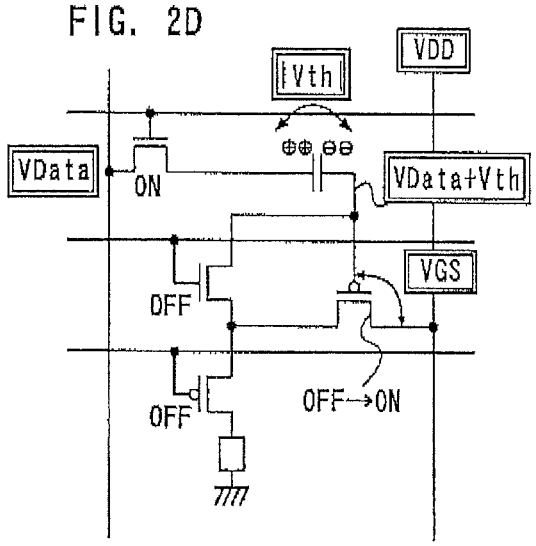

Subsequently, as shown in FIG. 2D, a video signal is inputted (section V). The video signal is outputted to the source signal line 101 and its potential is changed from $V_{DD}$ to a potential of the video signal $V_{Data}$ (here, assume that $V_{DD} > V_{Data}$ in the case where light is emitted from the EL element because the second TFT 106 is a P-channel type). Here, previous $V_{th}$ is held in the capacitor means 109 without being changed so that charges stored in the capacitor means 109 do not move. Thus, a voltage between both electrodes of the capacitor means 109 is not changed. Accordingly, a potential of the gate electrode of the second TFT 10'6 become a potential obtained by adding the threshold value $V_{th}$ to the potential of the video signal $V_{Data}$ inputted from the source signal line 101. Here, the TFT 106 is a P-channel type and the threshold value $V_{th}$ is a negative value. Thus, the potential actually becomes a value smaller than $V_{Data}$ by $|V_{th}|$. Accordingly, the second TFT 106 is turned ON (section V).

Figure 2E:
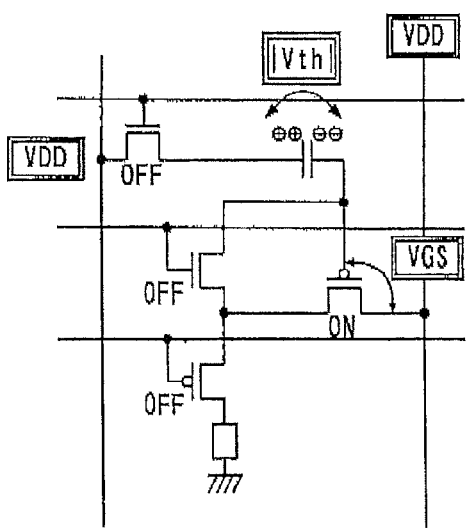

Then, when writing of the video signal is completed, as shown in FIG. 2E, the first gate signal line 102 becomes an L level so that the first TFT 105 is turned OFF (section VI). After that, the output of the video signal to the source signal line is also completed and its potential is returned to VDD (section VII).

Figure 2F:
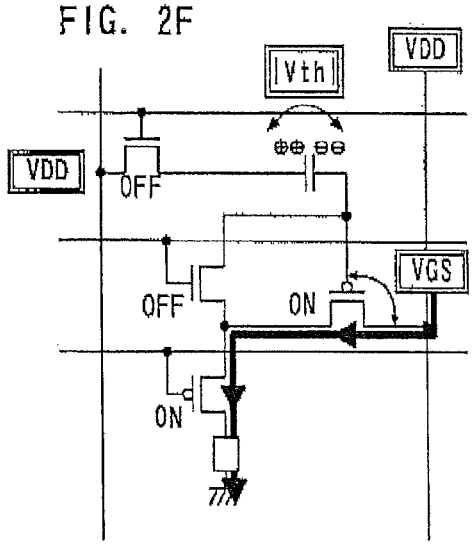
Figure 3:
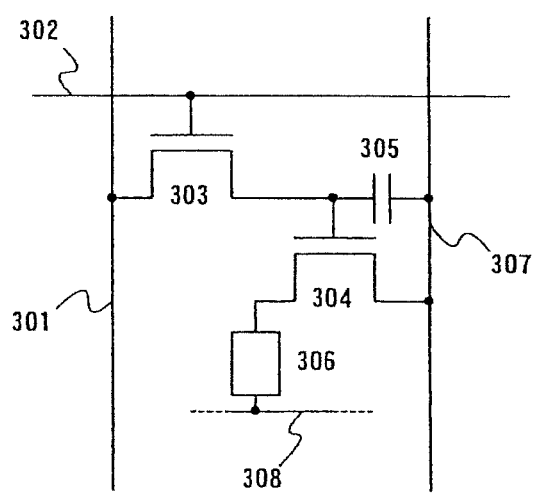
FIG. 3 shows a configuration example of a pixel of a commonly used semiconductor device.
Figure 4A:
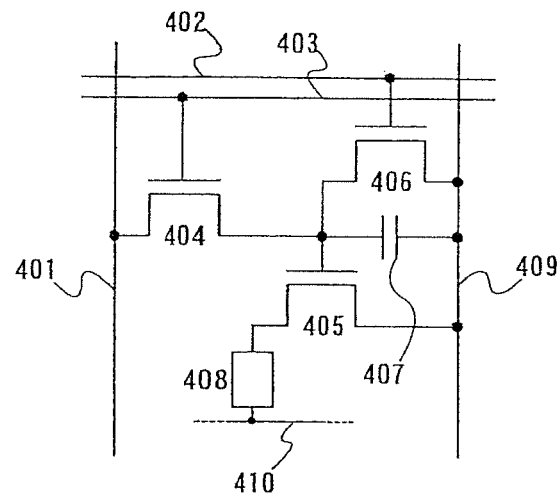
FIGS. 4A and 4B show configurations of a pixel in the case where it is driven by a time gradation method using a digital video signal.
Figure 4B:
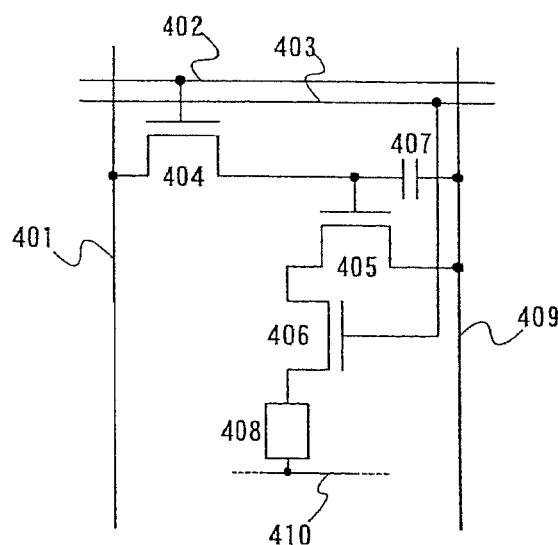

Subsequently, the third gate signal line 104 becomes an L level so that the fourth TFT 108 is turned ON. Thus, as shown in FIG. 2F, a current flows into the EL element so that the EL element emits light (section VIII). At this time, a value of the current flowing into the EL element depends on a voltage between the gate and the source of the second TFT 106, and the voltage between the gate and the source is $(V_{DD}-(V_{Data}+V_{th}))$. Here, even if the threshold value $V_{th}$ of the second TFT 106 is varied among the second TFTs 106 of respective pixels, a voltage corresponding to the variation is held in the capacitor means 109 of the respective pixels. Thus, there is no case where the intensity of the EL element 110 is influenced by the variation in threshold value.

By the above-mentioned operation, processing from writing of the video signal to light emission is conducted. According to the present invention, the potential of the video signal can be offset by the threshold value of the second TFT 106 by capacitive coupling of the capacitor means 109. In other words, it does not depend on a capacitance of the capacitor means 109. Thus, the threshold value correction can be accurately conducted without being influenced by, for example, variations in characteristics of other elements as described above.

Figure 25A:
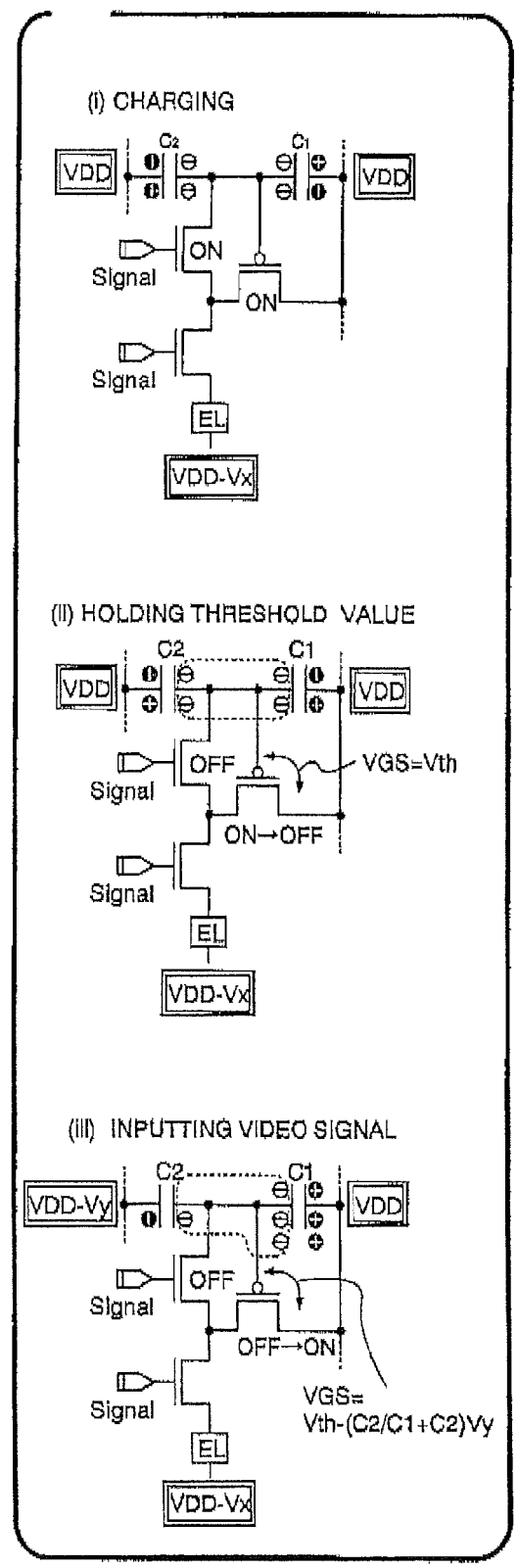
FIGS. 25A and 25B are explanatory diagrams for principle of operation of a circuit in a conventional example and the present invention.
Figure 25B:
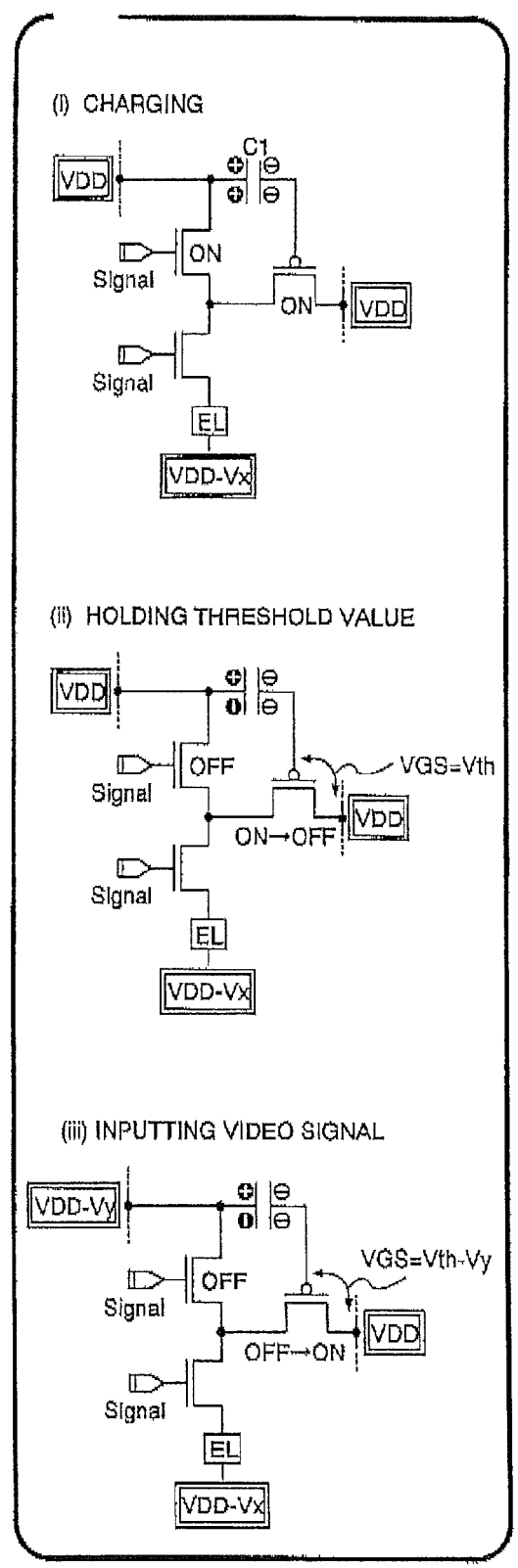

FIGS. 25A and 25B are brief explanatory diagrams of operations for threshold value correction according to a conventional example and the present invention. In FIG. 25A, when the video signal is inputted, charges are stored in the two capacitor means $C_1$ and $C_2$ and the movement of the charges is generated therebetween. Thus, a voltage $V_{GS}$ between the gate and the source of the TFT which supplies a current to the EL element is indicated by the equation including the term of the capacitance values $C_1$ and $C_2$ as shown in (iii) in FIG. 25A. Therefore, when variations in capacitance values $C_1$ and $C_2$ are caused, the voltage $V_{GS}$ between the gate and the source of the TFT is varied.

In contrast to this, in the case of the present invention, charges are stored in the capacitor means, but when the video signal is inputted, the movement of charges does not occur. In other words, a potential obtained by adding a threshold voltage to a potential of the video signal is applied to the gate electrode of the TFT as it is. Thus, a variation in voltage between the gate and the source of the TFT can be further suppressed.

Note that, in the case of charging as shown in FIG. 2B, it is unnecessary to store charges which are exactly equal to $V_{th}$ in the capacitor means 109. In the case of about $|V_{th}|+\alpha$, it is unnecessary to exactly turn OFF the second TFT 106. It is preferable that a voltage enough to conduct correction of a variation in threshold value of a TFT for each pixel is held.

Note that the polarity of the TFT in the configuration indicated in this embodiment mode is merely an example, and it is appended that the polarity is not limited.

EMBODIMENTS

Hereafter, the embodiments of the invention will be described.

Embodiment 1

Figure 7A:
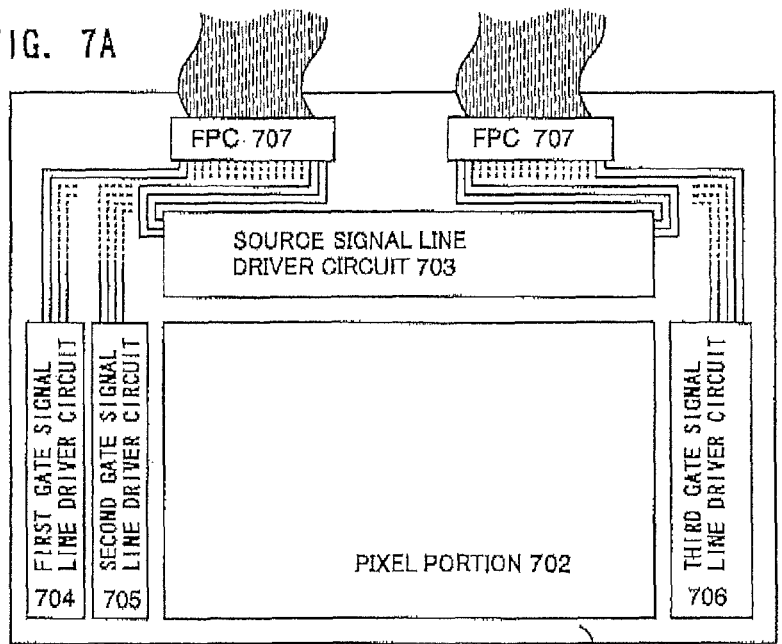
FIGS. 7A to 7C show a configuration example of an analog video signal input type semiconductor device in accordance with an embodiment of the present invention.

In this embodiment, the configuration of a semiconductor device in which analog video signals are used for video signals for display will be described. A configuration example of the semiconductor device is shown in FIG. 7A. The device has a pixel portion 702 wherein a plurality of pixels is arranged in a matrix shape over a substrate 701, and it has a source signal line driver circuit 703 and first to third gate signal line driver circuits 704 and 706 around the pixel portion. In FIG. 7A, three gate signal line driver circuits are used, which control first to third gate signal lines of pixels shown in FIG. 1.

Signals inputted to the source signal line driver circuit 703, and the first to third gate signal line driver circuits 704 and 706 are provided from outside through a flexible printed circuit (FPC) 707.

Figure 7B:
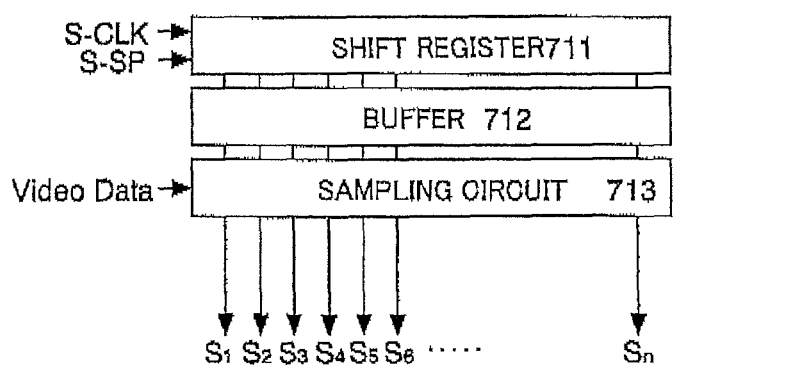

FIG. 7B shows a configuration example of the source signal line driver circuit. This is the source signal line driver circuit for using analog video signals for video signals for display, which has a shift register 711, a buffer 712, and a sampling circuit 713. Not shown particularly, but a level shifter may be added if necessary.

The operation of the source signal line driver circuit will be described. FIG. 8A shows the more detailed configuration, thus referring to the drawing.

A shift register 801 is formed of a plurality of flip-flop circuits (FF) 802, to which the clock signal (S-CLK), the clock inverted signal (S-CLKb), and the start pulse (S-SP) are inputted. In response to the timing of these signals, sampling pulses are outputted sequentially.

The sampling pulses outputted from the shift register 801 are passed through a buffer 803 etc. and amplified, and then inputted to a sampling circuit. The sampling circuit 804 is formed of a plurality of sampling switches (SW) 805, which samples video signals in a certain column in accordance with the timing of inputting the sampling pulses. More specifically, when the sampling pulses are inputted to the sampling switches, the sampling switches 805 are turned on. The potential held by the video signals at this time is outputted to the respective source signal lines through the sampling switches.

Figure 7C:
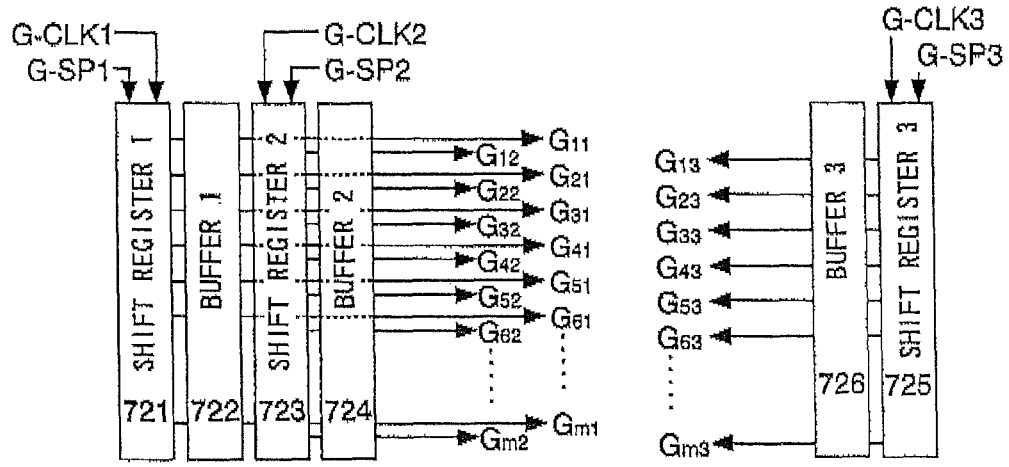

Subsequently, the operation of the gate signal line driver circuit will be described. FIG. 8B shows the more detailed configuration of the first and second gate signal line driver circuits 704 and 705 shown in FIG. 7C. The first gate signal line driver circuit has a shift register circuit 811, and a buffer 812, which is driven in response to the clock signal (G-CLK1), the clock inverted signal (G-CLKb1), and the start pulse (G-SP1). The second gate signal line driver circuit has a shift register circuit 813 and a buffer 814, which is driven in response to the clock signal (G-CLK2), the clock inverted signal (G-CLKb2), and the start pulse (G-SP2).

The operation from the shift register to the buffer is the same as that in the source signal line driver circuit. The sampling pulses amplified by the buffer select respective gate signal lines for them. The first gate signal line driver circuit sequentially selects first gate signal lines $G_{11}, G_{21}, \ldots$ and $G_{m1}$, and the second gate signal line driver circuit sequentially selects second gate signal lines $G_{12}, G_{22}, \ldots$ and $G_{m2}$. A third gate signal line driver circuit, not shown, is also the same as the first and second gate signal line driver circuits, sequentially selecting third gate signal lines $G_{13}, G_{23}, \ldots$ and $G_{m3}$.

In the selected row, video signals are written in the pixel to emit light according to the procedures described in the embodiment mode.

Note that, as one example of the shift register, that formed of a plurality of flip-flops is shown here. However, such the configuration is acceptable that signal lines can be selected by a decoder and the like.

Embodiment 2

Figure 9A:
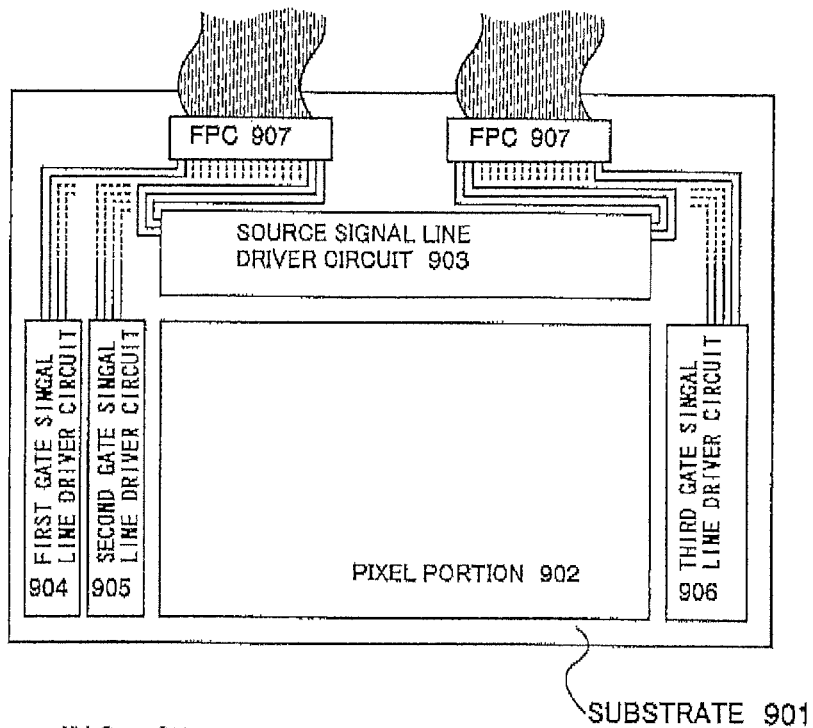
FIGS. 9A and 9B show a configuration example of a digital video signal input type semiconductor device in accordance with an embodiment of the present invention.

In this embodiment, a configuration of a semiconductor device in which digital video signals are used for video signals for display will be described. FIG. 9A shows a configuration example of the semiconductor device. The device has a pixel portion 902 wherein a plurality of pixels is arranged in a matrix shape over a substrate 901, and it has a source signal line driver circuit 903, and first to third gate signal line driver circuits 904 to 906 around the pixel portion. In FIG. 9A, three gate signal line driver circuits are used, which control first to third gate signal lines of pixels shown in FIG. 1.

Signals inputted to the source signal line driver circuit 903, and the first to third gate signal line driver circuits 904 to 906 are supplied from outside through a flexible printed circuit (FPC) 907.

Figure 9B:
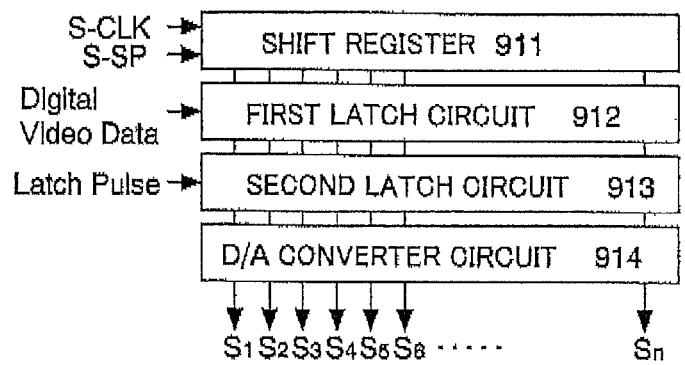

FIG. 9B shows a configuration example of the source signal line driver circuit. This is the source signal line driver circuit for using digital video signals for video signals for display, which has a shift register 911, a first latch circuit 912, a second latch circuit 913, and a D/A converter circuit 914. Not shown in the drawing particularly, but a level shifter may be added if necessary.

The first to third gate signal line driver circuits 904 to 906 can be same as those shown in Embodiment 1, thus omitting the illustration and description here.

Figure 10A:
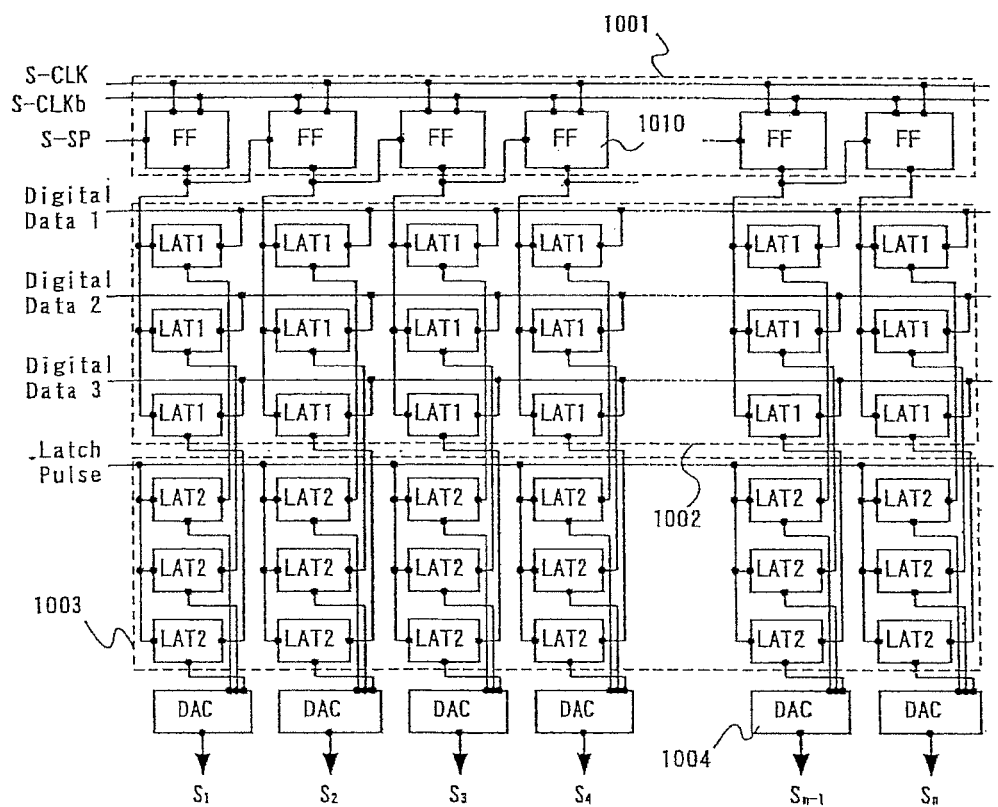
FIGS. 10A and 10B show configuration examples of a source signal line driver circuit in the semiconductor device shown in FIGS. 9A and 9B.

The operation of the source signal line driver circuit will be described. FIG. 10A shows the more detailed configuration, thus referring to the drawing.

A shift register 1001 is formed of a plurality of flip-flop circuits (FF) 1010 or the like, to which the clock signal (S-CLK), the clock inverted signal (S-CLKb), and the start pulse (S-SP) are inputted. Sampling pulses are sequentially outputted in response to the timing of these signals.

The sampling pulses outputted from the shift register 1001 are inputted to first latch circuits 1002. Digital video signals are being inputted to the first latch circuits 1002. The digital video signals are held at each stage in response to the timing of inputting the sampling pulses. Here, the digital video signals are inputted by three bits. The video signals at each bit are held in the respective first latch circuits. Here, three first latch circuits are operated in parallel by one sampling pulse.

When the first latch circuits 1002 finish to hold the digital video signals up to the last stage, latch pulses are inputted to second latch circuits 1003 during the horizontal retrace period, and the digital video signals held in the first latch circuits 1002 are transferred to the second latch circuits 1003 all at once. After that, the digital video signals held in the second latch circuits 1003 for one row are inputted to D/A converter circuits 1004 simultaneously.

While the digital video signals held in the second latch circuits 903 are being inputted to a constant current circuit 904, the shift register 901 again outputs sampling pulses. Subsequent to this, the operation is repeated to process the video signals for one frame.

The D/A converter circuits 1004 convert the inputted digital video signals from digital to analog and output them to the source signal lines as the video signals having the analog voltage.

The operation described above is conducted throughout the stages during one horizontal period. Accordingly, the video signals are outputted to the entire source signal lines.

Note that, as described in the Embodiment 1, such the configuration is acceptable that a decoder or the like is used instead of the shift register to select signal lines.

Embodiment 3

Figure 10B:
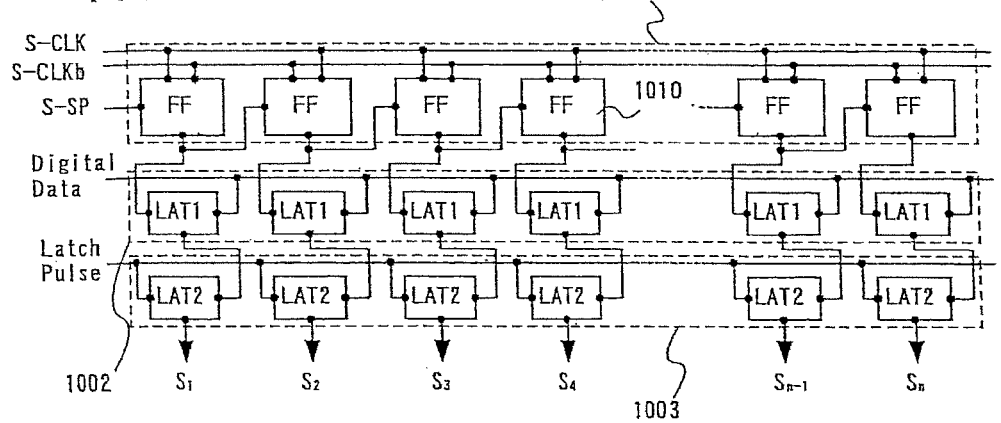

In Embodiment 2, the digital video signal is subjected to digital-to-analog conversion by the D/A converter circuit and written into the pixel. The semiconductor device of the present invention can also conduct gradation representation by a time gradation method. In this case, as shown in FIG. 10B, the D/A converter circuit is not required and the gradation representation is controlled according to a length of a light emitting time of the EL element. Thus, it is unnecessary to parallel-process video signals of respective bits so that the first and second latch circuits each may also have one bit. At this time, with respect to the digital video signal, each bit is serially inputted, held in succession in the latch circuit, and written into the pixel.

Also, when the gradation representation is conducted by a time gradation method, the fourth TFT 108 can be used as the canceling TFT in FIG. 1. In this case, it is required that the fourth TFT 108 is turned OFF during a canceling period. Thus, the third gate signal line 104 is controlled by a canceling gate signal line driver circuit. In general, in the case of the gate signal line driver circuit for selecting the gate signal line, it outputs one or plural pulses during one horizontal period. In the case of the canceling gate signal line driver circuit, it is required that the fourth TFT 108 is continuously turned OFF during a canceling period. Thus, a separate driver circuit is used.

Embodiment 4

According to the semiconductor devices described so far, the first to third gate signal lines are controlled by operating the first to third gate signal line driver circuits, respectively. As a merit of such a configuration, there is a point that it is adaptable to various drive methods to some degree because selective timings of the respective gate signal lines can be independently changed. However, an occupying area of the driver circuit on the substrate is increased. Thus, there is a demerit that a peripheral area of a display region becomes larger, that is, it becomes difficult to narrow a frame region.

Figure 11A:
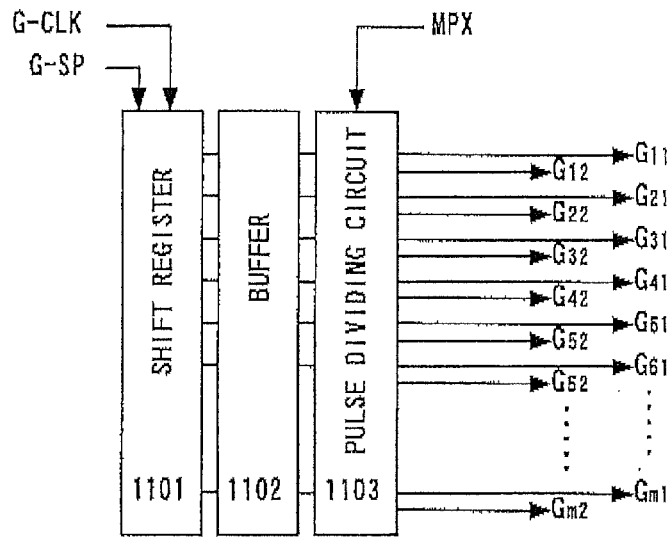
FIGS. 11A and 11B show a configuration example of a gate signal line driver circuit, which is different from the configuration shown in FIG. 8B.
Figure 11B:
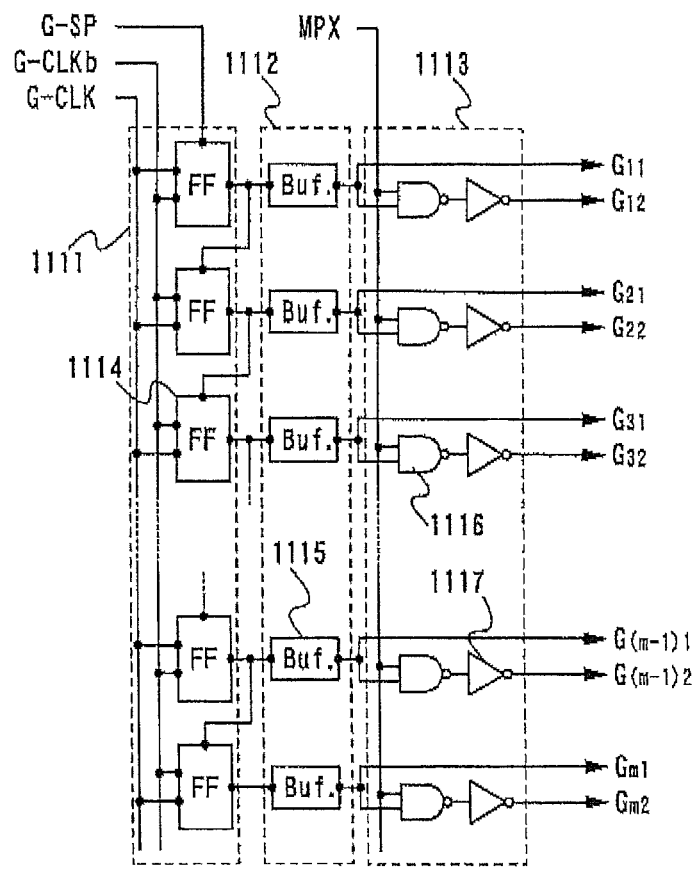

FIG. 11A shows a configuration example for solving such a problem. In FIG. 11A, as in the gate signal line driver circuit used in other embodiments, it has the shift register 1101 and the buffer 1102. In this embodiment, a pulse dividing circuit 1103 is added after the buffer. A detailed configuration is shown in FIG. 11B.

The pulse dividing circuit 1103 is composed of a plurality of NANDs 1116 and a plurality of inverters 1107. The buffer output and a division signal (MPX) inputted from the outside are NANDed so that two gate signal lines can be controlled according to different pulses by a single gate signal line driver circuit. In the case of FIGS. 11A and 11B, the first gate signal line and the second signal line are controlled by the single gate signal line driver circuit.

Figure 12:
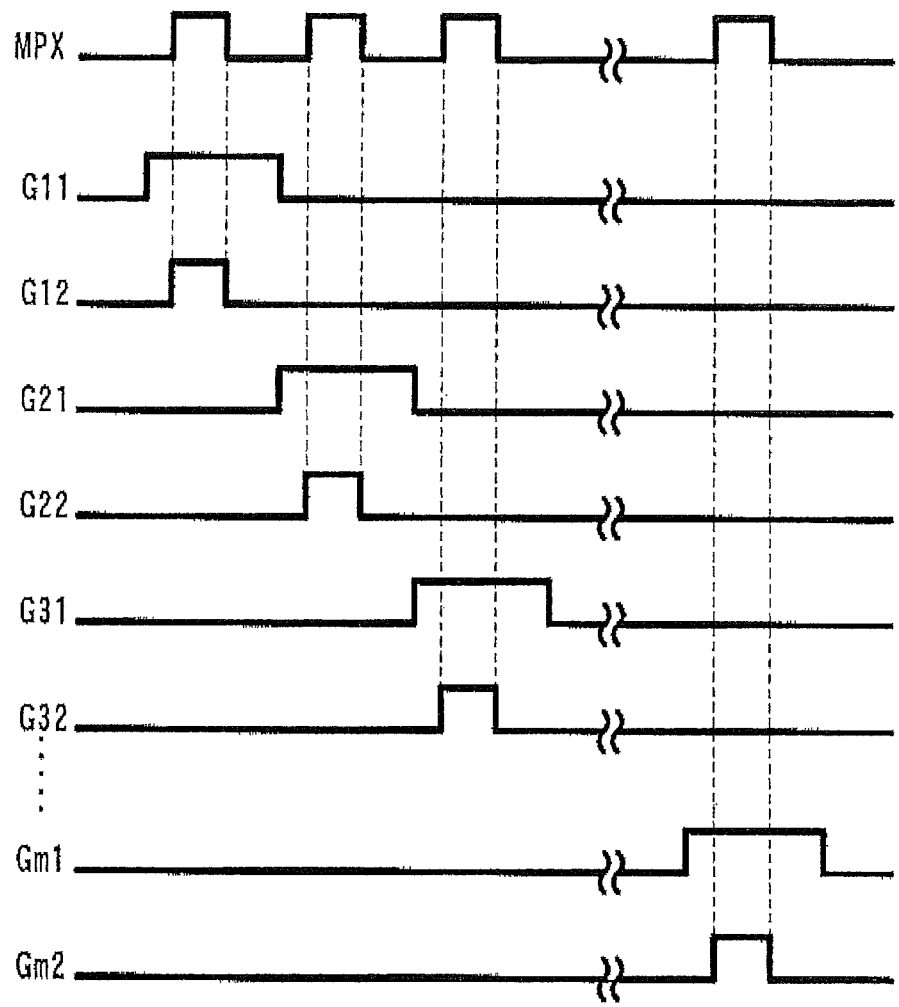
FIG. 12 is an explanatory diagram for pulse output timing of the gate signal line driver circuit shown in FIGS. 11A and 11B.

FIG. 12 shows the division signal (MPX) and timing for selecting the respective gate signal lines. In the respective first gate signal lines $G_{11}, G_{21}, \ldots, G_{m1}$, the buffer output is used as a selective pulse without being processed. On the other hand, when the buffer output is an H level and the division signal is an H level, the output of the NAND becomes an L level and then an H-level is outputted through the inverter. The second gate signal lines $G_{12}, G_{22}, \ldots, G_{m2}$ are selected in accordance with such pulses.

In this embodiment, the example in which the first gate signal line and the second signal line are controlled by the single gate signal line driver circuit is described. When the same method is used, the first to third gate signal lines can be also controlled by a single gate signal line driver circuit.

Embodiment 5

FIGS. 24A and 24B are timing charts for actually driving the semiconductor device of the present invention. FIG. 24A schematically shows timing of operation and FIG. 24B shows timing of pulses inputted to the first to third gate signal lines in FIG. 1A. Here, respective TFTs controlled through the first and second gate signal lines are an N-channel type, and when the potential thereof is an H level, they are turned ON. When the potential thereof is an L level, they are turned OFF. In addition, a TFT controlled through the third gate signal line is a P-channel type, and when the potential thereof is an H level, it is turned OFF. When the potential thereof is an L level, it is turned ON. Of course, the polarity of the TFT is not limited to this.

When it is driven by an analog gradation method, a period indicated by 2400 is one frame period. When it is driven by a digital time gradation method, the period indicated by 2400 is one sub-frame period. In addition, a period indicated by 2402 corresponds to the period shown in FIG. 1B. The timing of operation shown in FIG. 24A also depends on that in FIG. 1B.

Note that period indicated by particularly the sections VI and II in FIG. 1B are not necessarily provided. In other words, the input of the video signal is completed immediately after the TFT 101 is turned OFF, and then the TFT 108 is turned ON. Thus, it may be shifted to a light emitting period. Timing in FIG. 24B depends on such operation.

The pulses inputted to the respective gate signal lines may be generated by respective separate driver circuits. Alternatively, as shown in FIGS. 11A and 11B, another pulse may be generated from a pulse by using the pulse dividing circuit.

Also, a method described in Japanese Patent Application No. 2001-063419 is used and a gate signal line selection period is divided into a plurality of sub-periods, for example, two periods of the first half and the second half. Then, the following may be conducted. During one period, a potential on the source signal line is set to $V_{DD}$ and a threshold value is held in a line (which is set to i-th line). During the other period, the video signal is inputted to the source signal line ($V_{DD}$ $V_{Data}$) and writing of the video signal is conducted in any line except the i-th line. By such operations, a period for which operation for holding a threshold value can be provided to be long so that a margin is provided for circuit operation.

Embodiment 6

In the present invention, it is desirable that the TFT for supplying a current to the EL element at light emission (TFT 106 in FIG. 1A) is operated in a saturation region because a variation in intensity due to deterioration of the EL element is suppressed. When the TFT operates in the saturation region, a change in drain current in the case where a voltage between the gate and the source is somewhat changed can be suppressed. Thus, a gate length L is set long.

In this time, according to the operation in the case where the threshold value is held by the capacitor means, a voltage which exceeds the threshold value of the TFT is applied to the capacitor means once and from this state, it is converged to the threshold voltage. When the gate length L of the TFT is long, a time is required for this operation according to a gate capacitance and the like. Thus, in this embodiment, a configuration in which operation of converging the amount of charge in the capacitor means is conducted at high speed in such a case will be described.

Figure 18A:
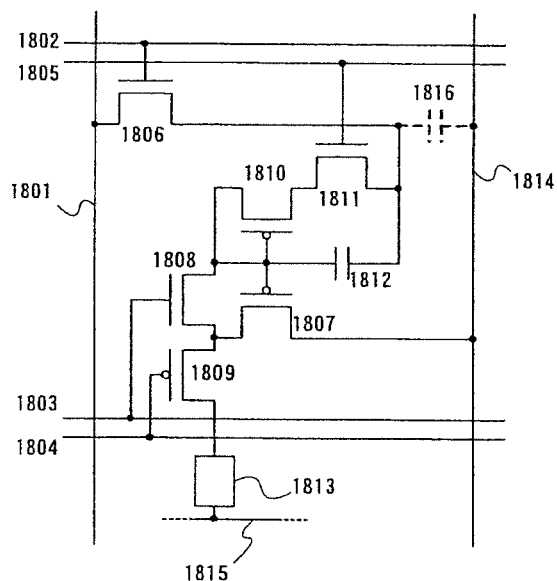
FIGS. 18A and 18B are a diagram showing a pixel configuration of a semiconductor device and a timing chart thereof in accordance with an embodiment of the present invention.

FIG. 18A shows a configuration of a pixel. TFTs 1810 and 1811 and a fourth gate signal line 1805 for controlling the TFT 1811 are added to the pixel shown in FIG. 1A. In addition, as shown by a dotted line in FIG. 18A, capacitor means 1816 may be provided between the second electrode of a first TFT 1806 and a current supply line 1814 to use it as a capacitor for holding a video signal.

Figure 18B:
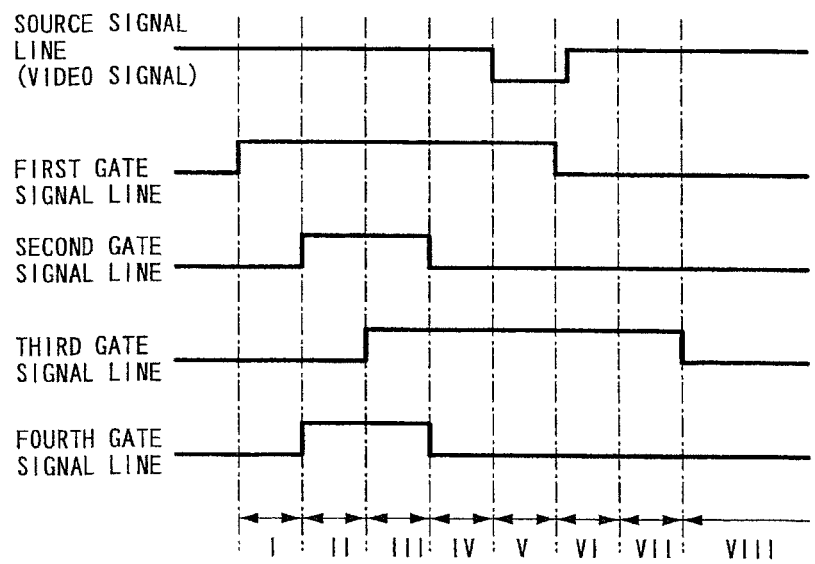

The operation will be described using FIG. 18B and FIGS. 19A to 19F. FIG. 18B shows timing of a video signal and pulses which are inputted to a source signal line 1801 and first to fourth gate signal lines 1802 to 1805, and timing is divided into sections of I to VIII according to the respective operations shown in FIGS. 19A to 19F. In this embodiment, a structure is adopted in which the operation is conducted until the threshold voltage is held by the capacitor means at high speed. Thus, writing of a video signal and light emitting operation are conducted as described in the embodiment mode. Thus, only charging and holding operations of the capacitor means will be described here.

Figure 19A:
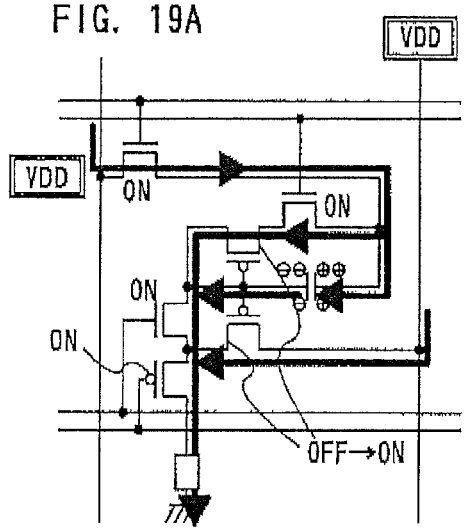
FIGS. 19A to 19F are explanatory diagrams for driving of the pixel shown in FIG. 18A.

First, the first gate signal line 1802 becomes an H level so that the TFT 1806 is turned ON (section I). Subsequently, the second gate signal line 1803 and the fourth gate signal line 1805 each become an H level and the third gate signal line 1804 becomes an L level so that TFTs 1808, 1809, and 1811 are turned ON. Here, as shown in FIG. 19A, capacitor means 1812 is charged. Then, when a voltage held by the capacitor means 1812 exceeds threshold values ($V_{th}$) of TFTs 1807 and 1810, the TFTs 1807 and 1810 are turned ON (section II).

Figure 19B:
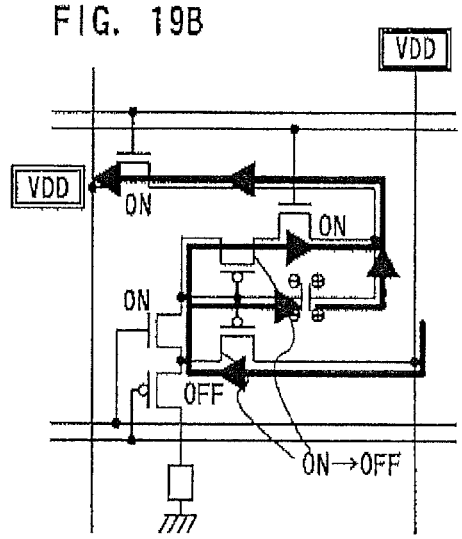
Figure 19C:
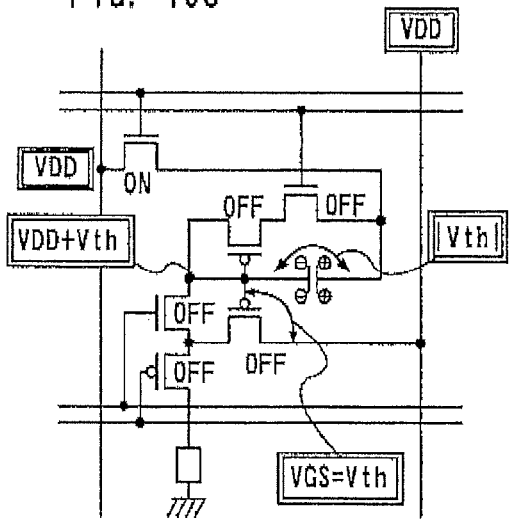
Figure 19D:
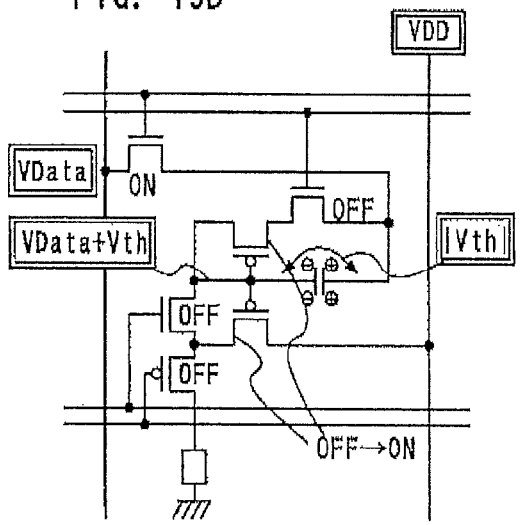
Figure 19E:
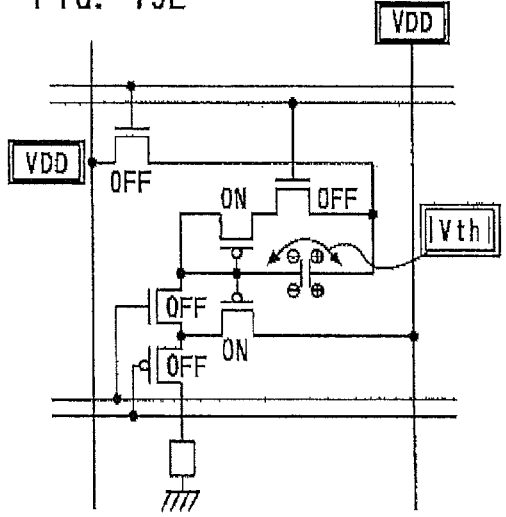
Figure 19F:
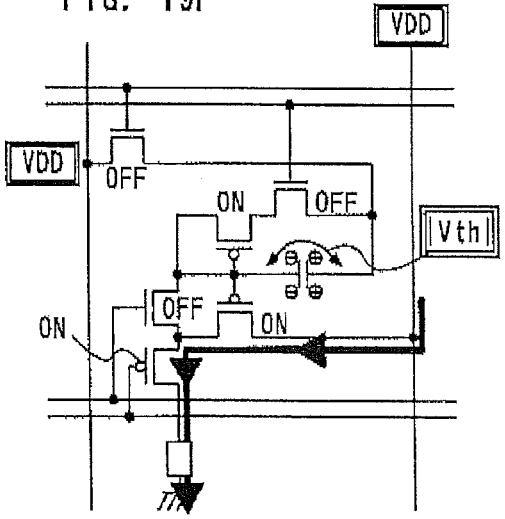

Subsequently, as shown in FIG. 19B, the third gate signal line 1804 becomes an H level so that the TFT 1809 is turned OFF. Then, charges stored in the capacitor means 1812 move again, and soon a voltage held by the capacitor means 1812 becomes equal to $V_{th}$. In other words, a voltage between the gate and the source of each of the TFTs 1807 and 1810 becomes equal to $V_{th}$ so that the TFTs 1807 and 1810 are turned OFF (section III).

Hereinafter, writing of the video signal and light emission are conducted according to the embodiment mode. Here, with respect to the newly added TFT 1810, the gate electrode is connected with that of the TFT 1807 for supplying a current to an EL element 1813 at light emission. As shown in FIGS. 19A and 19B, the number of paths through which charges move is larger than that in the embodiment mode and the TFT 1810 does not have a function for supplying a current to the EL element 1813. Thus, the gate length L may be set short and the channel width W may be set wide so that the amount of current can be increased. Therefore, the movement of charge is smoothly conducted because the gate capacitance is small. Accordingly, a time until a voltage held by the capacitor means is converged to $V_{th}$ can be further shortened.

As is apparent from the timing chart shown in FIG. 18B, the second gate signal line 1803 and the fourth gate signal line 1805 each become an H level or an L level at the same timing. Thus, the TFTs controlled through these gate signal lines, that is, the TFTs 1808 and 1811 may be controlled using the same gate signal line. When such control is conducted, an increase in the number of gate signal lines required for controlling a pixel can be suppressed.

Note that the TFT 1811 shown in FIG. 18A is located between the second electrode of the TFT 1806 and the first electrode of the TFT 1810. It may be located between the second electrode of the TFT 1810 and the first electrode of the TFT 1808 or between the gate electrode of the TFT 1810 and the first electrode of the TFT 1808.

Also, according to the configuration of this embodiment, it is required that the TFTs 1807 and 1810 are made to have the same polarity. With respect to the other TFTs, no limitation is particularly provided.

Note that this embodiment can be also embodied by being combined with another embodiment.

Embodiment 7

In any case of the pixels shown in FIGS. 1A, 15, and 18A, a current flows into the EL element during charging of the capacitor means. Thus, the EL element emits light during a period except a light emitting period. The light emitting period is extremely short so that an image quality is not greatly influenced thereby. However, the EL element itself becomes a load during charging of the capacitor means so that a time is required for charging. In this embodiment, a configuration in which, a current does not flow into the EL element at charging of the capacitor means will be described.

Figure 20A:
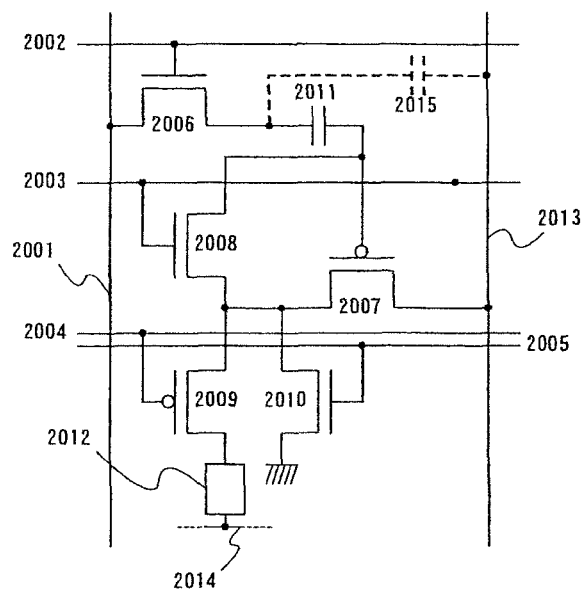
FIGS. 20A and 20B show a pixel configuration of a semiconductor device and operation thereof in accordance with an embodiment of the present invention.

FIG. 20A shows a configuration of a pixel. A TFT 2010 is added to the pixel shown in FIG. 1A. The gate electrode of the TFT 2010 is connected with a fourth gate signal line 2005, the first electrode thereof is connected with the first electrode of a TFT 2009, the second electrode of a TFT 2007, and the first electrode of a TFT 2008, and the second electrode thereof is provided with a predetermined potential so that there is a potential difference between the second electrode and a current supply line 2013. Here, the second electrode of a TFT 2009 preferably has a potential with a potential difference relative to the current supply line 2013. Thus, it may be connected with the gate signal line of another line. In other words, in this case, it is preferably utilized that a gate signal line which is not in a selection state becomes a predetermined potential. In addition, as shown by a dotted line in FIG. 20A, capacitor means 2015 may be provided between the second electrode of the first TFT 2006 and the current supply line 2013 to use it as a capacitor for holding a video signal.

Figure 20B:
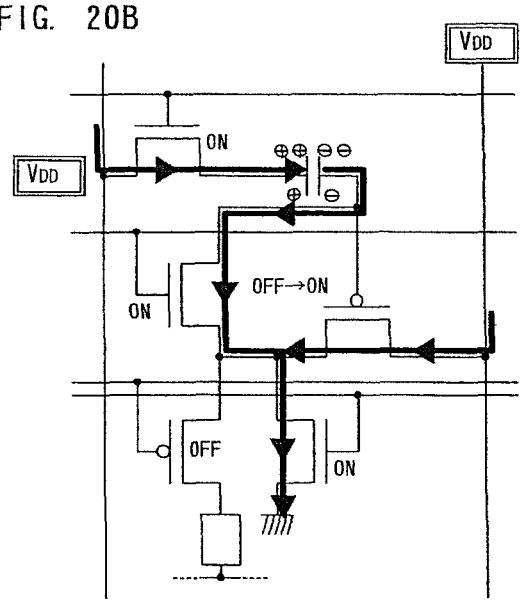

In charging of capacitor means 2011, the TFTs 2006, 2007, 2008, and 2010 are turned ON so that the operation is conducted as shown in FIG. 20B. The TFT 2009 is turned OFF so that a current does not flow into the EL element 2012 and there is no light emission. Even in this case, a path through the newly added TFT 2010 exists. Thus, the capacitor means 2011 is charged.

In this embodiment, the TFT 2009 is made to have the same polarity as the TFT 2007 but the configuration is not limited to this. Of course, they may be made to have a P-channel type. Note that, when an aperture ratio of a pixel and the like are considered, it is desirable that the number of signal lines is minimized. When this point is considered, the gate signal lines 2002 and 2004 may be made common. Note that, in this time, while the TFT 2006 is turned ON, that is, while holding of the threshold value and writing of the video signal are conducted, the TFT 2009 is turned OFF. Then, when it reaches a light emitting period so that the TFT 2009 is turned ON, it is required that the TFT 2006 is turned OFF. Thus, when the TFTs 2006 and 2009 are controlled through the common gate signal line, the polarities are made opposite to each other.

Note that, as described in this embodiment, the method of preventing a current from flowing into the EL element during a period except the light emitting period can be applied to the other embodiments.

Embodiment 8

In this embodiment, an example in which operation for converging the amount of charge is conducted at high speed using a configuration different from Embodiment 5 will be described.

Figure 21A:
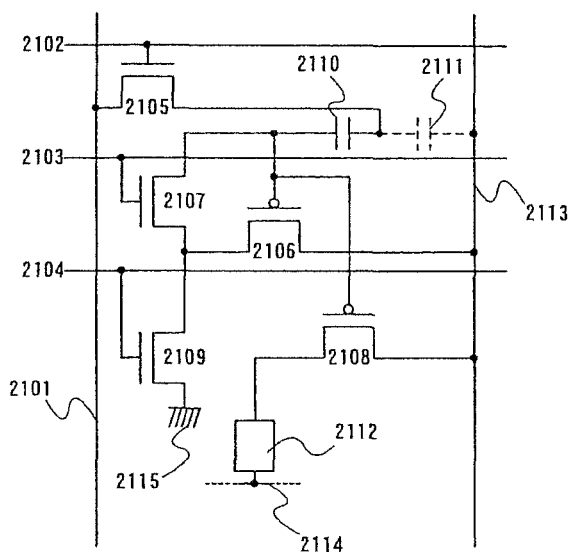
FIGS. 21A to 21C show a pixel configuration of a semiconductor device in accordance with an embodiment of the present invention.

FIG. 21A shows a configuration example. A pixel includes a source signal line 2101, first to third gate signal lines 2102 to 2104, first to fifth TFTs 2105 to 2109, capacitor means 2110, an EL element 2112, a current supply line 2113, and power source lines 2114 and 2115.

The gate electrode of the first TFT 2105 is connected with the first gate signal line 2102, the first electrode thereof is connected with the source signal line 2101, and the second electrode thereof is connected with the first electrode of the capacitor means 2110. The second electrode of the capacitor means 2110 is connected with the gate electrode of the second TFT 2106, the gate electrode of the fourth TFT 2108, and the first electrode of the third TFT 2107. The first electrode of the second TFT 2106 is connected with the current supply line 2113 and the second electrode thereof is connected with the second electrode of the third TFT 2107 and the first electrode of the fifth TFT 2109. The gate electrode of the third TFT 2107 is connected with the second gate signal line 2103. The first electrode of the fourth TFT 2108 is connected with the current supply line 2113 and the second electrode thereof is connected with the first electrode of the EL element 2112. The gate electrode of the fifth TFT 2109 is connected with the third gate signal line 2104, and the second electrode thereof is provided with a predetermined potential through the power source line 2115 so that there is a potential difference between the second electrode and the current supply line 2113. The second electrode of the EL element 2112 is provided with a predetermined potential through the power source line 2114 so that there is a potential difference between the second electrode and the current supply line 2113. In addition, as shown by a dotted line in FIG. 21A, capacitor means 2111 may be provided between the second electrode of the first TFT 2105 and the current supply line 2113 to use it as a capacitor for holding a video signal.

The TFT 2108 is a TFT for supplying a current to the EL element 2112 so that it is preferably operated in a saturation region as described above. Thus, a gate length L is set long. However, a time is required for operation for holding a threshold voltage by the capacitor means 2110. Accordingly, the operation for holding the threshold voltage is conducted at high speed by using the TFT 2106. The TFT 2106 is not used for supplying a current to the EL element 2112 so that the gate length L may be set short and the channel width W may be set wide.

Figure 21B:
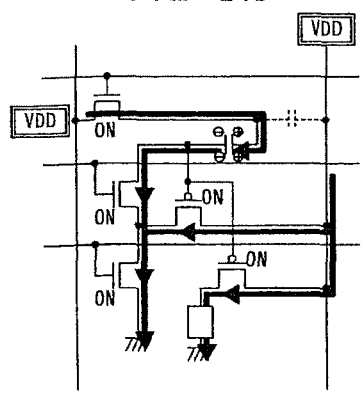

In charging, the TFTs 2105, 2107, and 2109 are turned ON so that a current is produced. When a voltage between both electrodes of the capacitor means 2110 exceeds the threshold values $V_{th}$ of the TFTs 2106 and 2108, the TFTs 2106 and 2108 are turned ON (FIG. 21B). After that, when the TFT 2109 is turned OFF, charges stored in the capacitor means 2110 move and are converged such that the voltage between both electrodes becomes equal to $V_{th}$. With respect to the TFT 2106, the gate length L is set short and the channel width W is set wide so that such operation is speedily conducted.

Figure 21C:
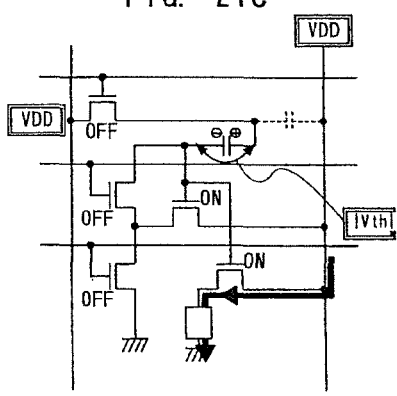

When light is emitted from the pixel, a potential obtained by adding the threshold value held by the capacitor means 2110 to a video signal is supplied to the gate electrodes of the TFTs 2106 and 2108. Thus, as shown in FIG. 21C, a current flows into the EL element 2112 to emit light.

By the above procedure, the operation for holding the threshold value can be conducted at high speed. In the configuration described in this embodiment, the capacitor means 2110 holds the threshold values of the TFTs 2106 and 2108. When variations in threshold values of the TFTs 2106 and 2108 are caused, if the TFT 2108 is not normally turned OFF, the EL element 2112 emits light because only the TFT 2108 is located on a current path to the EL element 2112. Thus, it is desirable that these two TFTs are located so as to prevent a variation in characteristics.

The configuration described in this embodiment can be applied in combination with another embodiment.

Embodiment 9

In a time gradation method or the like, there is the case where particularly a canceling period and the like are provided. Thus, in this embodiment, a configuration in which a canceling TFT is added and the canceling period is provided will be described.

Figure 22A:
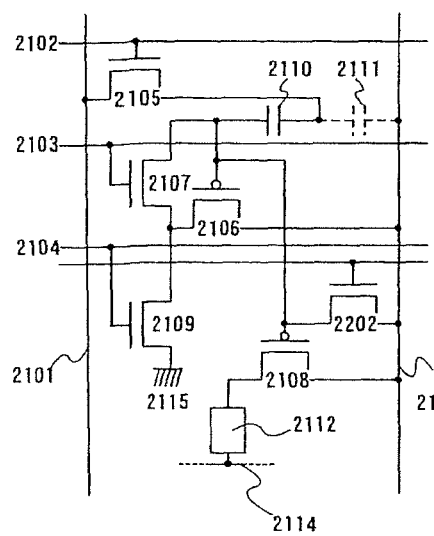
FIGS. 22A to 22C show a pixel configuration of a semiconductor device in accordance with an embodiment of the present invention.
Figure 22B:
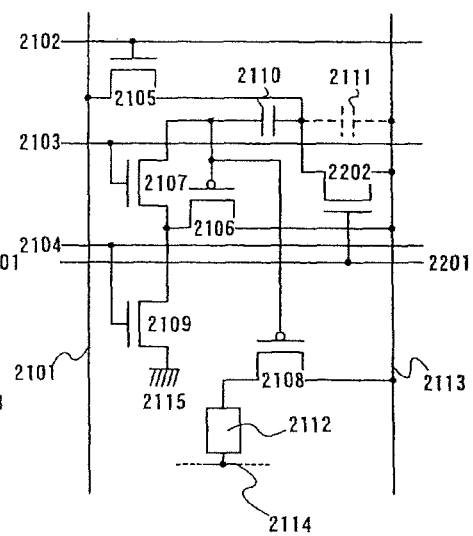
Figure 22C:
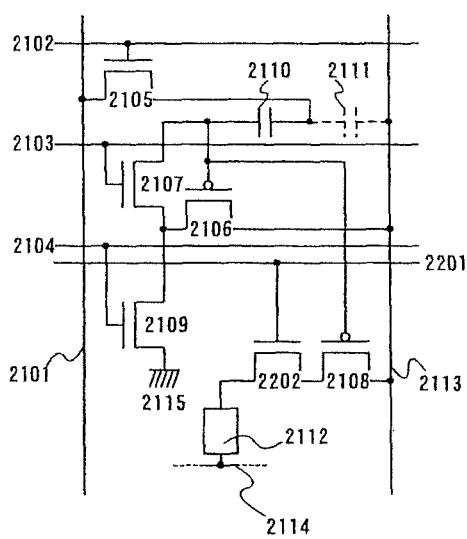

FIGS. 22A to 22C show configuration examples of the canceling TFT. A canceling TFT (sixth TFT) 2202 is controlled through a cancel gate signal line (fourth gate signal line) 2201. In the case of FIG. 22A, the canceling TFT 2202 is located between the gate electrode of a TFT 2108 and a current supply line 2113. When the canceling TFT 2202 is turned ON, a voltage between the gate and the source of the TFT 2108 becomes 0 so that it is turned OFF to stop a current. In the case of FIG. 22B, the canceling TFT 2202 is located between both electrodes of capacitor means 2111 and charges stored in the capacitor means 2111 are released so that the TFT 2108 is turned OFF. In the case of FIG. 22C, a method of directly locating the canceling TFT 2202 among the current supply line 2113, the TFT 2108, and an EL element 2112 to interrupt a current is used. Here, with respect to the location of the canceling TFT 2202, it may be located at any position if a current to the EL element 2112 can be cut off. Specifically, in FIG. 22C, the canceling TFT 2202 is located between the current supply line 2113 and the TFT 2108. It may be located between the TFT 2108 and the EL element 2112.

Embodiment 10

According to a configuration shown in FIG. 23A, a TFT 2306 having a short gate length L and a wide channel width W and a TFT 2308 having a long gate length L are connected in series to produce a current path to an EL element 2312. According to such a method, even if the threshold values of the TFTs 2306 and 2308 are different from each other, when any one of these TFTs is turned OFF with reliability, a current does not flow into the EL element 2312. Further, when the gate length L of the TFT 2308 is made long and it is operated in a saturation region, even if a voltage between the gate and the source is somewhat varied, it can be prevented that a variation in value of a current flowing into the EL element 2312 is caused. In addition, according to the configuration of this embodiment, with respect to holding of the threshold value, the amount of charge is converged at high speed using the TFT 2306 having a short gate length L, and the TFTs 2306 and 2308 are used for a double gate TFT at light emission. This configuration is obtained by applying techniques described in Japanese Patent Application Nos. 2001-290287 and 2001-304643 by the present inventors.

Embodiment 11

In this specification, a substrate in which a driver circuit including a CMOS circuit and a pixel portion having a switching TFT and a driving TFT are formed on the same substrate is called an active matrix substrate as a matter of convenience. In addition, in this embodiment, a process of manufacturing the active matrix substrate will be described using FIGS. 13A to 13D and 14A to 14D.

A quartz substrate, a silicon substrate, a metallic substrate, or a stainless substrate, in which an insulating film is formed on the surface thereof is used as a substrate 5000. In addition, a plastic substrate having a heat resistance, which is resistant to a processing temperature in this manufacturing process may be used. In this embodiment, the substrate 5000 made of glass such as barium borosilicate glass or aluminoborosilicate glass is used.

Next, a base film 5001 made from an insulating film such as a silicon oxide film, a silicon nitride film, or a silicon oxynitride film is formed on the substrate 5000. In this embodiment, a two-layer structure is used for the base film 5001. However, a single layer structure of the insulating film or a structure in which two layers or more of the insulating film are laminated may be used.

In this embodiment, as a first layer of the base film 5001, a silicon oxynitride film 5001a is formed at a thickness of 10 nm to 200 nm (preferably, 50 nm to 100 nm) by a plasma CVD method using $SiH_4$, $NH_3$, and $N_2O$ as reactive gases. In this embodiment, the silicon oxynitride film 5001a is formed at a thickness of 50 nm. Next, as a second layer of the base film 5001, a silicon oxynitride film 5001b is formed at a thickness of 50 nm to 200 nm (preferably, 100 nm to 150 nm) by a plasma CVD method using $SiH_4$ and $N_2O$ as reactive gases. In this embodiment, the silicon oxynitride film 5001b is formed at a thickness of 100 nm.

Subsequently, semiconductor layers 5002 to 5005 are formed on the base film 5001. The semiconductor layers 5002 to 5005 are formed as follows. That is, a semiconductor film is formed at a thickness of 25 nm to 80 nm (preferably, 30 nm to 60 nm) by known means (such as a sputtering method, an LPCVD method, or a plasma CVD method). Next, the semiconductor film is crystallized by a known crystallization method (such as a laser crystallization method, a thermal crystallization method using RTA or a furnace anneal furnace, a thermal crystallization method using a metallic element for promoting crystallization, or the like). Then, the obtained crystalline semiconductor film is patterned in a predetermined shape to form the semiconductor layers 5002 to 5005. Note that an amorphous semiconductor film, a microcrystalline semiconductor film, a crystalline semiconductor film, a compound semiconductor film having an amorphous structure such as an amorphous silicon germanium film, or the like may be used as the semiconductor film.

In this embodiment, an amorphous silicon film having a film thickness of 55 nm is formed by a plasma CVD method. A solution containing nickel is held on the amorphous silicon film and it is dehydrogenated at 500° C. for 1 hour, and then thermal crystallization is conducted at 550° C. for 4 hours to form a crystalline silicon film. After that, patterning processing using a photolithography method is performed to form the semiconductor layers 5002 to 5005.

Note that, when the crystalline semiconductor film is formed by a laser crystallization method, a gas laser or a solid laser, which conducts continuous oscillation or pulse oscillation is preferably used as the laser. An excimer laser, a YAG laser, a $YVO_4$ laser, a YLF laser, a $YAlO_3$ laser, a glass laser, a ruby laser, a Ti:sapphire laser, and the like can be used as the former gas laser. In addition, a laser using a crystal such as YAG, $YVO_4$, YLF or $YAlO_3$, which is doped with Cr, Nd, Er, Ho, Ce, Co, Ti, or Tm can be used as the latter solid laser. The fundamental of the laser is changed according to a doping material and laser light having a fundamental of the neighborhood of 1 µm is obtained. A harmonic to the fundamental can be obtained by using a non-linear optical element. Note that, in order to obtain a crystal having a large grain size at the crystallization of the amorphous semiconductor film, it is preferable that a solid laser capable of conducting continuous oscillation is used and a second harmonic to a fourth harmonic of the fundamental are applied. Typically, a second harmonic (532 nm) or a third harmonic (355 nm) of an Nd:YVO$_4$ laser (fundamental of 1064 nm) is applied.

Also, laser light emitted from the continuous oscillation YVO$_4$ laser having an output of 10 W is converted into a harmonic by a non-linear optical element. Further, there is a method of locating a YVO$_4$ crystal and a non-linear optical element in a resonator and emitting a harmonic. Preferably, laser light having a rectangular shape or an elliptical shape is formed on an irradiation surface by an optical system and irradiated to an object to be processed. At this time, an energy density of about 0.01 MW/cm$^2$ to 100 MW/cm$^2$ (preferably, 0.1 MW/cm$^2$ to 10 MW/cm$^2$) is required. The semiconductor film is moved relatively to the laser light at a speed of about 10 cm/s to 2000 cm/s to be irradiated with the laser light.

Also, when the above laser is used, it is preferable that a laser beam emitted from a laser oscillator is linearly condensed by an optical system and irradiated to the semiconductor film. A crystallization condition is set as appropriate. When an excimer laser is used, it is preferable that a pulse oscillation frequency is set to 300 Hz and a laser energy density is set to 100 mJ/cm$^2$ to 700 mJ/cm$^2$ (typically, 200 mJ/cm$^2$ to 300 mJ/cm$^2$). In addition, when a YAG laser is used, it is preferable that the second harmonic is used, a pulse oscillation frequency is set to 1 Hz to 300 Hz, and a laser energy density is set to 300 mJ/cm$^2$ to 1000 mJ/cm$^2$ (typically, 350 mJ/cm$^2$ to 500 mJ/cm$^2$). A laser beam linearly condensed at a width of 100 µm to 1000 µm (preferably, 400 µm) is irradiated over the entire surface of the substrate. At this time, an overlap ratio with respect to the linear beam may be set to 50% to 98%.

However, in this embodiment, the amorphous silicon film is crystallized using a metallic element for promoting crystallization so that the metallic element remains in the crystalline silicon film. Thus, an amorphous silicon film having a thickness of 50 nm to 100 nm is formed on the crystalline silicon film, heat treatment (thermal anneal using an RTA method or a furnace anneal furnace) is conducted to diffuse the metallic element into the amorphous silicon film, and the amorphous silicon film is removed by etching after the heat treatment. As a result, the metallic element contained in the crystalline silicon film can be reduced or removed.

Note that, after the formation of the semiconductor layers 5002 to 5005, doping with a trace impurity element (boron or phosphorus) may be conducted in order to control a threshold value of a TFT.

Next, a gate insulating film 5006 covering the semiconductor layers 5002 to 5005 is formed. The gate insulating film 5006 is formed from an insulating film containing silicon at a film thickness of 40 nm to 150 nm by a plasma CVD method or a sputtering method. In this embodiment, a silicon oxynitride film is formed as the gate insulating film 5006 at a thickness of 115 nm by the plasma CVD method. Of course, the gate insulating film 5006 is not limited to the silicon oxynitride film. Another insulating film containing silicon may be used as a single layer or a laminate structure.

Note that, when a silicon oxide film is used as the gate insulating film 5006, a plasma CVD method is employed, TEOS (tetraethyl orthosilicate) and O$_2$ are mixed, a reactive pressure is set to 40 Pa, and a substrate temperature is set to 300° C. to 400° C. Then, discharge may occur at a high frequency (13.56 MHz) power density of 0.5 W/cm$^2$ to 0.8 W/cm$^2$ to form the silicon oxide film. After that, when thermal anneal is conducted for the silicon oxide film formed by the above steps at 400° C. to 500° C., a preferable property as to the gate insulating film 5006 can be obtained.

Figure 13A:
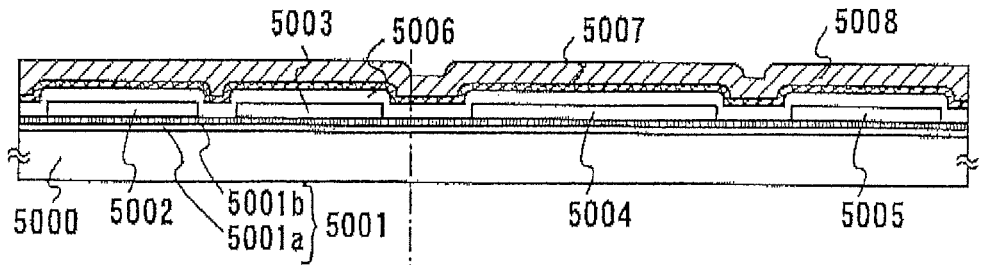
FIGS. 13A to 13D show step examples of manufacturing a semiconductor device.

Next, a first conductive film 5007 having a film thickness of 20 nm to 100 nm and a second conductive film 5008 having a film thickness of 100 nm to 400 nm are laminated on the gate insulating film 5006. In this embodiment, the first conductive film 5007 which has the film thickness of 30 nm and is made from a TaN film and the second conductive film 5008 which has the film thickness of 370 nm and is made from a W film are laminated (FIG. 13A).

In this embodiment, the TaN film as the first conductive film 5007 is formed by a sputtering method using Ta as a target in an atmosphere containing nitrogen. The W film as the second conductive film 5008 is formed by a sputtering method using W as a target. In addition, it can be formed by a thermal CVD method using tungsten hexafluoride (WF$_6$). In any case, when they are used for a gate electrode, it is necessary to reduce a resistance, and it is desirable that a resistivity of the W film is set to 20 µΩ cm or lower. When a crystal grain is enlarged, the resistivity of the W film can be reduced. However, if a large number of impurity elements such as oxygen exist in the W film, the crystallization is suppressed so that the resistance is increased. Therefore, in this embodiment, the W film is formed by a sputtering method using high purity W (purity of 99.9999%) as a target while taking into a consideration that an impurity does not enter the film from a gas phase at film formation. Thus, a resistivity of 9 µΩ cm to 20 µΩ cm can be realized.

Note that, in this embodiment, the TaN film is used as the first conductive film 5007 and the W film is used as the second conductive film 5008. However, materials which compose the first conductive film 5007 and the second conductive film 5008 are not particularly limited. The first conductive film 5007 and the second conductive film 5008 each may be formed from an element selected from Ta, W, Ti, Mo, Al, Cu, Cr, and Nd, or an alloy material or a compound material, which contains mainly the above element. In addition, they may be formed from a semiconductor film which is represented by a polycrystalline silicon film doped with an impurity element such as phosphorus, or an AgPdCu alloy.

Figure 13B:
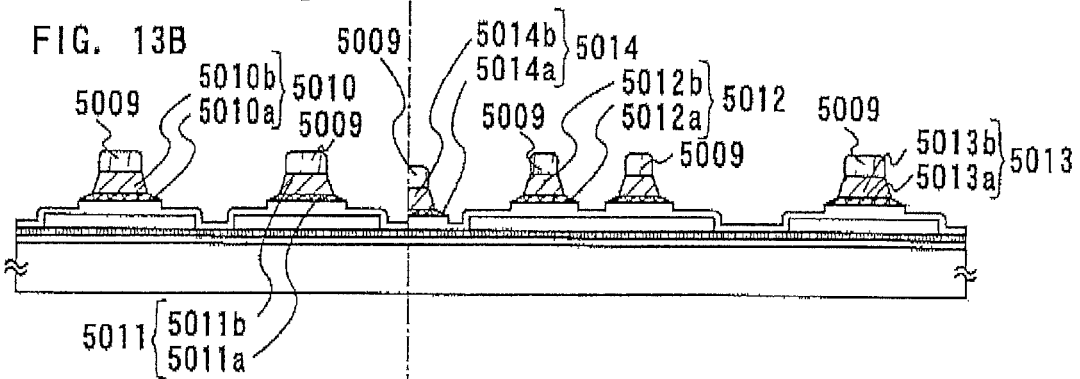

Next, a mask 5009 made of a resist is formed by using a photolithography method and first etching processing for forming electrodes and wirings is performed. The first etching processing is performed under a first etching condition and a second etching condition (FIG. 13B).

In this embodiment, as the first etching condition, an ICP (inductively coupled plasma) etching method is used. In addition, CF$_4$, Cl$_2$, and O$_2$ are used as etching gases and a ratio of respective gas flow rates is set to 25:25:10 (sccm). RF power having 500 W and 13.56 MHz is supplied to a coil type electrode at a pressure of 1.0 Pa to produce plasma, thereby conducting etching. RF power having 150 W and 13.56 MHz is supplied to a substrate side (sample stage) to apply a substantially negative self bias voltage thereto. The W film is etched under this first etching condition so that end portions of the first conductive layer 5007 are made to have taper shapes.

Subsequently, the etching condition is changed to the second etching condition without removing the mask 5009 made of a resist. CF$_4$ and Cl$_2$ are used as etching gases and a ratio of respective gas flow rates is set to 30:30 (sccm). RF power having 500 W and 13.56 MHz is supplied to a coil type electrode at a pressure of 1.0 Pa to produce plasma, thereby conducting etching for about 15 seconds. RF power having 20

W and 13.56 MHz is supplied to a substrate side (sample stage) to apply a substantially negative self bias voltage thereto. In the second etching condition, both the first conductive film 5007 and the second conductive film 5008 are etched to the same degree. Note that, in order to conduct etching without leaving the residue on the gate insulating film 5006, it is preferable that an etching time is increased at a rate of about 10 to 20%.

In the above first etching processing, when a shape of the mask made of a resist is made suitable, the end portions of the first conductive film 5007 and the end portions of the second conductive film 5008 become taper shapes by an effect of the bias voltage applied to the substrate side. Thus, first-shaped conductive layers 5010 to 5014 made from the first conductive layer 5007 and the second conductive layer 5008 are formed by the first etching processing. With respect to the insulating film 5006, regions which are not covered with the first-shaped conductive layers 5010 to 5014 are etched by about 20 nm to 50 nm so that thinner regions are formed.

Figure 13C:
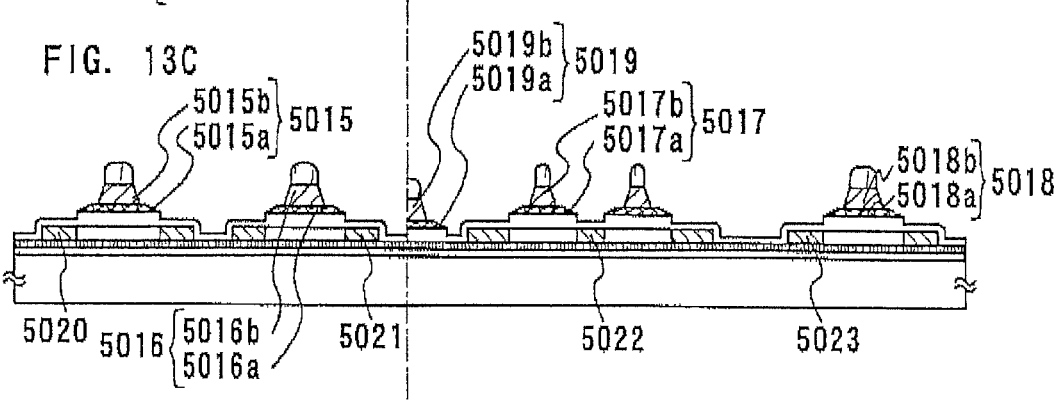

Next, second etching processing is performed without removing the mask 5009 made of a resist (FIG. 13C). In the second etching processing, $SF_6$, $Cl_2$, and $O_2$ are used as etching gases and a ratio of respective gas flow rates is set to 24:12:24 (sccm). RF power having 700 W and 13.56 MHz is supplied to a coil type electrode at a pressure of 1.3 Pa to produce plasma, thereby conducting etching for about 25 seconds. RF power having 10 W and 13.56 MHz is supplied to a substrate side (sample stage) to apply a substantially negative self bias voltage thereto. Thus, the W film is selectively etched to form second-shaped conductive layers 5015 to 5019. At this time, first conductive layers 5015a to 5018a are hardly etched.

Then, first doping processing is performed without removing the mask 5009 made of a resist to add an impurity element for providing an N-type to the semiconductor layers 5002 to 5005 at a low concentration. The first doping processing is preferably performed by an ion doping method or an ion implantation method. With respect to a condition of the ion doping method, a dose is set to $1\times10^{13}$ atoms/cm$^2$ to $5\times10^{14}$ atoms/cm$^2$ and an accelerating voltage is set to 40 keV to 80 keV. In this embodiment, a dose is set to $5.0\times10^{13}$ atoms/cm$^2$ and an accelerating voltage is set to 50 keV. As the impurity element for providing an N-type, an element which belongs to Group 15 is preferably used, and typically, phosphorus (P) or arsenic (As) is used. In this embodiment, phosphorus (P) is used. In this case, the second-shaped conductive layers 5015 to 5019 become masks to the impurity element for providing an N-type. Thus, first impurity regions (N$^{--}$ regions) 5020 to 5023 are formed in a self alignment. Then, the impurity element for providing an N-type is added to the first impurity regions 5020 to 5023 at a concentration range of $1\times10^{18}$ atoms/cm$^3$ to $1\times10^{20}$ atoms/cm$^3$.

Subsequently, after the mask 5009 made of a resist is removed, a new mask 5024 made of a resist is formed and second doping processing is performed at a higher accelerating voltage than that in the first doping processing. In a condition of an ion doping method, a dose is set to $1\times10^{13}$ atoms/cm$^2$ to $3\times10^{15}$ atoms/cm$^2$ and an accelerating voltage is set to 60 keV to 120 keV. In this embodiment, a dose is set to $3.0\times10^{15}$ atoms/cm$^2$ and an accelerating voltage is set to 65 keV. In the second doping processing, second conductive layers 5015b to 5018b are used as masks to an impurity element and doping is conducted such that the impurity element is added to the semiconductor layers located under the taper portions of the first conductive layers 5015a to 5018a.

Figure 13D:
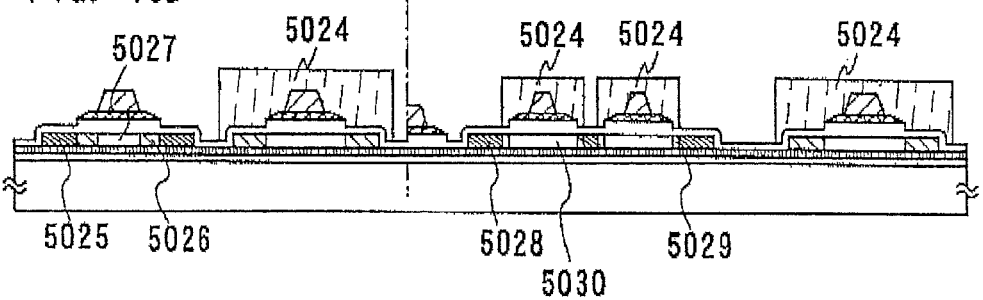

As a result of the above second doping processing, the impurity element for providing an N-type is added to second impurity regions (N$^-$ regions; Lov regions) 5026 overlapped with the first conductive layers at a concentration range of $1\times10^{18}$ atoms/cm$^3$ to $5\times10^{19}$ atoms/cm$^3$. In addition, the impurity element for providing an N-type is added to third impurity regions (N$^+$ regions) 5025 and 5028 at a concentration range of $1\times10^{19}$ atoms/cm$^3$ to $5\times10^{21}$ atoms/cm$^3$. After the first and second doping processings, regions to which no impurity element is added or regions to which the trace impurity element is added are formed in the semiconductor layers 5002 to 5005. In this embodiment, the regions to which the impurity element is not completely added or the regions to which the trace impurity element is added are called channel regions 5027 and 5030. In addition, there are, of the first impurity regions (N$^{--}$ regions) 5020 to 5023 formed by the above first doping processing, regions covered with the resist 5024 in the second doping processing. In this embodiment, they are continuously called first impurity regions (N$^{--}$ regions; LDD regions) 5029 (FIG. 13D).

Note that, in this embodiment, the second impurity regions (N$^-$ regions) 5026 and the third impurity regions (N$^+$ regions) 5025 and 5028 are formed by only the second doping processing. However, the present invention is not limited to this. A condition for doping processing may be changed as appropriate and doping processing may be performed plural times to form those regions.

Figure 14A:
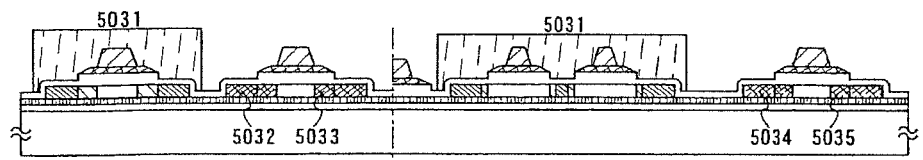
FIGS. 14A to 14D show step examples of manufacturing the semiconductor device.

Next, as shown in FIG. 14A, after the mask 5024 made of a resist is removed, a new mask 5031 made of a resist is formed. After that, third doping processing is performed. By the third doping processing, fourth impurity regions (P$^+$ regions) 5032 and 5034 and fifth impurity regions (P$^-$ regions) 5033 and 5035 to which an impurity element for providing a conductivity type reverse to the above first conductivity type is added are formed in the semiconductor layers as active layers of P-channel TFTs.

In the third doping processing, the second conductive layers 5016b and 5018b are used as masks to the impurity element. Thus, the impurity element for providing a P-type is added to form the fourth impurity regions (P+ regions) 5032 and 5034 and the fifth impurity regions (P regions) 5033 and 5035 in a self alignment.

In this embodiment, the fourth impurity regions 5032 and 5034 and the fifth impurity regions 5033 and 5035 are formed by an ion doping method using diborane ($B_2H_6$). In a condition of the ion doping method, a dose is set to $1\times10^{16}$ atoms/cm$^2$ and an accelerating voltage is set to 80 keV.

Note that, in the third doping processing, the semiconductor layers composing N-channel TFTs are covered with the masks 5031 made of a resist.

Here, by the first and second doping processings, phosphorus is added to the fourth impurity regions (P$^+$ regions) 5032 and 5034 and the fifth impurity regions (P$^-$ regions) 5033 and 5035 at different concentrations. In the third doping processing, doping processing is conducted such that a concentration of the impurity element for providing a P-type is $1\times10^{19}$ atoms/cm$^3$ to $5\times10^{21}$ atoms/cm$^3$ in any region of the fourth impurity regions (P$^+$ regions) 5032 and 5034 and the fifth impurity regions (P$^-$ regions) 5033 and 5035. Thus, the fourth impurity regions (P$^+$ regions) 5032 and 5034 and the fifth impurity regions (P− regions) 5033 and 5035 serve as the source regions and the drain regions of the P− channel TFTs without causing a problem.

Note that, in this embodiment, the fourth impurity regions (P+ regions) 5032 and 5034 and the fifth impurity regions (P$^-$ regions) 5033 and 5035 are formed by only the third doping processing. However, the present invention is not limited to this. A condition for doping processing may be changed as appropriate and doping processing may be performed plural times to form those regions.

Figure 14B:
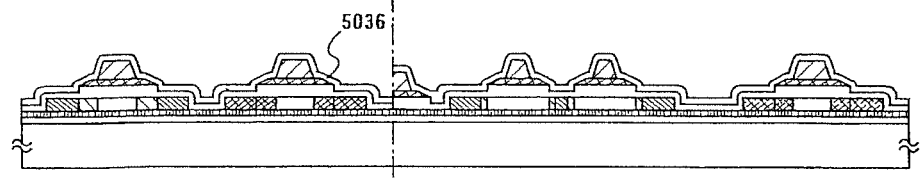

Next, as shown in FIG. 14B, the mask 5031 made of a resist is removed and a first interlayer insulating film 5036 is formed. An insulating film containing silicon is formed as the first interlayer insulating film 5036 at a thickness of 100 nm to 200 nm by a plasma CVD method or a sputtering method. In this to embodiment, a silicon oxynitride film is formed at a film thickness of 100 nm by a plasma CVD method. Of course, the first interlayer insulating film 5036 is not limited to the silicon oxynitride film, and therefore another insulating film containing silicon may be used as a single layer or a laminate structure.

Figure 14C:
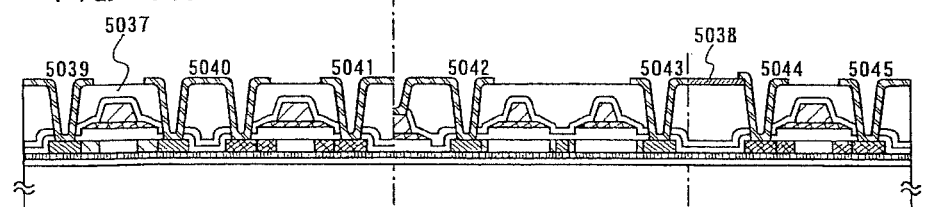

Next, as shown in FIG. 14C, heat treatment is performed for the recovery of crystallinity of the semiconductor layers and the activation of the impurity element added to the semiconductor layers. This heat treatment is performed by a thermal anneal method using a furnace anneal furnace. The thermal anneal method is preferably conducted in a nitrogen atmosphere in which an oxygen concentration is 1 ppm or less, preferably, 0.1 ppm or less at 400° C. to 700° C. In this embodiment, the heat treatment at 410° C. for 1 hour is performed for the activation processing. Note that a laser anneal method or a rapid thermal anneal method (RTA method) can be applied in addition to the thermal anneal method.

Also, the heat treatment may be performed before the formation of the first interlayer insulating film 5036. However, if materials which compose the first conductive layers 5015a to 5019a and the second conductive layers 5015b to 5019b are sensitive to heat, it is preferable that heat treatment is performed after the first interlayer insulating film 5036 (insulating film containing mainly silicon, for example, silicon nitride film) for protecting a wiring and the like is formed as in this embodiment.

As described above, when the heat treatment is performed after the formation of the first interlayer insulating film 5036 (insulating film containing mainly silicon, for example, silicon nitride film), the hydrogenation of the semiconductor layer can be also conducted simultaneously with the activation processing. In the hydrogenation step, a dangling bond of the semiconductor layer is terminated by hydrogen contained in the first interlayer insulating film 5036.

Note that heat treatment for hydrogenation which is different from the heat treatment for activation processing may be performed.

Here, the semiconductor layer can be hydrogenated regardless of the presence or absence of the first interlayer insulating, film 5036. As another means for hydrogenation, means for using hydrogen excited by plasma (plasma hydrogenation) or means for performing heat treatment in an atmosphere containing hydrogen of 3% to 100% at 300° C. to 450° C. for 1 hour to 12 hours may be used.

Next, a second interlayer insulating film 5037 is formed on the first interlayer insulating film 5036. An inorganic insulating film can be used as the second interlayer insulating film 5037. For example, a silicon oxide film formed by a CVD method, a silicon oxide film applied by an SOG (spin on glass) method, or the like can be used. In addition, an organic insulating film can be used as the second interlayer insulating film 5037. For example, a film made of polyimide, polyamide, BCB (benzocyclobutene), acrylic, or the like can be used. Further, a laminate structure of an acrylic film and a silicon oxide film may be used.

In this embodiment, an acrylic film having a film thickness of 1.6 µm is formed. When the second interlayer insulating film 5037 is formed, unevenness caused by TFTs formed on the substrate 5000 is reduced and the surface can be leveled. In particular, the second interlayer insulating film 5037 has a strong sense of leveling. Thus, a film having superior evenness is preferable.

Next, using dry etching or wet etching, the second interlayer insulating film 5037, the first interlayer insulating film 5036, and the gate insulating film 5006 are etched to form contact holes which reach the third impurity regions 5025 and 5028 and the fourth impurity regions 5032 and 5034.

Next, a pixel electrode 5038 made from a transparent conductive film is formed. A compound of indium oxide and tin oxide (indium tin oxide: ITO), a compound of indium oxide and zinc oxide, zinc oxide, tin oxide, indium oxide, or the like can be used for the transparent conductive film. In addition, the transparent conductive film to which gallium is added may be used. The pixel electrode corresponds to the anode of an EL element.

In this embodiment, an ITO film is formed at a thickness of 110 nm and then patterned to form the pixel electrode 5038.

Next, wirings 5039 to 5045 electrically connected with the respective impurity regions are formed. Note that, in this embodiment, a Ti film having a film thickness of 100 nm, an Al film having a film thickness of 350 nm, and a Ti film having a film thickness of 100 nm are formed into a laminate in succession by a sputtering method and a resultant laminate film is patterned in a predetermined shape so that the wirings 5039 to 5045 are formed.

Of course, they are not limited to a three-layer structure. A single layer structure, a two-layer structure, or a laminate structure composed of four layers or more may be used. Materials of the wirings are not limited to Al and Ti, and therefore other conductive films may be used. For example, an Al film or a Cu film is formed on a TaN film, a Ti film is formed thereon, and then a resultant laminate film is patterned to form the wirings.

Thus, one of the source and the drain of an N-channel TFT in a pixel portion is electrically connected with a source signal line (laminate of 5019a and 5019b) through the wiring 5042 and the other is electrically connected with the gate electrode of a P-channel TFT in the pixel portion through the wiring 5043.

In addition, one of the source and the drain of the P-channel TFT in the pixel portion is electrically connected with a pixel electrode 5047 through the wiring 5044. Here, a portion on the pixel electrode 5047 and a portion of the wiring 5044 are overlapped with each other so that electrical connection between the wiring 5044 and the pixel electrode 5047 is produced.

Figure 14D:
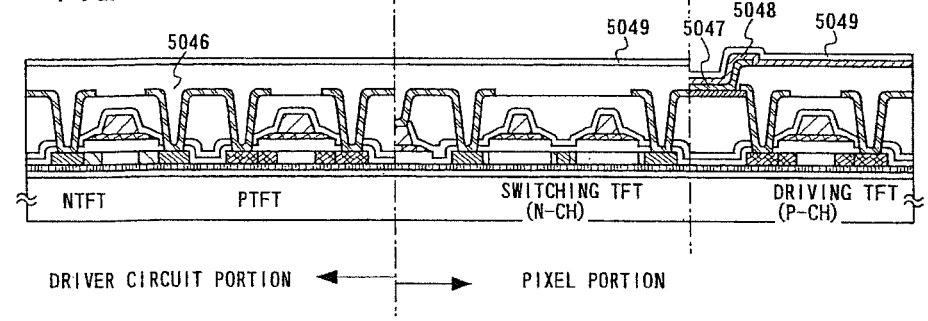

By the above steps, as shown in FIG. 14D, the driver circuit portion including the CMOS circuit composed of the N-channel TFT and the P-channel TFT and the pixel portion including the switching TFT and the driving TFT can be formed on the same substrate.

The N-channel TFT in the driver circuit portion includes low concentration impurity regions 5026 (Lov regions) overlapped with the first conductive layer 5015a composing a portion of the gate electrode and high concentration impurity regions 5025 which each serve as the source region or the drain region. The P-channel TFT which is connected with the N-channel TFT through the wiring 5040 and composes the CMOS circuit includes low concentration impurity regions 5033 (Lov regions) overlapped with the first conductive layer 5016a composing a portion of the gate electrode and high concentration impurity regions 5032 which each serve as the source region or the drain region.

The N-channel switching TFT in the pixel portion includes low concentration impurity regions 5029 (Loff regions) formed outside the gate electrode and high concentration impurity regions 5028 which each serve as the source region or the drain region. In addition, the P-channel driving TFT in the pixel portion includes low concentration impurity regions 5035 (Lov regions) overlapped with the first conductive layer 5018a composing a portion of the gate electrode and high concentration impurity regions 5034 which each serve as the source region or the drain region.

Next, a third interlayer insulating film 5046 is formed. An inorganic insulating film or an organic insulating film can be used as the third interlayer insulating film. A silicon oxide film formed by a CVD method, a silicon oxide film applied by an SOG (spin on glass) method, or the like can be used as the inorganic insulating film. In addition, an acrylic resin film or the like can be used as the organic insulating film.

Examples of a combination of the second interlayer insulating film 5037 and the third interlayer insulating film 5046 will be described below.

There is a combination in which a silicon oxide film formed by a plasma CVD method is used as the second interlayer insulating film 5037 and a silicon oxide film formed by a plasma CVD method is used as the third interlayer insulating film 5046. In addition, there is a combination in which a silicon oxide film formed by an SOG method is used as the second interlayer insulating film 5037 and a silicon oxide film formed by an SOG method is used as the third interlayer insulating film 5046. In addition, there is a combination in which a laminate film of a silicon oxide film formed by an SOG method and a silicon oxide film formed by a plasma CVD method is used as the second interlayer insulating film 5037 and a silicon oxide film formed by a plasma CVD method is used as the third interlayer insulating film 5046. In addition, there is a combination in which acrylic is used for the second interlayer insulating film 5037 and acrylic is used for the third interlayer insulating film 5046. In addition, there is a combination in which a laminate film of an acrylic film and a silicon oxide film formed by a plasma CVD method is used as the second interlayer insulating film 5037 and a silicon oxide film formed by a plasma CVD method is used as the third interlayer insulating film 5046. In addition, there is a combination in which a silicon oxide film formed by a plasma CVD method is used as the second interlayer insulating film 5037 and acrylic is used for the third interlayer insulating film 5046.

An opening portion is formed at a position corresponding to the pixel electrode 5047 in the third interlayer insulating film 5046. The third interlayer insulating film serves as a bank. When a wet etching method is used at the formation of the opening portion, it can be easily formed as a side wall having a taper shape. If the side wall of the opening portion is not sufficiently gentle, the deterioration of an EL layer by a step becomes a marked problem. Thus, attention is required.

A carbon particle or a metallic particle may be added into the third interlayer insulating film 5046 to reduce resistivity, thereby suppressing the generation of static electricity. At this time, the amount of carbon particle or metallic particle to be added is preferably adjusted such that the resistivity becomes $1 \times 10^6$ Ωm to $1 \times 10^{12}$ Ωm (preferably, $1 \times 10^8$ Ωm to $1 \times 10^{10}$ Ωm).

Next, an EL layer 5047 is formed on the pixel electrode 5038 exposed in the opening portion of the third interlayer insulating film 5046.

An organic light emitting material or an inorganic light emitting material which are known can be used as the EL layer 5047.

A low molecular weight based organic light emitting material, a high molecular weight based organic light emitting material, or a medium molecular weight based organic light emitting material can be freely used as the organic light emitting material. Note that in this specification, a medium molecular weight based organic light emitting material indicates an organic light emitting material which has no sublimation property and in which the number of molecules is 20 or less or a length of chained molecules is 10 μm or less.

The EL layer 5047 has generally a laminate structure. Typically, there is a laminate structure of "a hole transporting layer, a light emitting layer, and an electron transporting layer", which has been proposed by Tang et al. in Eastman Kodak Company. In addition to this, a structure in which "a hole injection layer, a hole transporting layer, a light emitting layer, and an electron transporting layer" or "a hole injection layer, a hole transporting layer, a light emitting layer, an electron transporting layer, and an electron injection layer" are laminated on an anode in this order may be used. A light emitting layer may be doped with fluorescent pigment or the like.

In this embodiment, the EL layer 5047 is formed by an evaporation method using a low molecular weight based organic light emitting material. Specifically, a laminate structure in which a copper phthalocyanine (CuPc) film having a thickness of 20 nm is provided as the hole injection layer and a tris-8-quinolinolato aluminum complex ($Alq_3$) film having a thickness of 70 nm is provided thereon as the light emitting layer is used. A light emission color can be controlled by adding fluorescent pigment such as quinacridon, perylene, or DCM1 to $Alq_3$.

Note that only one pixel is shown in FIG. 14D. However, a structure in which the EL layers 5047 corresponding to respective colors of, plural colors, for example, R (red), G (green), and B (blue) are separately formed can be used.

Also, as an example using the high molecular weight based organic light emitting material, the EL layer 5047 may be constructed by a laminate structure in which a polythiophene (PEDOT) film having a thickness of 20 nm is provided as the hole injection layer by a spin coating method and a paraphenylenevinylene (PPV) film having a thickness of about 100 nm is provided thereon as the light emitting layer. When π conjugated system polymer of PPV is used, a light emission wavelength from red to blue can be selected. In addition, an inorganic material such as silicon carbide can be used as the electron transporting layer and the electron injection layer.

Note that the EL layer 5047 is not limited to a layer having a laminate structure in which the hole injection layer, the hole transporting layer, the light emitting layer, the electron transporting layer, the electron injection layer, and the like are distinct. In other words, the EL layer 5047 may have a laminate structure with a layer in which materials composing the hole injection layer, the hole transporting layer, the light emitting layer, the electron transporting layer, the electron injection layer, and the like are mixed.

For example, the EL layer 5047 may have a structure in which a mixed layer composed of a material composing the electron transporting layer (hereinafter referred to as an electron transporting material) and a material composing the light emitting layer (hereinafter referred to as a light emitting material) is located between the electron transporting layer and the light emitting layer.

Next, a pixel electrode 5048 made from a conductive film is provided on the EL layer 5047. In the case of this embodiment, an alloy film of aluminum and lithium is used as the conductive film. Of course, a known MgAg film (alloy film of magnesium and silver) may be used. The pixel electrode 5048 corresponds to the cathode of the EL element. A conductive film made of an element which belongs to Group 1 or Group 2 of the periodic table or a conductive film to which those elements are added can be freely used as a cathode material.

When the pixel electrode 5048 is formed, the EL element is completed. Note that the EL element indicates an element composed of the pixel electrode (anode) 5038, the EL layer 5047, and the pixel electrode (cathode) 5048.

It is effective that a passivation film 5049 is provided to completely cover the EL element. A single layer of an insulating film such as a carbon film, a silicon nitride film, or a silicon oxynitride film, or a laminate layer of a combination thereof can be used as the passivation film 5049.

It is preferable that a film having good coverage is used as the passivation film 5049, and it is effective to use a carbon film, particularly, a DLC (diamond like carbon) film. The DLC film can be formed at a temperature range of from a room temperature to 100° C. Thus, a film can be easily formed over the EL layer 5047 having a low heat-resistance. In addition, the DLC film has a high blocking effect to oxygen so that the oxidization of the EL layer 5047 can be suppressed. Therefore, a problem in that the EL layer 5047 is oxidized can be prevented.

Note that, it is effective that steps up to the formation of the passivation film 5049 after the formation of the third interlayer insulating film 5046 are conducted in succession using a multi-chamber type (or in-line type) film formation apparatus without being exposed to air.

Note that, actually, when it is completed up to the state shown in FIG. 14D, in order not to be exposed to air, it is preferable that packaging (sealing) is conducted using a protective film (laminate film, ultraviolet curable resin film, or the like) or a transparent sealing member which has a high airtight property and low degassing. At this time, when an inner portion surrounded by the sealing member is made to an inert atmosphere or a hygroscopic material (for example, barium oxide) is located in the inner portion, the reliability of the EL element is improved.

Also, after an airtightness level is increased by processing such as packaging, a connector (flexible printed circuit: FPC) for connecting terminals led from elements or circuits which are formed on the substrate 5000 with external signal terminals is attached so that it is completed as a product.

Also, according to the steps described in this embodiment, the number of photo masks required for manufacturing a semiconductor device can be reduced. As a result, the process is shortened and it can contribute to the reduction in manufacturing cost and the improvement of a yield.

Embodiment 12

In this embodiment, a process of manufacturing the active matrix substrate having a structure different from that described in Embodiment 11 will be described using FIGS. 15A to 15D.

Figure 15A:
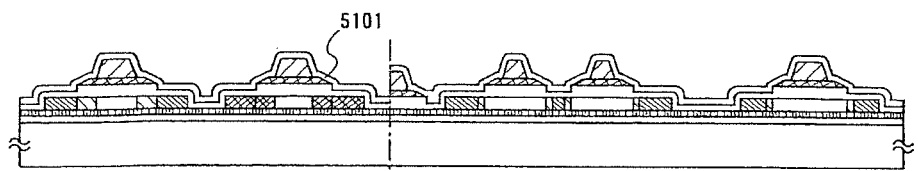
FIGS. 15A to 15D show step examples of manufacturing the semiconductor device.

Note that, the steps up to the step shown in FIG. 15A are similar to those shown in FIGS. 13A to 13D and 14A in Embodiment 11. Note that it is different from Embodiment 11 at a point that a driving TFT composing a pixel portion is an N-channel TFT having low concentration impurity regions (Loff regions) formed outside the gate electrode. With respect to the driving TFT, as described in Embodiment 9, the low concentration impurity regions (Loff regions) may be formed outside the gate electrode using a mask made of a resist.

Portions similar to FIGS. 13A to 13D and 14A to 14D are indicated using the same symbols and the description is omitted here.

As shown in FIG. 15A, a first interlayer insulating film 5101 is formed. An insulating film containing silicon is formed as the first interlayer insulating film 5101 at a thickness of 100 nm to 200 nm by a plasma CVD method or a sputtering method. In this embodiment, a silicon oxynitride film having a film thickness of 100 nm is formed by a plasma CVD method. Of course, the first interlayer insulating film 5101 is not limited to the silicon oxynitride film, and therefore another insulating film containing silicon may be used as a single layer or a laminate structure.

Figure 15B:
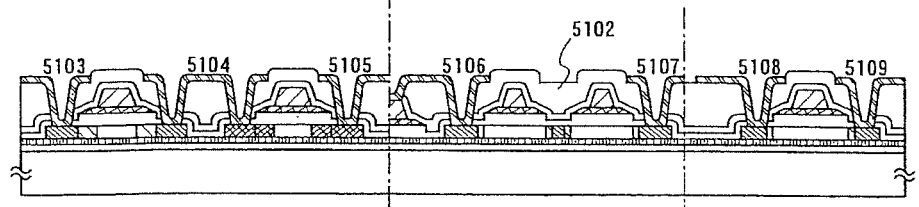

Next, as shown in FIG. 15B, heat treatment (thermal processing) is performed for the recovery of crystallinity of the semiconductor layers and the activation of the impurity element added to the semiconductor layers. This heat treatment is performed by a thermal anneal method using a furnace anneal furnace. The thermal anneal method is preferably conducted in a nitrogen atmosphere in which an oxygen concentration is 1 ppm or less, preferably, 0.1 ppm or less at 400° C. to 700° C. In this embodiment, the heat treatment at 410° C. for 1 hour is performed for the activation processing. However, if a laser anneal method or a rapid thermal anneal method (RTA method) can be applied in addition to the thermal anneal method.

Also, the heat treatment may be performed before the formation of the first interlayer insulating film 5101. Note that, the first conductive layers 5015a to 5019a and the second conductive layers 5015b to 5019b are sensitive to heat, it is preferable that heat treatment is performed after the first interlayer insulating film 5101 (insulating film containing mainly silicon, for example, silicon nitride film) for protecting a wiring and the like is formed as in this embodiment.

As described above, when the heat treatment is performed after the formation of the first interlayer insulating film 5101 (insulating film containing mainly silicon, for example, silicon nitride film), the hydrogenation of the semiconductor layer can be also conducted simultaneous with the activation processing. In the hydrogenation step, a dangling bond of the semiconductor layer is terminated by hydrogen contained in the first interlayer insulating film 5101.

Note that heat treatment for hydrogenation other than the heat treatment for activation processing may be performed.

Here, the semiconductor layer can be hydrogenated regardless of the presence or absence of the first interlayer insulating film 5101. As another means for hydrogenation, means for using hydrogen excited by plasma (plasma hydrogenation) or means for performing heat treatment in an atmosphere containing hydrogen of 3% to 100% at 300° C. to 450° C. for 1 hour to 12 hours may be used.

By the above steps, the driver circuit portion including the CMOS circuit composed of the N-channel TFT and the P-channel TFT and the pixel portion including the switching TFT and the driving TFT can be formed on the same substrate.

Next, a second interlayer insulating film 5102 is formed on the first interlayer insulating film 5101. An inorganic insulating film can be used as the second interlayer insulating film 5102. For example, a silicon oxide film formed by a CVD method, a silicon oxide film applied by an SOG (spin on glass) method, or the like can be used. In addition, an organic insulating film can be used as the second interlayer insulating film 5102. For example, a film made of polyimide, polyamide, BCB (benzocyclobutene), acrylic, or the like can be used. Further, a laminate structure of an acrylic film and a silicon oxide film may be used.

Next, using dry etching or wet etching, the first interlayer insulating film 5101, the second interlayer insulating film 5102, and the gate insulating film 5006 are etched to form contact holes which reach impurity regions (third impurity regions (N+ regions) and fourth impurity regions (P+ regions)) of respective TFTs which compose the driver circuit portion and the pixel portion.

Next, wirings 5103 to 5109 electrically connected with the respective impurity regions are formed (FIG. 15B). Note that, in this embodiment, a Ti film having a film thickness of 100 nm, an Al film having a film thickness of 350 nm, and a Ti film having a film thickness of 100 nm are formed in succession by a sputtering method and a resultant laminate film is patterned in a predetermined shape so that the wirings 5103 to 5109 are formed.

Of course, they are not limited to a three-layer structure. A single layer structure, a two-layer structure, or a laminate structure composed of four layers or more may be used. Materials of the wirings are not limited to Al and Ti, and therefore other conductive films may be used. For example, it is preferable that an Al film or a Cu film is formed on a TaN film, a Ti film is formed thereon, and then a resultant laminate film is patterned to form the wirings.

One of the source region and the drain region of a switching TFT in a pixel portion is electrically connected with a source signal line (laminate of 5019a and 5019b) through the wiring 5106 and the other is electrically connected with the gate electrode of a driving TFT in the pixel portion through the wiring 5107.

Figure 15C:
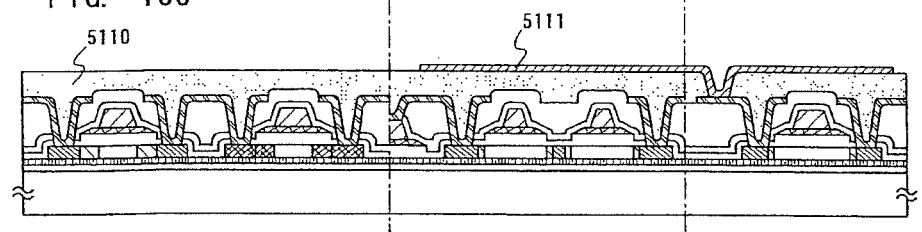

Next, as shown in FIG. 15C, a third interlayer insulating film 5110 is formed. An inorganic insulating film or an organic insulating film can be used as the third interlayer insulating film 5110. A silicon oxide film formed by a CVD method, a silicon oxide film applied by an SOG (spin on glass) method, or the like can be used as the inorganic insulating film. In addition, an acrylic resin film or the like can be used as the organic insulating film.

When the third interlayer insulating film 5110 is formed, unevenness caused by TFTs formed on the substrate 5000 is reduced and the surface can be leveled. In particular, the third interlayer insulating film 5110 is for leveling. Thus, a film having superior evenness is preferable.

Next, using dry etching or wet etching, the third interlayer insulating film 5110 is etched to form contact holes which reach the wiring 5108.

Next, a conductive film is patterned to form a pixel electrode 5111. In the case of this embodiment, an alloy film of aluminum and lithium is used as the conductive film. Of course, a known MgAg film (alloy film of magnesium and silver) may be used. The pixel electrode 5111 corresponds to the cathode of the EL element. A conductive film made of an element which belongs to Group 1 or Group 2 of the periodic table or a conductive film to which those elements are added can be freely used as a cathode material.

The pixel electrode 5111 is electrically connected with the wiring 5108 through a contact hole formed in the third interlayer insulating film 5110. Thus, the pixel electrode 5111 is electrically connected with one of the source region and the drain region of the driving TFT.

Figure 15D:
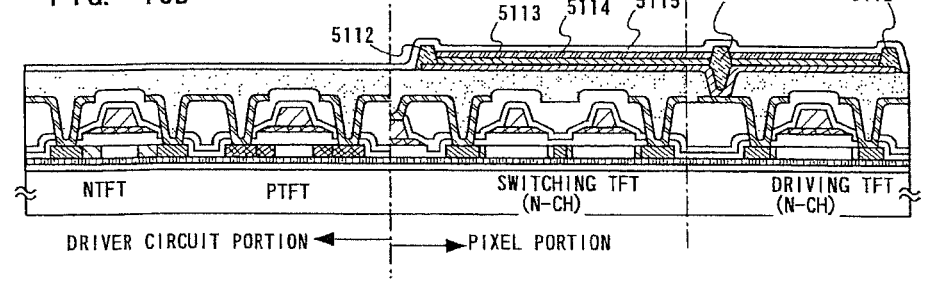

Next, as shown in FIG. 15D, banks 5112 are formed such that EL layers of respective pixels are separated from each other. The banks 5112 are formed from an inorganic insulating film or an organic insulating film. A silicon oxide film formed by a CVD method, a silicon oxide film applied by an SOG method, or the like can be used as the inorganic insulating film. In addition, an acrylic resin film or the like can be used as the organic insulating film.

Here, when a wet etching method is used at the formation of the banks 5112, they can be easily formed as side walls having taper shapes. If the side walls of the banks 5112 are not sufficiently gentle, the deterioration of an EL layer caused by a step becomes a marked problem. Thus, attention is required.

Note that, when the pixel electrode 5111 and the wiring 5108 are electrically connected with each other, the banks 5112 are formed in portions of the contact holes formed in the third interlayer insulating film 5110. Thus, unevenness of the pixel electrode caused by unevenness of the contact hole portions is leveled by the banks 5112 so that the deterioration of the EL layer caused by the step is prevented.

Examples of a combination of the third interlayer insulating film 5110 and the banks 5112 will be described below.

There is a combination in which a silicon oxide film formed by a plasma CVD method is used as the third interlayer insulating film 5110 and a silicon oxide film formed by a plasma CVD method is used as the banks 5112. In addition, there is a combination in which a silicon oxide film formed by an SOG method is used as the third interlayer insulating film 5110 and a silicon oxide film formed by an SOG method is used as the banks 5112. In addition, there is a combination in which a laminate film of a silicon oxide film formed by an SOG method and a silicon oxide film formed by a plasma CVD method is used as the third interlayer insulating film 5110 and a silicon oxide film formed by a plasma CVD method is used as the banks 5112. In addition, there is a combination in which acrylic, is used for the third interlayer insulating film 5110 and acrylic is used for the banks 5112. In addition, there is a combination in which a laminate film of an acrylic film and a silicon oxide film formed by a plasma CVD method is used as the third interlayer insulating film 5110 and a silicon oxide film formed by a plasma CVD method is used as the banks 5112. In addition, there is a combination in which a silicon oxide film formed by a plasma CVD method is used as the third interlayer insulating film 5110 and acrylic is used for the banks 5112.

A carbon particle or a metallic particle may be added into the banks 5112 to reduce resistivity, thereby suppressing the generation of static electricity. At this time, the amount of carbon particle or metallic particle to be added is preferably adjusted such that the resistivity becomes $1\times10^6$ $\Omega$m to $1\times10^{12}$ $\Omega$m (preferably, $1\times10^8$ $\Omega$m to $1\times10^{10}$ $\Omega$m).

Next, an EL layer 5113 is formed on the pixel electrode 5038 which is surrounded by the banks 5112 and exposed.

An organic light emitting material or an inorganic light emitting material which are known can be used as the EL layer 5113.

A low molecular weight based organic light emitting material, a high molecular weight based organic light emitting material, or a medium molecular weight based organic light emitting material can be freely used as the organic light emitting material. Note that in this specification, a medium molecular weight based organic light emitting material indicates an organic light emitting material which has no sublimation property and in which the number of molecules is 20 or less or a length of chained molecules is 10 µm or less.

The EL layer 5113 has generally a laminate structure. Typically, there is a laminate structure of "a hole transporting layer, a light emitting layer, and an electron transporting layer", which has been proposed by Tang et al. in Eastman Kodak Company. In addition to this, a structure in which "an electron transporting layer, a light emitting layer, a hole transporting layer, and an hole injection layer" or "an electron injection layer, a light emitting layer, an hole transporting layer, and a hole injection layer" are laminated on an cathode in this order may be used. A light emitting layer may be doped with fluorescent pigment or the like.

In this embodiment, the EL layer 5113 is formed by an evaporation method using a low molecular weight based organic light emitting material. Specifically, a laminate structure in which a tris-8-quinolinolato aluminum complex ($Alq_3$) film having a thickness of 70 nm is provided as the light emitting layer and a copper phthalocyanine (CuPc) film having a thickness of 20 nm is provided thereon as the light emitting layer is used. A light emission color can be controlled by adding fluorescent pigment such as quinacridon, perylene, or DCM1 to $Alq_3$.

Note that only one pixel is shown in FIG. 15D. However, a structure in which the EL layers 5113 corresponding to respective colors of, plural colors, for example, R (red), G (green), and B (blue) are separately formed can be used.

Also, as an example using the high molecular weight based organic light emitting material, the EL layer 5113 may be constructed by a laminate structure in which a polythiophene (PEDOT) film having a thickness of 20 nm is provided as the hole injection layer by a spin coating method and a paraphenylenevinylene (PPV) film having a thickness of about 100 nm is provided thereon as the light emitting layer. When a conjugated system polymer of PPV is used, a light emission wavelength from red to blue can be selected. In addition, an inorganic material such as silicon carbide can be used for the electron transporting layer and the electron injection layer.

Note that the EL layer 5113 is not limited to a layer having a laminate structure in which the hole injection layer, the hole transporting layer, the light emitting layer, the electron transporting layer, the electron injection layer, and the like are distinct. In other words, the EL layer 5113 may have a laminate structure with a layer in which materials composing the hole injection layer, the hole transporting layer, the light emitting layer, the electron transporting layer, the electron injection layer, and the like are mixed.

For example, the EL layer 5113 may have a structure in which a mixed layer composed of a material composing the electron transporting layer (hereinafter referred to as an electron transporting material) and a material composing the light emitting layer (hereinafter referred to as a light emitting material) is located between the electron transporting layer and the light emitting layer.

Next, a pixel electrode 5114 made from a transparent conductive film is formed on the EL layer 5113. A compound of indium oxide and tin oxide (ITO), a compound of indium oxide and zinc oxide, zinc oxide, tin oxide, indium oxide, or the like can be used for the transparent conductive film. In addition, the transparent conductive film to which gallium is added may be used. The pixel electrode 5114 corresponds to the anode of the EL element.

When the pixel electrode 5114 is formed, the EL element is completed. Note that the EL element indicates a diode composed of the pixel electrode (cathode) 5111, the EL layer 5113, and the pixel electrode (anode) 5114.

In this embodiment, the pixel electrode 5114 is made from the transparent conductive film. Thus, light emitted from the EL element is radiated to an opposite side to the substrate 5000. In addition, through the third interlayer insulating film 5110, the pixel electrode 5111 is formed in the layer different from the layer in which the wirings 5106 and 5109 are formed. Thus, an aperture ratio can be increased as compared with the structure described in Embodiment 9.

It is effective that a protective film (passivation film) 5115 is provided to completely cover the EL element. A single layer of an insulating film such as a carbon film, a silicon nitride film, or a silicon oxynitride film, or a laminate layer of a combination thereof can be used as the protective film 5115.

Note that, when light emitted from the EL element is radiated from the pixel electrode 5114 side as in this embodiment, it is necessary to use a film which transmits light as a protective film 5115.

Note that it is effective that steps up to the formation of the protective film 5115 after the formation of the banks 5112 are conducted in succession using a multi-chamber type (or in-line type) film formation apparatus without being exposed to air.

Note that, actually, when it is completed up to the state shown in FIG. 15D, in order not to be exposed to air, it is preferable that packaging (sealing) is conducted using a protective film (laminate film, ultraviolet curable resin film, or the like) or a sealing member which has a high airtight property and low degassing. At the same time, when an inner portion surrounded by the sealing member is made to an inert atmosphere or a hygroscopic material (for example, barium oxide) is located in the inner portion, the reliability of the EL element is improved.

Also, after an airtightness level is improved by processing such as packaging, a connector (flexible printed circuit: FPC) for connecting terminals led from elements or circuits which are formed on the substrate 5000 with external signal terminals is attached so that it is completed as a product.

Embodiment 13

In this embodiment, an example in which a semiconductor device is manufactured according to the present invention will be described using FIGS. 16A to 16C.

Figure 16A:
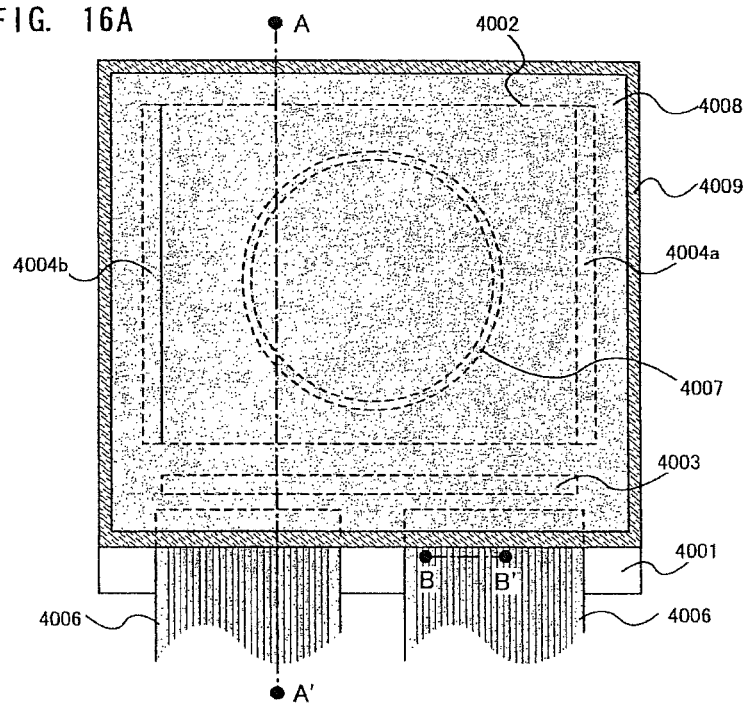
FIGS. 16A to 16C are an outer appearance view and cross sectional views of a semiconductor device.
Figure 16B:
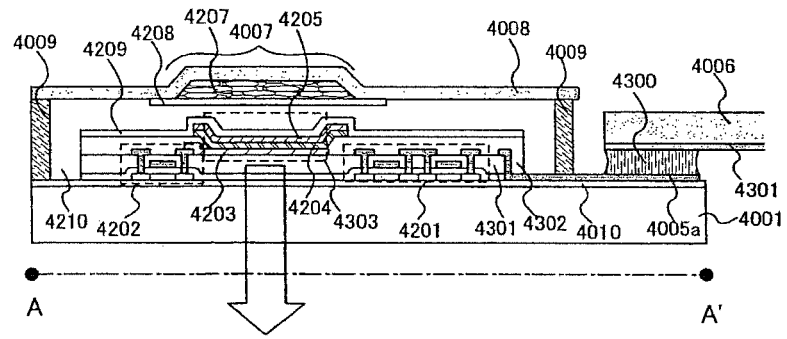

FIG. 16A is a top view of a semiconductor device produced by sealing an element substrate in which TFTs are formed with a sealing member. FIG. 16B is a cross sectional view along a line A-A' in FIG. 16A. FIG. 16C is a cross sectional view along a line B-B' in FIG. 16A.

A seal member 4009 is provided to surround a pixel portion 4002, a source signal line driver circuit 4003, and first and second gate signal line driver circuits 4004a and 4004b which are provided on a substrate 4001. In addition, a sealing member 4008 is provided over the pixel portion 4002, the source signal line driver circuit 4003, and the first and second gate signal line driver circuits 4004a and 4004b. Thus, the pixel portion 4002, the source signal line driver circuit 4003, and the first and second gate signal line driver circuits 4004a and 4004b are sealed with the substrate 4001, the seal member 4009 and the sealing member 4008 and filled with a filling agent 4210.

Also, the pixel portion 4002, the source signal line driver circuit 4003, and the first and second gate signal line driver circuits 4004a and 4004b which are provided on the substrate 4001 each have a plurality of TFTs. In FIG. 16B, TFTs (note that an N-channel TFT and a P-channel TFT are shown here) 4201 included in the source signal line driver circuit 4003 and a TFT 4202 included in the pixel portion 4002, which are formed on a base film 4010 are typically shown.

An interlayer insulating film (planarization film) 4301 is formed on the TFTs 4201 and 4202, and a pixel electrode (anode) 4203 electrically connected with the drain of the TFT 4202 is formed thereon. A transparent conductive film having a large work function is used as the pixel electrode 4203. A compound of indium oxide and tin oxide, a compound of indium oxide and zinc oxide, zinc oxide, tin oxide, or indium oxide can be used for the transparent conductive film. In addition, the transparent conductive film to which gallium is added may be used.

An insulating film 4302 is formed on the pixel electrode 4203. An opening portion is formed in the insulating film 4302 on the pixel electrode 4203. In the opening portion, an organic light emitting layer 4204 is formed on the pixel electrode 4203. An organic light emitting material or an inorganic light emitting material which are known can be used as the organic light emitting layer 4204. In addition, the organic light emitting material includes a low molecular weight based (monomer system) material and a high molecular weight based (polymer system) material, and any material may be used.

An evaporation technique or an applying method technique which are known is preferably used as a method of forming the organic light emitting layer 4204. In addition, a laminate structure or a single layer structure which is obtained by freely combining a hole injection layer, a hole transporting layer, a light emitting layer, an electron transporting layer, and an electron injection layer is preferably used as the structure of the organic light emitting layer.

A cathode 4205 made from a conductive film having a light shielding property (typically, a conductive film containing mainly aluminum, copper, or silver, or a laminate film of the conductive film and another conductive film) is formed on the organic light emitting layer 4204. In addition, it is desirable that moisture and oxygen which exist in an interface between the cathode 4205 and the organic light emitting layer 4204 are minimized. Thus, a devise is required in which the organic light emitting layer 4204 is formed in a nitrogen atmosphere or a noble atmosphere and the cathode 4205 without being exposed to oxygen and moisture is formed. In this embodiment, the above film formation is possible by using a multi-chamber type (cluster tool type) film formation apparatus. A predetermined voltage is supplied to the cathode 4205.

By the above steps, a light emitting element 4303 composed of the pixel electrode (anode) 4203, the organic light emitting layer 4204, and the cathode 4205 is formed. A protective film 4209 is formed on the insulating film 4302 so as to cover the light emitting element 4303. The protective film 4209 is effective to prevent oxygen, moisture, and the like from penetrating the light emitting element 4303.

Reference numeral 4005a denotes a lead wiring connected with a power source, which is connected with a first electrode of the TFT 4202. The lead wiring 4005a is passed between the seal member 4009 and the substrate 4001 and electrically connected with an FPC wiring 4301 of an FPC 4006 through an anisotropic conductive film 4300.

A glass material, a metallic member (typically, a stainless member), a ceramic member, a plastic member (including a plastic film) can be used as the sealing member 4008. An FRP (fiberglass reinforced plastic) plate, a PVF (polyvinyl fluoride) film, a Mylar film, a polyester film, or an acrylic resin film can be used as the plastic member. In addition, a sheet having a structure in which aluminum foil is sandwiched by a PVF film and a Mylar film can be used.

Note that, when a radiation direction of light from the light emitting element is toward a cover member side, it is required that the cover member is transparent. In this case, a transparent material such as a glass plate, a plastic plate, a polyester film, or acrylic film is used.

Also, in addition to an inert gas such as nitrogen or argon, ultraviolet curable resin or thermal curable resin can be used for the filling agent 4210. PVC (polyvinyl chloride), acrylic, polyimide, epoxy resin, silicon resin, PVB (polyvinyl butyral), or EVA (ethylene vinyl acetate) can be used. In this embodiment, nitrogen is used for the filling agent.

Also, in order to expose the filling agent 4210 to a hygroscopic material (preferably barium oxide) or a material capable of absorbing oxygen, a concave portion 4007 is provided to the surface of the sealing member 4008 in the substrate 4001 side, and the hygroscopic material or the material capable of absorbing oxygen which is indicated by 4207 is located. In order to prevent the material 4207 having a hygroscopic property or being capable of absorbing oxygen from flying off, the material 4207 having a hygroscopic property or being capable of absorbing oxygen is held in the concave portion 4007 by a concave cover member 4208. Note that concave cover member 4208 is formed in a fine meshed shape and constructed such that it transmits air and moisture but does not transmit the material 4207 having a hygroscopic property or being capable of absorbing oxygen. When the material 4207 having a hygroscopic property or being capable of absorbing oxygen is provided, the deterioration of the light emitting element 4303 can be suppressed.

Figure 16C:
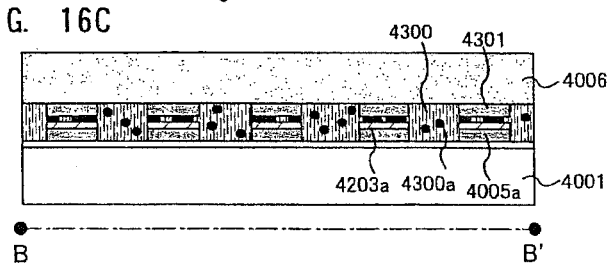

As shown in FIG. 16C, a conductive film 4203a is formed on the lead wiring 4005a such that it is in contact with the lead wiring 4005a simultaneously with the formation of the pixel electrode 4203.

Also, the anisotropic conductive film 4300 has a conductive filler 4300a. When the substrate 4001 and the FPC 4006 are bonded to each other by thermal compression, the conductive film 4203a located over the substrate 4001 and the FPC wiring 4301 located on the FPC 4006 are electrically connected with each other through the conductive filler 5300a.

Embodiment 14

According to the present invention, an organic light emitting material which can utilize phosphorescence from triplet excitation for light emission is used. Thus, external light emission quantum efficiency can be dramatically improved. Therefore, reduction in consumption power, an increase in life, and weight reduction of the light emitting element become possible.

Here, a report in which external light emission quantum efficiency is improved by utilizing triplet excitation is shown. (T. Tsutsui, C. Adachi, S. Saito, Photochemical Processes in Organized Molecular Systems, ed. K. Honda, (Elsevier Sci. Pub., Tokyo, 1991) p. 437)

A molecular formula of an organic light emitting material (coumarin pigment) reported from the above paper is indicated below.

[Chem 1]

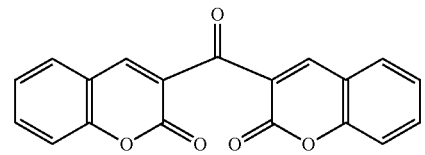

(M. A. Baldo, D. F. O'Brien, Y. You, A. Shoustikov, S. Sibley, M. E. Thompson, S. R. Forrest, Nature 395 (1998) p. 151)

A molecular formula of an organic light emitting material (Pt complex) reported from the above paper is indicated below.

[Chem 2]

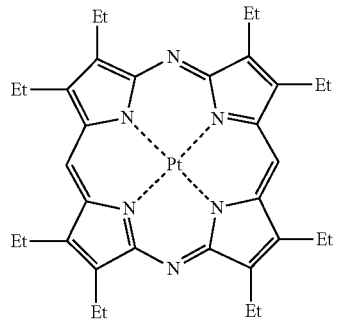

(M. A. Baldo, S. Lamansky, P. E. Burrrows, M. E. Tompson, S. R. Forrest, Appl. Phys. Lett., 75 (1999) p. 4) (T. Tsutsui, M.-J. Yang, M. Yahiro, K. Nakamura, T. Watanabe, T. Tsuji, Y. Fukuda, T. Wakimoto, S. Mayaguchi, Jpn. Appl. Phys., 38 (12B) (1999) L1502.)

A molecular formula of an organic light emitting material (Ir complex) reported from the above paper is indicated below.

[Chem 3]

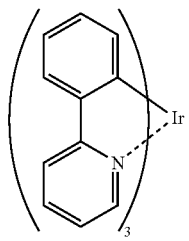

As described above, if phosphorescence light emission from triplet excitation can be utilized, external light emission quantum efficiency which is three to four times larger then that in the case where fluorescence light emission from singlet excitation is used can be realized in theory.

Embodiment 15

A semiconductor device using a light emitting element is a self light emission type. Thus, such a semiconductor device has high visibility in a light place and a wide viewing angle, as compared with a liquid crystal display. Therefore, it can be used for a display portion of various electronic devices.

As electronic devices using the semiconductor device of the present invention, there are a video camera, a digital camera, a goggle type display (head mount display), a navigation system, a sound reproducing device (car audio system, audio component system, or the like), a note type personal computer, a game machine, a portable information terminal (mobile computer, mobile telephone, portable game machine, an electric book, or the like), an image reproducing device including a recording medium (specifically, apparatus for reproducing an image from a recording medium such as a digital versatile disc (DVD), which includes a display capable of displaying the image), and the like. In particular, in the case of the portable information terminal in which a screen is viewed from an oblique direction in many cases, it is important that a view angle is large. Thus, it is desirable that the semiconductor device is used. Concrete examples of those electronic devices are shown in FIGS. 17A to 17H.

Figure 17A:
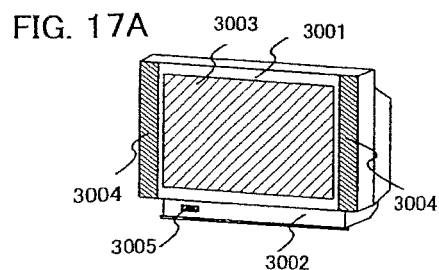
FIGS. 17A to 17H show examples of electronic devices to which the present invention can be applied.

FIG. 17A shows a light emitting element display device which includes a cabinet 3001, a support base 3002, a display portion 3003, a speaker portion 3004, and a video input terminal 3005. The semiconductor device of the present invention can be used for the display portion 3003. The semiconductor device is a self light emission type and thus does not require a back light. Therefore, a thinner display portion than a liquid crystal display can be obtained. Note that the light emitting element display device includes all display devices for information display such as personal computer, TV broadcast receiving, and advertisement display.

Figure 17B:
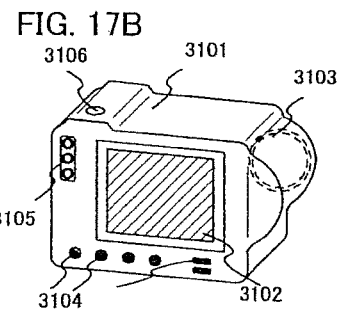

FIG. 17B is a digital still camera, which is composed of a main body 3101, a display portion 3102, an image-receiving portion 3103, operation keys 3104, external connection ports 3105, a shutter 3106, and the like. The semiconductor device of the present invention can be used in the display portion 3102.

Figure 17C:
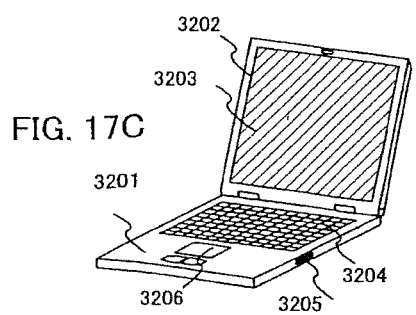

FIG. 17C is a notebook personal computer, which is composed of a main body 3201, a frame 3202, a display portion 3203, a keyboard 3204, external connection ports 3205, a pointing mouse 3206, and the like. The semiconductor device of the present invention can be used in the display portion 3203.

Figure 17D:
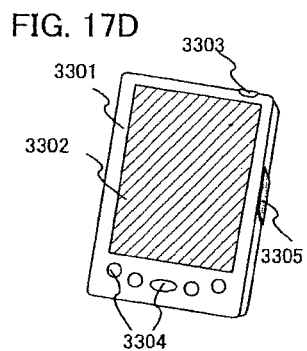

FIG. 17D is a mobile computer, which is composed of a main body 3301, a display portion 3302, a switch 3303, operation keys 3304, an infrared port 3305, and the like. The semiconductor device of the present invention can be used in the display portion 3302.

Figure 17E:
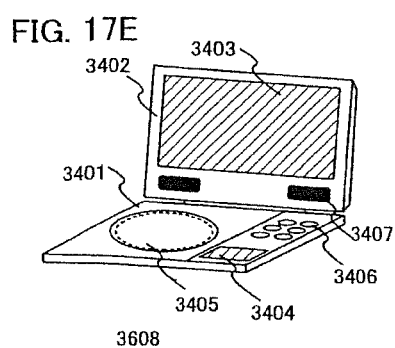

FIG. 17E is a portable image reproducing device equipped with a recording medium (specifically, a DVD player), and is composed of a main body 3401, a frame 3402, a display portion A 3403, a display portion B 3404, a recording medium (such as a DVD) read-in portion 3405, operation keys 3406, a speaker portion 3407, and the like. The display portion A 3403 mainly displays image information, and the display portion B 3404 mainly displays character information, and the semiconductor device of the present invention can be used in the display portion A 3403 and in the display portion B 3404. Note that family game machines and the like are included in the category of image reproducing devices provided with a recording medium.

Figure 17F:
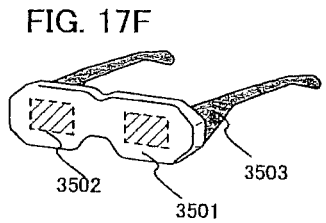

FIG. 17F is a goggle type display device (head mounted display), which is composed of a main body 3501, a display portion 3502, and an arm portion 3503. The semiconductor device of the present invention can be used in the display portion 3502.

Figure 17G:
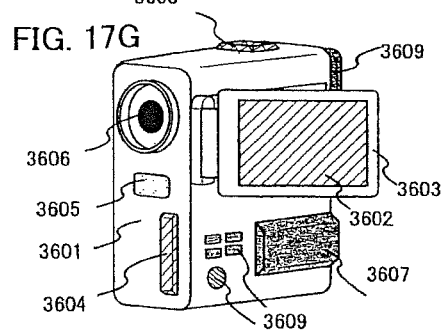

FIG. 17G is a video camera, which is composed of a main body 3601, a display portion 3602, a frame 3603, external connection ports 3604, a remote control receiving portion 3605, an image receiving portion 3606, a battery 3607, an audio input portion 3608, operation keys 3609, and the like. The semiconductor device of the present invention can be used in the display portion 3602.

Figure 17H:
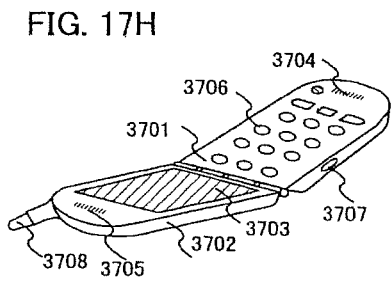

FIG. 17H is a mobile telephone, which is composed of a main body 3701, a frame 3702, a display portion 3703, an audio input portion 3704, an audio output portion 3705, operation keys 3706, external connection ports 3707, an antenna 3708, and the like. The semiconductor device of the present invention can be used in the display portion 3703. Note that white characters are displayed on a black background in the display portion 3703, and thus, the power consumption of the mobile telephone can be suppressed.

Note that, when a light emitting intensity of an organic light emitting material is increased in future, it can be used for a front type or a rear type projector for magnifying and projecting outputted light including image information by a lens or the like.

Also, in the above electronic devices, the number of cases where information distributed through an electronic communication line such as an Internet or a CATV (cable television) is displayed is increased. In particular, a chance in which moving image information is displayed is increased. A response speed of the organic light emitting material is very high. Thus, the semiconductor device is preferable for moving image display.

Also, with respect to the semiconductor device, power is consumed in a portion which emits light. Thus, it is desirable that information is displayed so as to minimize an area of a light emitting portion. Accordingly, when the semiconductor device is used for a display portion of, a portable information terminal, particularly, a mobile telephone or a sound reproducing device in which character information is mainly displayed, it is desirable that the semiconductor device is driven so as to use a non-light emitting portion as a background and produce character information in a light emitting portion.

As described above, an application area of the present invention is extremely wide and the semiconductor device can be used for electronic devices in all fields. In addition, the semiconductor device having any structure described in Embodiments 1 to 14 may be used for the electronic devices of this embodiment.

Embodiment 16

In the method of correcting the threshold value of the transistor according to the present invention, the following phenomenon is utilized. That is, with a diode state produced by a short circuit between the gate and the drain of the transistor used for correction, a current flows between the source and the drain so that a voltage between the source and the drain becomes equal to the threshold value of the transistor. This can be applied to not only the case of the pixel portion described in the present invention but also the case of the driver circuit.

As an example, there is a current source circuit in a driver circuit for outputting a current into a pixel and the like. The current source circuit is a circuit for outputting a predetermined current based on an inputted voltage signal. The voltage signal is inputted to the gate electrode of a current source transistor in the current source circuit, and a current corresponding to the voltage between the gate and the source is outputted through the current source transistor. In other words, the threshold value correcting method of the present invention is used for correcting the threshold value of the current source transistor.

Figure 26A:
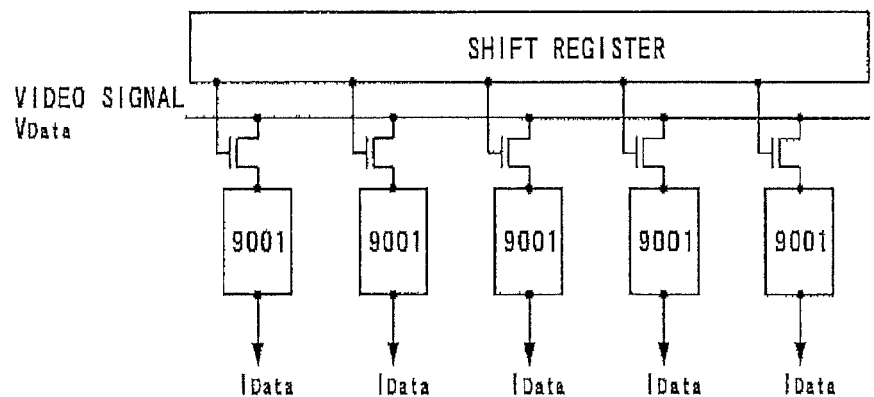
FIGS. 26A and 26B show a configuration example of a current source circuit using threshold value correction principle of the present invention and a timing chart thereof.

FIG. 26A shows a utilization example of the current source circuit. Sampling pulses are outputted in succession from a shift register. The sampling pulses are inputted to respective current source circuits 9001. Sampling of a video signal is conducted in accordance with timing at which the sampling pulses are inputted to the current source circuits 9001. In this case, sampling operation is conducted in dot sequential manner.

Figure 26B:
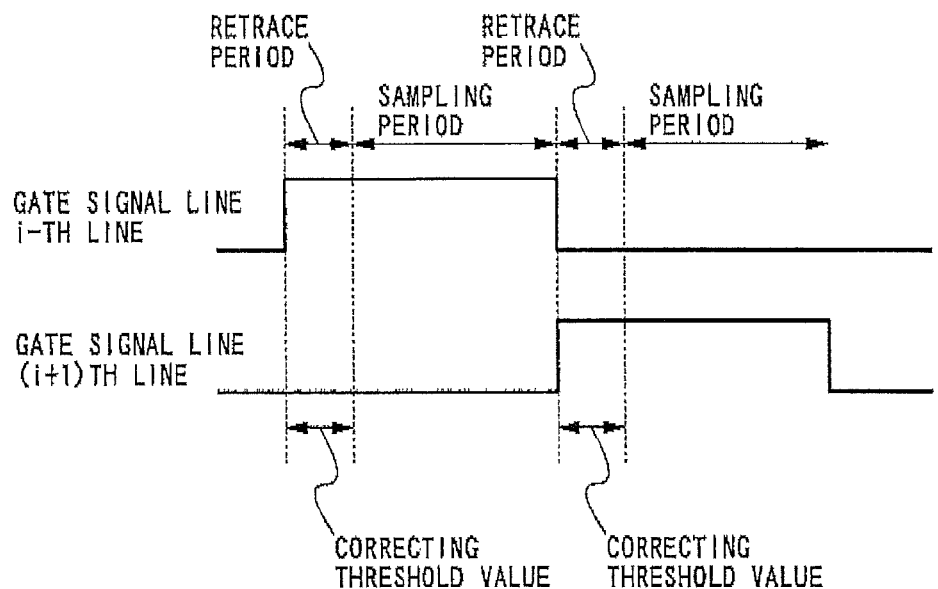

Simple operational timing is shown in FIG. 26B. During a period for which a gate signal line of an i-th line is selected, a sampling pulse is outputted from the shift register and it is divided into a period for sampling of a video signal and a retrace period. During the retrace period, the threshold value correcting operation of the present invention, that is, a series of operations in which potentials of respective portions are initialized and threshold voltages of transistors are obtained are conducted. In other words, the threshold value obtaining operation can be conducted for each horizontal period.

Figure 27A:
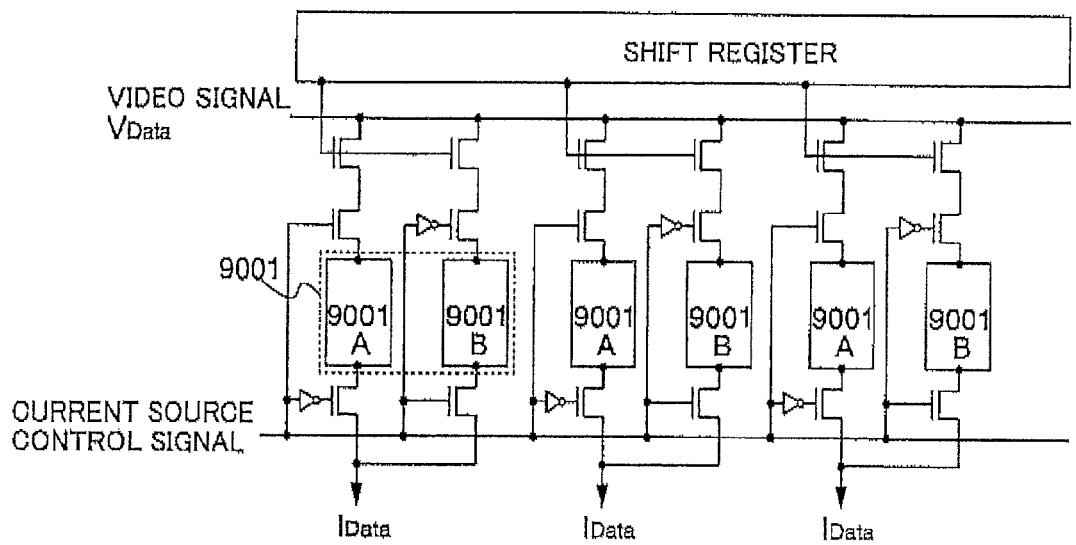
FIGS. 27A and 27B show a configuration example of a current source circuit using the threshold value correction principle of the present invention and a timing chart thereof.

FIG. 27A shows a configuration of a driver circuit for outputting a current to a pixel and the like, which is different from that shown in FIG. 26A. A point different from the case of FIG. 26A is that the current source circuit 9001 controlled according to a first stage sampling pulse becomes two circuits 9001A and 9001B, and both operations are selected according to a current source control signal.

Figure 27B:
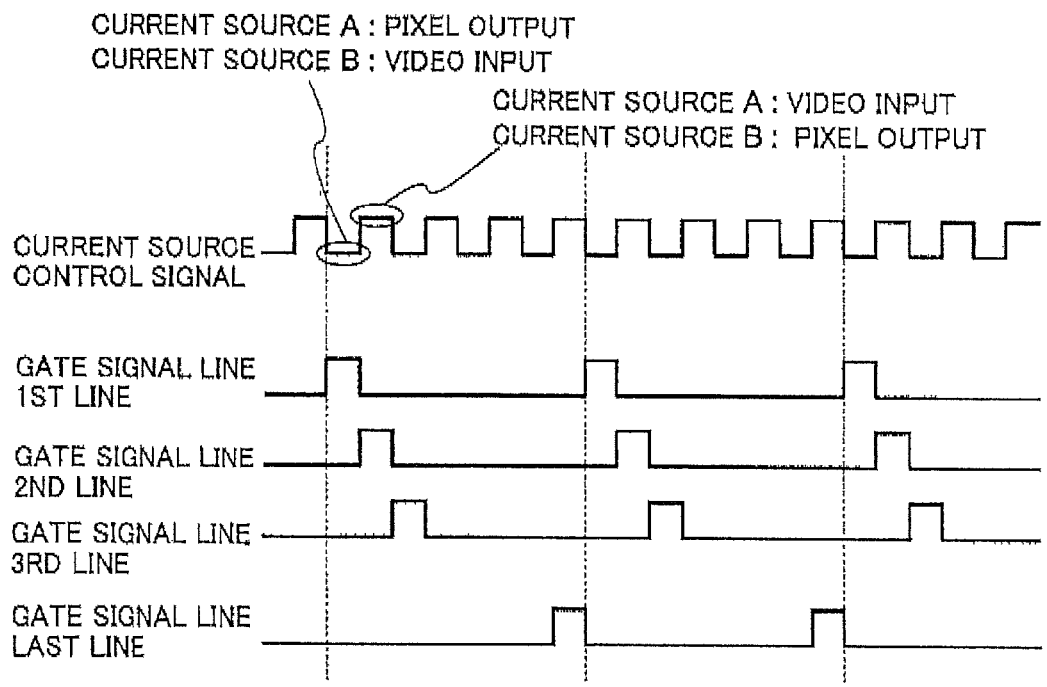

As shown in FIG. 27B, the current source control signal is switched, for example, for each horizontal period. Thus, operations are performed such that one of the current source circuits 9001A and 9001B conducts current output to a pixel and the like and the other conducts input of a video signal, and the like. Such operations are alternatively conducted for each line. In this case, sampling operation is conducted in line sequential manner.

Figure 28A:
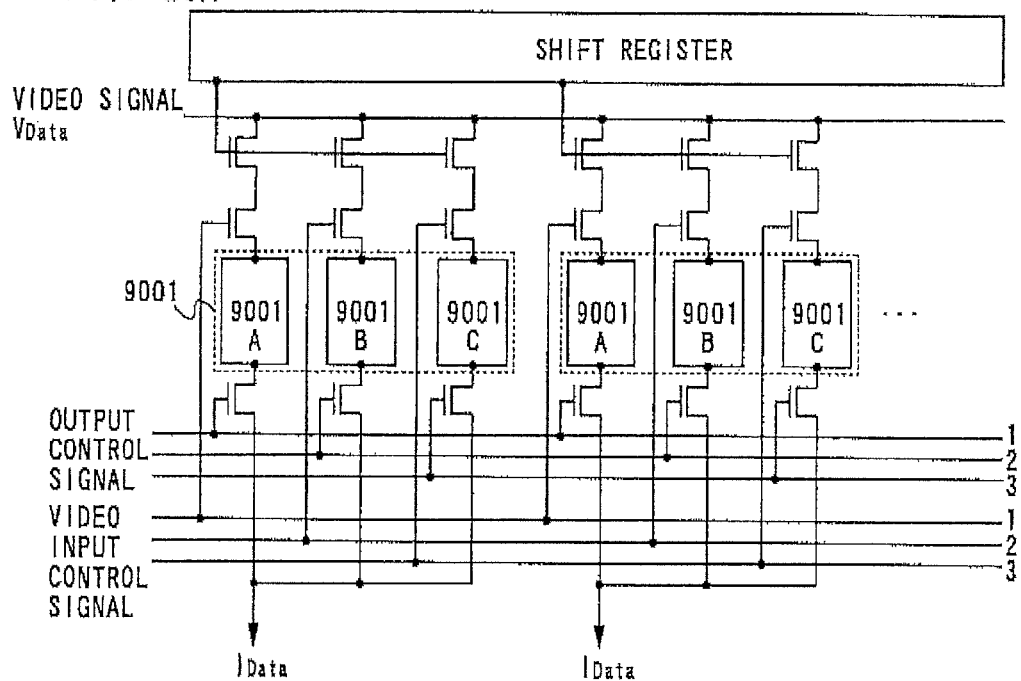
FIGS. 28A and 28B show a configuration example of a current source circuit using the threshold value correction principle of the present invention and a timing chart thereof.

FIG. 28A shows a configuration of a driver circuit which is different from the above configurations. Here, the current source circuit 9001 controlled according to a first stage sampling pulse becomes three circuits 9001A, 9001B, and 9001C and respective operations are selected according to a video input control signal and an output control signal.

Figure 28B:
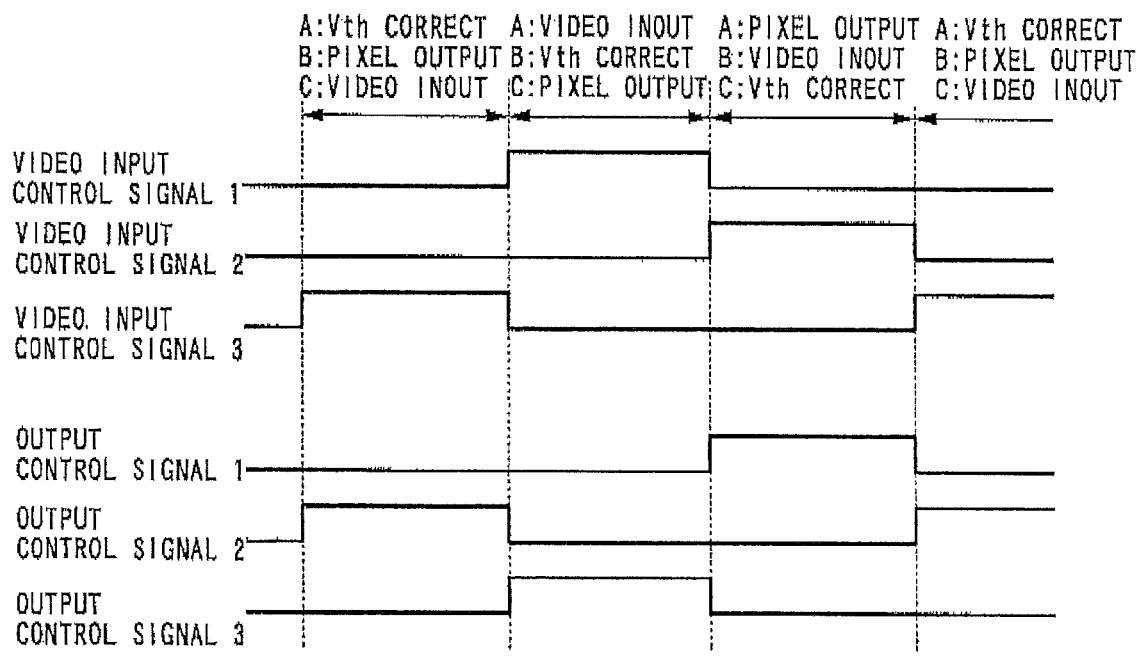

As shown in FIG. 28B, according to the video input control signal and the output control signal, the operations of the current source circuits 9001A, 9001B, and 9001C are switched for each horizontal period in the order of threshold value correction, video signal input, current output to a pixel. Sampling operation is conducted in line sequential manner as in the case of the configuration shown in FIG. 27A.

Figure 29A:
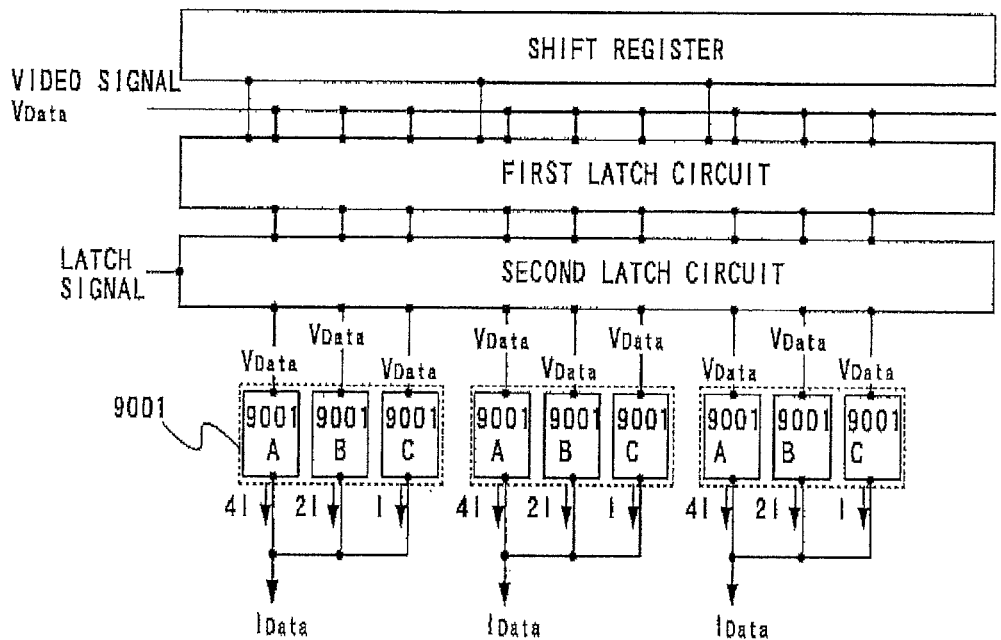
FIGS. 29A and 29B show a configuration example of a current source circuit using the threshold value correction principle of the present invention and a timing chart thereof.
Figure 29B:
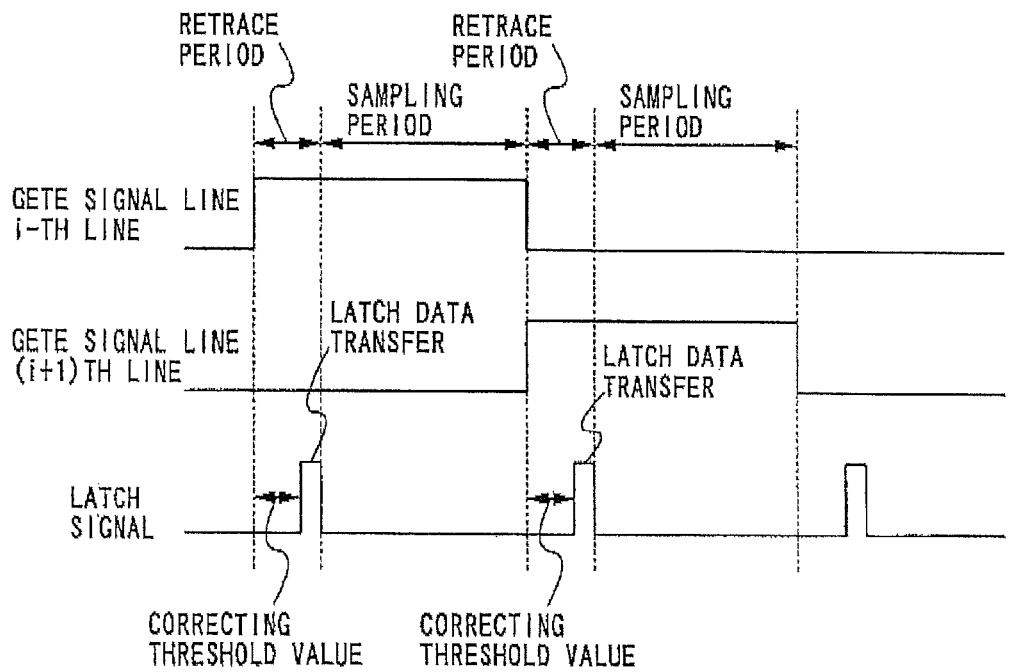

FIG. 29A shows a configuration of a driver circuit which is different from the above configurations. In FIG. 26A to FIG. 28B, a video signal type may be digital or analog. However, in the configuration shown in FIG. 29A, a digital video signal is inputted. The inputted digital video signal is latched into a first latch circuit according to output of a sampling pulse. After the latch of a video signal corresponding to a line is completed, it is transferred to a second latch circuit. After that, it is inputted to respective current source circuits 9001A to 9001C. Here, currents outputted from the respective current source circuits 9001A to 9001C are different from one another. For example, a ratio of current values becomes 1:2:4. In other words, n current source circuits are arranged in parallel, a ratio of the current values is set to $1:2:4, \ldots, 2^{(n-1)}$, the currents outputted from the respective current source circuits are added. Thus, the outputted current values can be linearly changed.

Operational timing is substantially the same as that shown in FIG. 26B. During a retrace period for which sampling operation is not conducted, the threshold value correcting operation is conducted by the current source circuit 9001, subsequently data held in the latch circuit is transferred, V-I conversion is conducted by the current source circuit 9001, and a current is outputted to a pixel. Sampling operation is conducted in line sequential manner as in the case of the configuration shown in FIG. 27A.

Figure 30A:
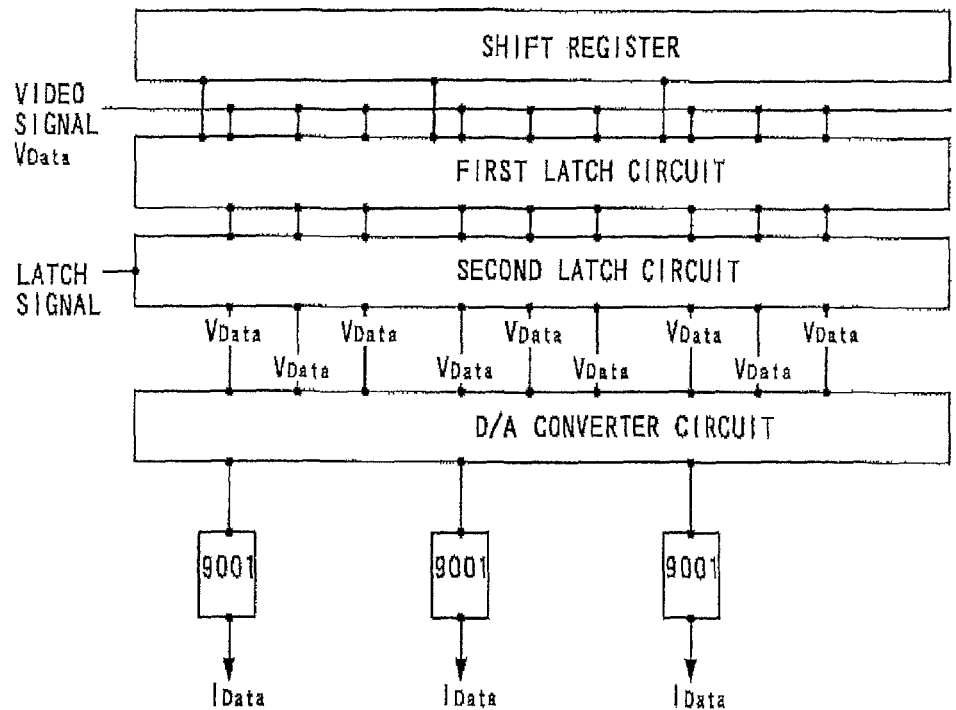
FIGS. 30A and 30B show a configuration example of a current source circuit using the threshold value correction principle of the present invention and a timing chart thereof.

FIG. 30A shows a configuration of a driver circuit for outputting a current to a pixel and the like, which is different from the above configurations. According to the configuration, a digital video signal latched in the latch circuit is transferred to a D/A converting circuit in accordance with input of a latch signal, converted into an analog video signal, and the analog video signal is inputted to the respective current source circuits 9001 so that a current is outputted.

Also, for example, a gamma correction function may be provided for such D/A converter circuit.

Figure 30B:
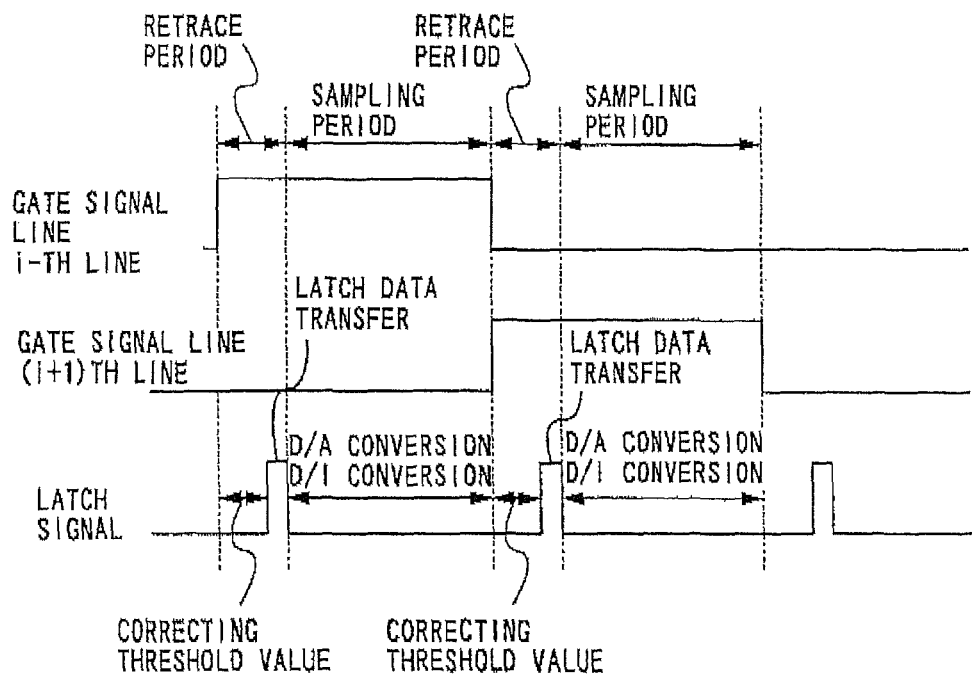

As shown in FIG. 30B, during a retrace period, threshold value correction and latch data transfer are conducted. During a period for which sampling operating is conducted for a line, V-I conversion of a video signal of a preceding line and current output to a pixel and the like are conducted. Sampling operation is conducted in line sequential manner as in the case of the configuration shown in FIG. 27A.

The present invention is not limited to the above described configurations. When the V-I conversion is conducted by the current source circuit, the threshold value correcting means of the present invention can be applied. In addition, the configurations as shown in FIGS. 27A and 28A in which the plurality of current source circuits are arranged in parallel and used by switching may be combined with the configurations as shown in FIGS. 29A and 30A.

According to the present invention, a variation in threshold value of a TFT for each pixel can be normally corrected without being influenced by a variation in capacitance value of capacitor means. Even if the present invention is compared with a conventional example, it is based on more simple operational principle and there is no case where the number of elements is greatly increased. Thus, there is no worry that an aperture ratio and the like are reduced. Accordingly, it can be said to be very effective.

What is claimed is:

1. A semiconductor device comprising:
   a pixel comprising:
   a first transistor;
   a second transistor;
   a third transistor;
   a fourth transistor;
   a fifth transistor; and
   a first capacitor,
   wherein a gate of the first transistor is directly connected to a first electrode of the first capacitor,
   wherein one of a source and a drain of the second transistor is directly connected to the gate of the first transistor,
   wherein the other of the source and the drain of the second transistor is electrically connected to one of a source and a drain of the first transistor,
   wherein one of a source and a drain of the third transistor is directly connected to a second electrode of the first capacitor,
   wherein one of a source and a drain of the fourth transistor is directly connected to a pixel electrode of a light-emitting element,
   wherein the other of the source and the drain of the fourth transistor is directly connected to the one of the source and the drain of the first transistor, and
   wherein one of a source and a drain of the fifth transistor is directly connected to the second electrode of the first capacitor.

2. The semiconductor device according to claim 1, wherein the other of the source and the drain of the fifth transistor is electrically connected to the gate of the first transistor.

3. The semiconductor device according to claim 1,
   wherein a gate of the third transistor is directly connected to a first gate signal line, and
   wherein a gate of the second transistor is directly connected to a second gate signal line.

4. The semiconductor device according to claim 3,
   wherein a gate of the fourth transistor is directly connected to a third gate signal line, and
   wherein a gate of the fifth transistor is directly connected to a fourth gate signal line.

5. The semiconductor device according to claim 1, further comprising a second capacitor directly connected to the second electrode of the first capacitor.

6. The semiconductor device according to claim 1, further comprising:
   a flexible print circuit; and
   a driver circuit,
   wherein the driver circuit is configured to select a gate signal line directly connected to a gate of the third transistor, and
   wherein the flexible print circuit is operatively connected to the driver circuit.

7. A semiconductor device comprising:
   a pixel comprising:
   a first transistor;
   a second transistor;
   a third transistor;
   a fourth transistor;
   a fifth transistor;
   a sixth transistor; and
   a first capacitor,
   wherein a gate of the first transistor is directly connected to a first electrode of the first capacitor,
   wherein one of a source and a drain of the second transistor is directly connected to the gate of the first transistor,
   wherein the other of the source and the drain of the second transistor is electrically connected to one of a source and a drain of the first transistor,
   wherein one of a source and a drain of the third transistor is directly connected to a second electrode of the first capacitor,
   wherein one of a source and a drain of the fourth transistor is directly connected to a pixel electrode of a light-emitting element,
   wherein the other of the source and the drain of the fourth transistor is directly connected to the one of the source and the drain of the first transistor,
   wherein one of a source and a drain of the fifth transistor is directly connected to the second electrode of the first capacitor, and
   wherein one of a source and a drain of the sixth transistor is directly connected to the other of the source and the drain of the fifth transistor.

8. The semiconductor device according to claim 7, wherein the other of the source and the drain of the sixth transistor is directly connected to the gate of the first transistor.

9. The semiconductor device according to claim 7,
   wherein a gate of the third transistor is directly connected to a first gate signal line, and
   wherein a gate of the second transistor is directly connected to a second gate signal line.

10. The semiconductor device according to claim 9,
    wherein a gate of the fourth transistor is directly connected to a third gate signal line, and
    wherein a gate of the fifth transistor is directly connected to a fourth gate signal line.

11. The semiconductor device according to claim 7, wherein a gate of the sixth transistor is directly connected to the gate of the first transistor.

12. The semiconductor device according to claim 7, further comprising a second capacitor directly connected to the second electrode of the first capacitor.

13. The semiconductor device according to claim 7, further comprising:
    a flexible print circuit; and
    a driver circuit,
    wherein the driver circuit is configured to select a gate signal line directly connected to a gate of the third transistor, and
    wherein the flexible print circuit is operatively connected to the driver circuit.

14. A mobile telephone comprising:
    an antenna; and
    a display portion comprising a pixel, the pixel comprising:
    a first transistor;
    a second transistor;
    a third transistor;
    a fourth transistor;
    a fifth transistor; and
    a first capacitor,
    wherein a gate of the first transistor is directly connected to a first electrode of the first capacitor,
    wherein one of a source and a drain of the second transistor is directly connected to the gate of the first transistor,
    wherein the other of the source and the drain of the second transistor is electrically connected to one of a source and a drain of the first transistor, wherein one of a source and a drain of the third transistor is directly connected to a second electrode of the first capacitor, wherein one of a source and a drain of the fourth transistor is directly connected to a pixel electrode of a light-emitting element, wherein the other of the source and the drain of the fourth transistor is directly connected to the one of the source and the drain of the first transistor, and wherein one of a source and a drain of the fifth transistor is directly connected to the second electrode of the first capacitor.

15. The mobile telephone according to claim 14, wherein the other of the source and the drain of the fifth transistor is electrically connected to the gate of the first transistor.

16. The mobile telephone according to claim 14, wherein a gate of the third transistor is directly connected to a first gate signal line, and wherein a gate of the second transistor is directly connected to a second gate signal line.

17. The mobile telephone according to claim 16, wherein a gate of the fourth transistor is directly connected to a third gate signal line, and wherein a gate of the fifth transistor is directly connected to a fourth gate signal line.

18. The mobile telephone according to claim 14, further comprising a second capacitor directly connected to the second electrode of the first capacitor.

19. The mobile telephone according to claim 14, further comprising:

a flexible print circuit; and a driver circuit, wherein the driver circuit is configured to select a gate signal line directly connected to a gate of the third transistor, and wherein the flexible print circuit is operatively connected to the driver circuit.

20. The semiconductor device according to claim 1, wherein the other of the source and the drain of the second transistor is directly connected to the one of a source and a drain of the first transistor.

21. The semiconductor device according to claim 7, wherein the other of the source and the drain of the second transistor is directly connected to the one of a source and a drain of the first transistor.

22. The mobile telephone according to claim 14, wherein the other of the source and the drain of the second transistor is directly connected to the one of a source and a drain of the first transistor.

* * * * *